United States Patent
Swager et al.

(10) Patent No.: US 7,494,698 B2
(45) Date of Patent: *Feb. 24, 2009

(54) POLYMERS WITH HIGH INTERNAL FREE VOLUME

(75) Inventors: Timothy M. Swager, Newton, MA (US); Timothy M. Long, Cambridge, MA (US); Zhengguo Zhu, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/764,768

(22) Filed: Jan. 26, 2004

(65) Prior Publication Data

US 2004/0170775 A1    Sep. 2, 2004

Related U.S. Application Data

(63) Continuation of application No. 09/935,060, filed on Aug. 21, 2001, now Pat. No. 6,783,814.

(60) Provisional application No. 60/226,506, filed on Aug. 21, 2000.

(51) Int. Cl.
- A47G 33/04 (2006.01)
- C09K 19/38 (2006.01)
- C09K 19/32 (2006.01)
- C09K 19/52 (2006.01)

(52) U.S. Cl. .............. 428/11; 428/1; 525/63; 252/299.4; 349/1

(58) Field of Classification Search .............. 428/11, 428/1; 525/63; 252/299.4; 349/1
See application file for complete search history.

(56) References Cited

U.S. PATENT DOCUMENTS

3,242,186 A    3/1966    Dershowitz (Continued)

FOREIGN PATENT DOCUMENTS

DE    4121138    1/1993

(Continued)

OTHER PUBLICATIONS

Akutsu, et al., Preparation and Properties of Soluble Aromatic Polyamides Derived From 2,7-Triptycenedicarbonyl Dichloride, Polymer Journal, 1998, vol. 30, No. 3, pp. 265-268.

(Continued)

*Primary Examiner*—Duc Truong
(74) *Attorney, Agent, or Firm*—Wolf, Greenfield & Sacks, P.C.

(57) ABSTRACT

Shape-persistent organic materials, including polymers, with large degrees of interior free volume are described, along with behaviors and phenomena enabled by their unique properties. One class of such a material is built up from triptycene base moieties wherein three benzene rings are bridged together about a [2.2.2] tricyclic ring system. These units can be assembled into discreet molecules and polymers. These materials and/or formulations thereof with liquid crystals or polymers are useful for the complexation of chemicals and/or polymers; they have very low dielectric constants for use as coatings in dielectric circuits, they provide additional ordering mechanisms in liquid crystals, and they display unusual mechanical responses when subjected to electrochemical, chemical, or mechanical stimuli.

46 Claims, 38 Drawing Sheets

U.S. PATENT DOCUMENTS

| | | | |
|---|---|---|---|
| 4,356,429 A | 10/1982 | Tang | |
| 4,687,732 A | 8/1987 | Ward et al. | |
| 4,927,768 A | 5/1990 | Coughlin et al. | |
| 4,946,890 A | 8/1990 | Meador | |
| 4,992,302 A | 2/1991 | Lindmayer | |
| 5,155,149 A | 10/1992 | Atwater et al. | |
| 5,194,393 A | 3/1993 | Hugl et al. | |
| 5,236,808 A | 8/1993 | Smothers | |
| 5,244,813 A | 9/1993 | Walt et al. | |
| 5,254,633 A | 10/1993 | Han et al. | |
| 5,364,797 A | 11/1994 | Olson et al. | |
| 5,414,069 A | 5/1995 | Cumming et al. | |
| 5,451,683 A | 9/1995 | Barrett et al. | |
| 5,511,547 A | 4/1996 | Markle et al. | |
| 5,512,490 A | 4/1996 | Walt et al. | |
| 5,532,129 A | 7/1996 | Heller | |
| 5,540,999 A | 7/1996 | Yamamoto et al. | |
| 5,546,889 A | 8/1996 | Wakita et al. | |
| 5,554,747 A | 9/1996 | Sharma et al. | |
| 5,556,524 A | 9/1996 | Albers | |
| 5,563,056 A | 10/1996 | Swan et al. | |
| 5,565,322 A | 10/1996 | Heller | |
| 5,580,527 A | 12/1996 | Bell et al. | |
| 5,585,646 A | 12/1996 | Kossovsky et al. | |
| 5,591,787 A | 1/1997 | Schlennert et al. | |
| 5,597,890 A | 1/1997 | Jenekhe | |
| 5,607,864 A | 3/1997 | Ricchiero et al. | |
| 5,629,353 A | 5/1997 | Steckle, Jr. et al. | |
| 5,679,773 A | 10/1997 | Holmes | |
| 5,700,696 A | 12/1997 | Chandross et al. | |
| 5,705,348 A | 1/1998 | Meade et al. | |
| 5,709,994 A | 1/1998 | Pease et al. | |
| 5,710,187 A | 1/1998 | Steckle, Jr. et al. | |
| 5,710,197 A | 1/1998 | Fischer et al. | |
| 5,723,218 A | 3/1998 | Haugland et al. | |
| 5,869,592 A | 2/1999 | Gagné et al. | |
| 6,160,597 A | 12/2000 | Schadt et al. | |
| 6,259,277 B1 | 7/2001 | Tour et al. | |
| 6,509,110 B1 | 1/2003 | Salbeck et al. | |
| 6,605,693 B1 | 8/2003 | Becker et al. | |
| 6,783,814 B2 | 8/2004 | Swager et al. | |

FOREIGN PATENT DOCUMENTS

| | | |
|---|---|---|
| DE | 4121139 | 1/1993 |
| DE | 197 44 792 A1 | 4/1999 |
| DE | 198 06 037 A1 | 8/1999 |
| EP | 0 442 123 A1 | 8/1991 |
| EP | 581058 | 7/1993 |
| EP | 0581058 A1 | 2/1994 |
| EP | 1 011 154 A1 | 6/2000 |
| JP | 05-113286 | 11/1994 |
| WO | WO89/00593 A1 | 1/1989 |
| WO | WO95/16681 A1 | 6/1995 |
| WO | 99/19419 A1 | 4/1999 |
| WO | WO99/57222 A1 | 11/1999 |
| WO | 00/53655 A1 | 9/2000 |
| WO | WO 02/16463 A2 | 2/2002 |

OTHER PUBLICATIONS

Akutsu, et al., Synthesis and Properties of Novel Polyarylates and Poly(Ether Ether Ketone)s Derived From 2,-7Triptycenediol, Polymer Journal, 1997, vol. 29, No. 12, pp. 1023-1028.

Chen L. et al., "Tuning the properties of conjugated polyelectrolytes through surfactant complexation," *J. Am. Chem. Soc.*, vol. 122, No. 38, 9302-9303, 2000.

Chen L. et al., "Highly sensitive biological and chemical sensors based on reversible fluorescence quenching in a conjugated polymer," *PNAS*, vol. 96, No. 22, pp. 12287-12292, 1999.

Fu D.-K.et al., "Alternating poly(pyridvinylenephenylenevinylene)s: Synthesis and solid state organizations," *Tetrahedron*, vol. 53, No. 45, pp. 15487-15494, 1997.

Gaylord B.S. et al., "Water-soluble conjugated oligomers: Effect of chain length and aggregation on photoluminescence-quenching efficiencies," *J. Am. Chem. Soc.*, vol. 123, No. 26, pp. 6417-6418, 2001.

Gaylord et al., "DNA detection using water-soluble conjugated polymers and peptide nucleic acid probes,"*Proc Natl Acad Sci USA*, Aug. 20, 2002, vol. 99, No. 17, pp. 10954-10957.

Halkyard C.E. et al., "Evidence of aggregate formation for 2,5-dialkylpoly(*p*-phenyleneethynylenes) in solution and thin films," *Macromolecules*, vol. 31, No. 25, pp. 8655-8659, 1998.

Harrison B.S. et al., "Amplified fluorescence quenching in a poly(*p*-phenylene)-based cationic polyelectrolyte," *J. Am. Chem. Soc.*, vol. 122, No. 35, pp. 8561-8562, 2000.

Heeger P.S. & Heeger, A.J. "Making sense of polymer-based biosensors," *Proc. Natl Acad Sci USA*, vol. 96, No. 22, pp. 12219-12221, 1999.

Höger S. et al., "Synthesis, aggregation, and adsorption phenomena of shape-persistent macrocycles with extraannular polyalkyl substituents," *J. Am. Chem. Soc.*, vol. 23, No. 24, pp. 5651-5659, 2001.

Jones R.M. et al., "Superquenching and its applications in j-aggregated cyanine polymers," *Langmuir*, vol. 17, No. 9, pp. 2568-2571, 2001.

Kim J. et al., "Nanoscale fibrils and grids: Aggregated structures from rigid-rod conjugated polymers," *Macromolecules*, vol. 32, No. 5, pp. 1500-1507, 1999.

Kim et al., "Ultrafast Energy-Transfer Dynamics between Block Copolymer and π-Conjugated Polymer Chains in Blended Polymeric Systems," *Chemistry of Materials*, vol. 13(8), pp. 266-2674 , 1997.

Kraft et al., "Electroluminescent Conjugated Polymers—Seeing Polymers in a New Light," *Angew. Chem. Int. Ed.* 1998, 37, 402-428.

Kushon et al., "Detection of DNA hybridization via Fluorescent Polymer Superquenching," *Langmuir—The ACS Journal of Surfaces and Colloids*, Oct. 1, 2002, vol. 18, No. 20.

Levitsky I.A. et al., "Energy migration in a poly(phenylene ethynylene): Determination of interpolymer transport in anisotropic langmuir-blodgett films," *J. Am. Chem. Soc.*, vol. 121, No. 7, pp. 1466-1472, 1999.

Li M. et al., "Novel surfactant-free stable colloidal nanoparticles made of randomly carboxylated polystyrene ionomers," *Macromolecules*, vol. 30, No. 7, pp. 2201-2203, 1997.

Luo L. & Eisenberg, A. "Thermodynamic stabilization mechanism of block copolymer vesicles," *J. Am. Chem. Soc.*, vol. 123, No. 5, pp. 1012-1013, 2001.

Miao et al., "Fluorescence sensory polymers containing rigid nonplanar aromatic scaffolds", Papers presented at the Meeting-American Chemical Society, Division of Polymer Chemistry, *J. Am. Chem. Soc.*, vol. 39, No. 2, pp. 1081-1082, Aug. 1998.

Moia, F. et al., "Optical LLP/LCP Devices: A New Generation of Optical Security Elements," *Optical Security and Counterfeit Deterrence Techniques III*, SPIE vol. 3973 (2000), pp. 196-203.

Norvez, S. et al., "Epitaxygens: Mesophases Based on the Triptycene Molecular Subunit,"*J. Chem. Soc., Chem. Commun.*, 1990, pp. 1398-1399.

Norvez, S. et al., "Epitaxygens: mesomorphic properties of triptycene derivatives", *Liquid Crystals*, vol. 14, No. 5, 1993, pp. 1389-1395.

Norvez, S. et al., "Liquid Crystalline Triptycene Derivatives," *J. Org. Chem.*, 1993, vol. 58, No. 9, pp. 2414-2418.

Peng et al., "Efficient Light Harvesting by Sequential Energy Transfer across Aggregates in Polymers of Finite Conjugational Segments with Short Aliphatic Linkages," *J. Am. Chem. Soc.*, 2001, vol. 123, pp. 11388-11397.

Place I. et al., "Stabilization of the aggregation of cyanine dyes at the molecular and nanoscopic level," *Langmuir*, vol. 16, No. 23, pp. 9042-9048, 2000.

Pschirer N.G. & Bunz, U.H.F. "Poly(fluorenyleneethynylene)s by alkyne metathesis: Optical properties and aggregation behavior," *Macromolecules*, vol. 33, No. 11, pp. 3961-3963, 2000.

Snow A.W. et al., "Synthesis and evaluation of hexafluorodimethylcarbinol functionalized polymers as microsensor coatings," *J. App. Poly. Sci.*, vol. 43, pp. 1659-1671, 1991.

Swager T.M. et al., "Fluorescence studies of poly(*p*-phynylenethynylene)s: The effect of anthracene substitution," *J. Phys. Chem.*, vol. 99, No. 14, pp. 4886-4893, 1995.

Swager, T.M. "The molecular wire approach to sensory signal amplification," *Acc. Chem. Res.*, vol. 31, No. 5, pp. 201-207, 1998.

Tan et al., "Photophysics, aggregation and amplified quenching of a wter-soluble poly(phenylene ethynylene)," *Chem. Commun.*, 2002, pp. 446-447.

Van Houten K.A. et al., "Rapid luminescent detection of phosphate esters in solution and the gas phase using (dppe)Pt{$S_2C_2$(2-pyridyl)($CH_2CH_2OH$)}," *J. Am. Chem. Soc.*, vol. 120, No. 47, pp. 12359-12360, 1998.

Walters et al., "Photophysical Consequences of Conformation and Aggregation in Dilute Solutions of $\pi$-Conjugated Oligomers," *Langmuir*, 1999, vol. 15, pp. 5676-5680.

Weder C. & M. S. Wrighton, "Efficient solid-state photoluminescence in new poly(2,5-dialkoxy-*p*-phenyleneethynylene)s," *Macromolecules*, vol. 29, No. 15, pp. 5157-5165, 1996.

Wu C. et al., "Novel nanoparticles formed via self-assembly of poly-(ethylene glycol-*b*-sebacic anhydride) and their degradation in water," *Macromolecules*, vol. 33, No. 24, pp. 9040-9043, 2000.

Yang, Jye-Shane et al., "Fluorescent porous polymer films as TNT chemosensors: electronic and structural effects", *J. Am. Chem. Soc.*, vol. 120, No. 46, 1998, pp. 11864-11873.

Yang, Jye-Shane et al., "Anomalous crystal packing of iptycene secondary diamides leading to novel chain and channel networks", *Tetrahedron Letters*, vol. 41, No. 41, Oct. 7, 2000, pp. 7911-7915.

Zhang G. et al., "Formation of novel polymeric nanoparticles," *Acc. Chem. Res.*, vol. 34, No. 3, pp. 249-256, 2001.

Zhou Q. & T. M. Swager, "Methodology for enhancing the sensitivity of fluorescent chemosensors: Energy migration in conjugated polymers," *J. Am. Chem. Soc.*, vol. 117, No. 26, pp. 7017-1018, 1995.

Zhou Q.& T.M. Swager, "Fluorescent chemosensors based on energy migration in conjugated polymers: The molecular wire approach to increased sensitivity," *J. Am. Chem. Soc.*, vol. 117, No. 50, pp. 12593-12602, 1995.

Hoffmeister et al., "Triptycene Polymers," *J. Polymer Science* 1969, 7, 55-72.

IF X=Y, THEN POLYMER MAY BE ATACTIC, ISOTACTIC OR SYNDIOTACTIC
IF X≠Y, THEN EACH BLOCK MAY BE ATACTIC, ISOTACTIC OR SYNDIOTACTIC
R = FUNCTIONALIZED IPTYCENE

POLYMERS WITH HIGH INTERNAL FREE VOLUME

RELATED APPLICATIONS

This application is a continuation of U.S. patent application Ser. No. 09/935,060, filed Aug. 21, 2001, now U.S. Pat. No. 6,783,814 which claims benefit under 35 U.S.C. §119(e) of priority to Provisional Application Ser. No. 60/226,506, filed Aug. 21, 2000, both of which are incorporated herein by reference.

GOVERNMENT FUNDING

This invention was made with government support under Contract Number DABT63-97-C-0008, awarded by the Army and Grant Number N00014-97-0174 awarded by the Navy. The government has certain rights in the invention.

BACKGROUND OF THE INVENTION

1. Field of the Invention

The present invention relates generally to organic/polymer chemistry, and more particularly to molecules such as polymers, that can incorporate triptycenes and iptycenes.

2. Description of Related Art

Many materials and molecules have rigid structures that can be said to be shape-persistent. Aromatic, conjugated and polycyclic structures are typically their principle building blocks, and are the base architectures that provide the anisotropic characteristics of liquid crystals and high strength polymers. In general, these materials have flat two-dimensional structures and low degrees of internal free volume.

In contrast, chemical structures that have relatively high internal free volumes include those of the iptycenes. Typical applications of iptycenes and related structures have been as groups to prevent aggregation of polymers, thermally stable elements in structural polymers, and as a rigid scaffolds to define a molecular receptor.

SUMMARY OF THE INVENTION

The invention comprises materials, compositions and methods that have, as one element, a shape-persistent material with a high degree of internal free volume. In another aspect, the invention comprises new materials, or known shape-persistent materials with high degree of internal free volume that are used in new ways.

In one embodiment, the invention provides a composition comprising a ladder polymer or an oligomer that comprises an iptycene.

In another embodiment, the invention provides a composition comprising an iptycene, having a molecular weight in excess of 2,000 daltons. The composition comprises a shape-persistent molecule containing bridgehead atoms, with molecular structures radiating from the bridgehead atoms in three directions and extending outwardly therefrom such that each defines a van der Waals contact of furthest point from the bridgehead atoms of no less than 3.5 Å. The composition can be a linear polymer or a ladder polymer. In one embodiment, the composition is arranged as a dielectric material in an electronic component. When the composition defines a polymer, the polymer can include a backbone having backbone atoms bonded to other backbone atoms, where bonds involving the backbone atoms are not freely rotatable.

The compositions described herein have a high degree of free volume, for example, at least 20%, 30%, 50%, 70% or 90% free volume, as defined below. Shape-persistent molecules with higher free volume can be used to improve alignment or orientation of one molecule to another. A variety of exemplary structures, both of polymeric shape-persistent molecules or monomers that can be used alone or can be polymerized to form polymers are described herein. It is to be understood that all examples of monomers and/or polymers described herein can be used in connection with any aspect or embodiment of the invention in which a shape-persistent molecule or polymer is desirable.

Where polymers of the invention are provided, they can comprise polymer chain units including chemical functionality allowing the formation of grafts. One polymer includes a grafted polymer including iptycene or non-iptycene units grafted onto polymer chains. Or, iptycene and non-iptycene units can be used in combination in such a graft polymer. Polymers can be formed of monomer units, each including two reactive sites, one of which has reacted with another monomer unit to form the polymer backbone, and another of which is available for grafting after formation of the polymer.

As noted, high free-volume, shape-persistent structures can be used as dielectrics. Dielectric structures having a dielectric constant of about 1.9 or less, preferably 1.7, 1.5 or 1.2 or less are provided in accordance with the invention.

The invention provides negative Poisson ratio (NPR) materials. One set of materials includes polymeric shape-persistent structures having small pores, on the order of 3-6 Å in size, through which a second polymeric material can be threaded to form an interpenetrating network. For example, polyiptycenes will form porous materials, as described below, and a generally planar structure perpendicular to the pores. Where a flexible polymer interpenetrates pores of such structures, applying tension to the interpenetrating polymer can cause the polyiptycenes to align in a generally planar/planar fashion, causing a greater degree of order between generally planar polyiptycene structures, thereby increasing the free volume of the overall structure. This can define a NPR material. That is, when tension is not applied to the interpenetrating polymer, the generally planar polyiptycene structures are allowed to rotate or otherwise orient themselves in a low-energy, random configuration. This will tend to minimize free volume. When tension is applied to the interpenetrating polymer, the generally planar polyiptycene structures will be moved into alignment generally parallel to each other, forming a higher-energy, higher free-volume structure. The interpenetrating polymer can be, for example, a conjugated polymer, an elastomer, or the like.

In another aspect, the invention comprises a first component comprising a first, porous shape-persistent polymeric component, and a second polymeric component forming an interpenetrating network. The network permeates the pores of the first polymeric component.

As mentioned above, shape-persistent molecules of the invention can assist in alignment or orientation of one molecule to another. This can be important in optical technology, such as liquid crystal display (LCD) technology. Liquid crystals are molecules which, when non-aligned with each other, are generally transparent. When an electric field is applied, they can be made to orient in alignment with each other, becoming opaque. Color LCD displays include liquid crystal molecules in conjunction with chromophores, including dyes. Contrast in color LCD displays is maximized (a significant advantage) when chromophores can be made to align with LCD molecules. The present invention involves including a shape-persistent molecule in conjunction with a chromophore in a LCD matrix. The shape-persistent molecule can assist the alignment of the chromophore with LCD molecules. For example, a shape-persistent molecule with a high degree of free volume can be covalently attached to a dye and combined with LCD molecules. When energy is applied to the system which generally causes LCD molecules to align with each other, the shape-persistent molecule can interact with the LCD molecules to maximize alignment of the dye with the LCD molecules. This is described in greater detail below and demonstrated in the examples section. This increase in alignment between two molecules with the assistance of a shape-persistent molecule can be used in essentially any arrangement in which improved alignment is desired, not limited to LCD systems.

Accordingly, in one embodiment the invention provides a composition including a chromophore, a shape-persistent molecule having at least 20% free volume, and a host material within which the shape-persistent molecule self-orients. The host material can be, for example, LCD molecules.

In another embodiment, the invention involves a method comprising providing a first molecular species in association with a shape-persistent molecule having a high degree of internal free volume, and a second molecular species. The method involves causing a change in orientation of the second molecular species and allowing the shape-persistent molecule to thereby alter the orientation of the first molecule in response to the change in orientation of the second molecule. An example of this involves a second molecular species comprising LCD host material and a first molecular species comprising a dye covalently bonded to an iptycene. A change in orientation of the LCD host material (e.g., alignment) causes a change in orientation of the dye as directed by the iptycene, namely, the dye can orient in alignment with the LCD host material. Translation, as well as or instead of orientation, can be affected in this manner as well.

Shape-persistent molecules of the invention typically include at least two aromatic rings, each parallel to a common axis in a lowest energy state of the composition.

In another embodiment, the invention comprises a composition including a plurality of liquid crystalline species. Each has a primary axis aligned so as to together define an average axis of the liquid crystalline species primary axes. A plurality of chromophores are provided, each having a primary axis aligned so as to together define an average axis of the chromophore primary axes. The alignment of the individual chromophores relative to the average axis of the chromophore primary axes includes less variation than the alignment of the individual liquid crystalline species relative to the average axis of the liquid crystalline species primary axes.

In another embodiment, the invention provides a size-exclusion article. As used herein, "size-exclusion article" defines a material that will allow the passage of species of a particular size, but not allow passage of species larger than that size. Examples include filters, such as zeolite structures, etc. Size-exclusion articles of the invention can be defined by any species described herein that will form pores, such as a ladder polymer or oligomer comprising an iptycene, having pore sizes noted herein.

Compositions of the invention can enhance the modulus of polymeric compositions. This can be effected by blending compositions of the invention into existing polymer blends, forming copolymers, including compositions of the invention, or grafting compositions of the invention onto existing polymers. Accordingly, one composition of the invention includes a first component that is a polymer including an iptycene, and a second component. The second component typically is a high molecular weight linear polymer, such as one having a molecular weight greater than 5,000, 10,000 or 20,000 daltons. The composition has a greater strength compared to a composition that is identical, with the exception that it does not include the iptycene-containing polymer.

In another aspect, the invention comprises a chromophore and a shape-persistent molecule including at least two aromatic rings, each parallel to a common axis in a lowest energy state of the composition.

In another aspect, the invention comprises a composition comprising a shape persistent moiety with a high degree of internal free volume and a chromophore.

Other advantages, novel features, and objects of the invention will become apparent from the following detailed description of the invention when considered in conjunction with the accompanying drawings, which are schematic and which are not intended to be drawn to scale. In the figures, each identical, or substantially similar component that is illustrated in various figures is represented by a single numeral or notation. For purposes of clarity, not every component is labeled in every figure, nor is every component of each embodiment of the invention shown where illustration is not necessary to allow those of ordinary skill in the art to understand the invention.

BRIEF DESCRIPTION OF THE DRAWINGS

Preferred, non-limiting embodiments of the present invention will be described by way of example with reference to the accompanying drawings in which.

DETAILED DESCRIPTION

The present invention provides new shape-persistent molecules with high internal free volume, and new uses and compositions based on these and previously known high internal volume shape-persistent molecules.

Figure 1A:
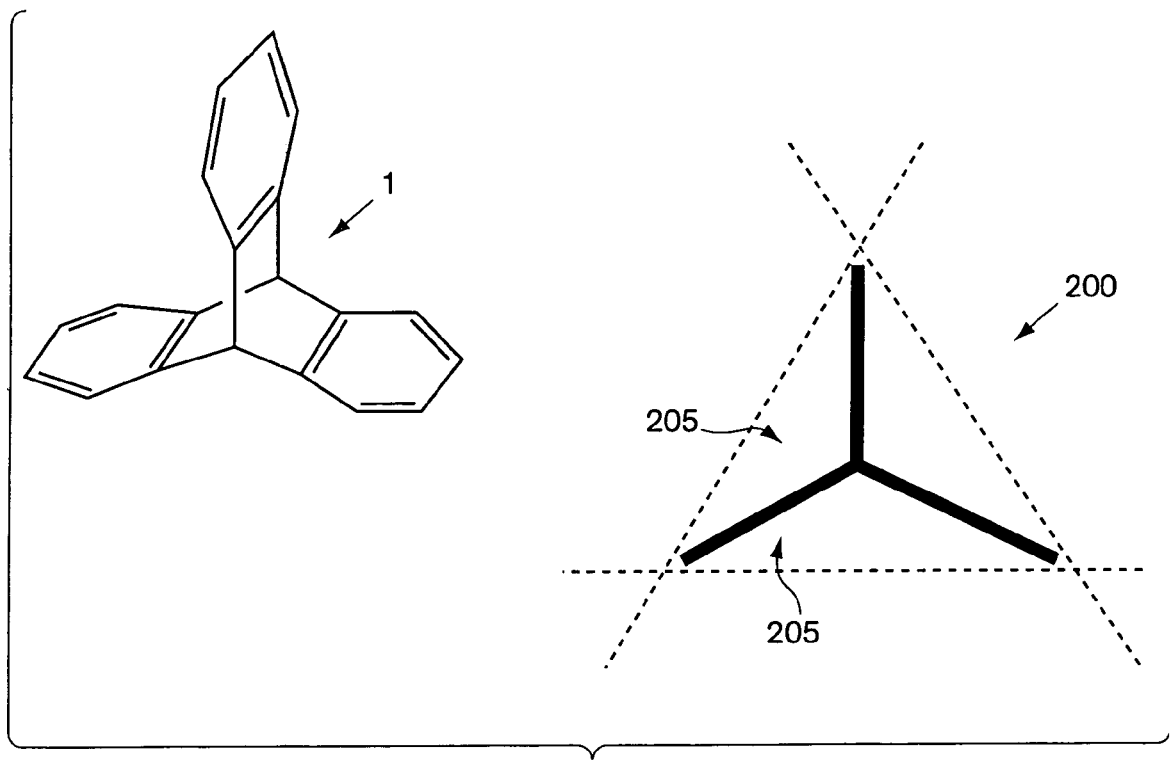
FIG. 1A illustrates structural diagrams of prior art triptycene.

A "shape-persistent molecule," as used herein, is a molecule with a significant amount of rigid structure, as is understood by those of ordinary skill in the art. Preferably, in a shape-persistent molecule, no portion of the molecule having a combined molecular weight of at least 15 g/mol may move relative to other portions of the molecule via rotation about a single bond. In other embodiments of shape-persistent molecules, no portion of the molecule having a molecular weight of greater than 25, 50, or 100 g/mol can move relative to other portions of the molecule via rotation about a single bond. Rigid structures may be provided, for example, by aromatic rings, cyclic structures, cyclic aromatic structures, and the like. For example, molecular structure 1 in FIG. 1A, representing triptycene, is shape-persistent, with a high degree of internal-free volume. As a comparative example, a molecule including a cyclic structure such as a benzene ring connected to another portion of the molecule via only a single bond, has at least a portion of the molecule that is not shape-persistent according to the embodiment in which the shape-persistent molecule includes no portion having a molecular weight of at least that of a benzene ring that can move relative to other portions of the molecule via rotation about a single bond.

Many of the shape-persistent structures of the invention, and used in techniques of the invention, may belong to the class of polymers and molecules built up from structure 1, known as the iptycenes. Iptycenes and like molecules have previously been reported in, for example, Hart, "Iptycenes, Cuppendophanes and Cappedophanes," *Pure and Applied Chemistry*, 65(1):27-34 (1993); or Shahlia et al., "Synthesis of Supertriptycene and Two Related Iptycenes," *Journal of Organic Chemistry*, 56:6905-6912 (1991). Triptycene 1 as shown in FIG. 1A is 9,10-[1',2'-benzeno]-9,10-dihydroanthracene. Iptycenes are a class of compounds based off this base triptycene structure, where the prefix indicates the number of separated arene planes. Examples of iptycenes include triptycenes (3 planes) and pentiptycenes (5 planes). The arene planes are fused together at the [2.2.2]bicyclooctane junctions. The arene planes are not limited to benzene rings; they may be any polycyclic aromatic structure.

Various embodiments of the invention involve use of molecules comprising an iptycene, such as a triptycene. It is to be understood that structures comprising an iptycene include oligomers, polymers, and monomers. Polymers or oligomers comprising an iptycene can include those having a non-iptycene backbone with iptycene pendent groups or those having iptycenes that form part of the backbone. As an example of the latter class, a polymer can be made up of monomer iptycene building blocks that together form a ladder polymer.

The "internal free volume" or "free volume" of a molecule is defined as the volume in space taken up by a molecule, where boundaries defining the internal free volume span all projections or protrusions of the molecule. By way of illustration, a representation 200 in FIG. 1A of the shape-persistent molecule triptycene is shown next to molecular structure 1 of triptycene. The side-view representation 200 shows internal free volume 205 as the space defined within boundaries that span all extended portions of the molecule.

Shape-persistent molecules may be considered to have a length, width, and thickness. These dimensions may be considered to span an imaginary box which the molecule, as defined by its van der Waals volume, may rest. The molecule may be positioned within the box, in relation to a set of x, y, and z axes, such that the shortest axis in the arrangement defines the molecule's thickness. The minimum thickness of a planar shape-persistent molecule may be defined as the distance between the portions of the molecule located above and below a plane within which the molecule can be defined (or which can be contained completely within the molecule), for example a plane defined by the carbon nuclei of benzene ring. For example, in a benzene ring, the van der Waals radii for the carbon atoms is about±1.9 Å. A second example is a molecule such as [2.2.2]bicyclooctane, where the thickness of the molecule would be measured from the van der Waals contacts of the outer hydrogen atoms, or about 5.54 Å.

While these examples may have shape-persistent structures, it should be understood that these structures do not define the internal free volume. Rather, the internal free volume is defined by the volume in space taken up by the molecule, where boundaries defining the internal free volume span all projections or protrusions of the molecule. This can be easily understood with reference to FIG. 1A. It is noted that the internal free volume need not be totally enclosed. For example, internal free volume 205 in FIG. 1A is not totally enclosed. A combination of enclosed and open volumes in structures together can define free volume within the scope of the invention. The interior free volumes of such structures may be defined by objects that have an external plane that may be directed along one axis. Another architecture is one in which the internal space of the object may further be enclosed by additional objects, for example, objects having a concave surface. This may create an even greater delineation between internal and external space.

Figure 1B:
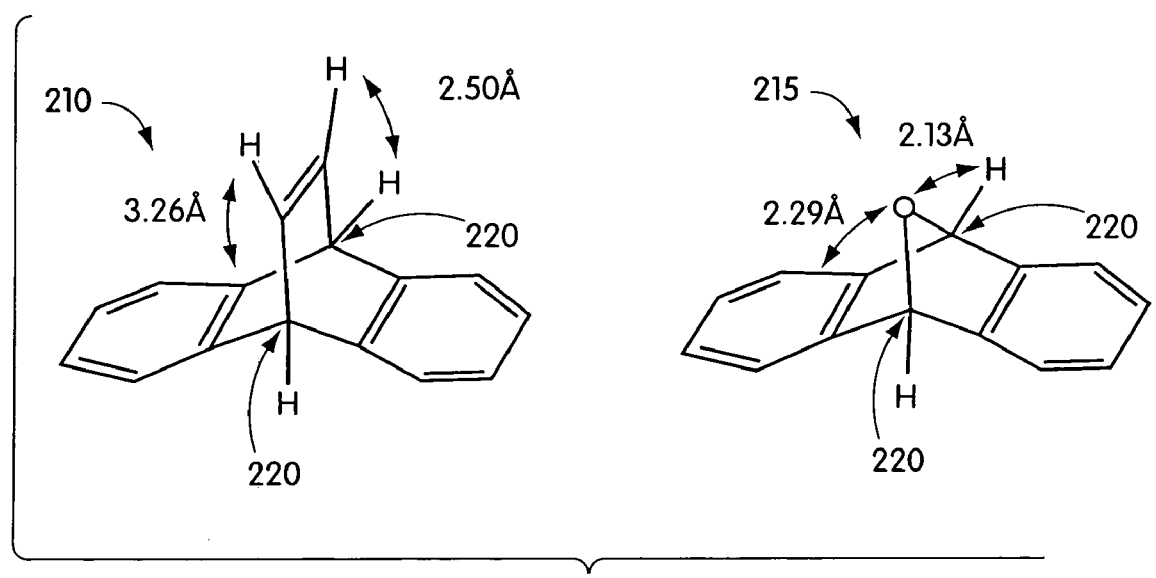
FIG. 1B illustrates structural diagrams of molecules of prior art.

In one set of embodiments of the invention, shape-persistent materials of the invention have a minimum height or length of approximately 6.214 Å, a value based on the distance between the van der Waals contacts of the 1 and 4 hydrogen atoms of a benzene ring. In one set of embodiments, molecules of the invention include bridgehead atoms and the minimum distance that a molecule may extend in height or length from a bridgehead is 3.5 Å. In other embodiments, the minimum distance that a molecule may extend in height or length from a bridgehead is 4.0 Å, 4.5 Å, 5.0 Å, 5.5 Å, 6.0 Å, or 6.2 Å. Each bridgehead may be any suitable atom, for example, a carbon or a nitrogen atom. By way of illustration, molecules 210 and 215 in FIG. 1B do not meet the requirement of a height or length of approximately 6.214 Å. Molecule 210 has a height of about 3.26 Å, as measured from the plane of the benzene ring to the uppermost hydrogen atoms, or a height of about 2.50 Å, as measured from the hydrogen atom attached to bridgehead 220. Molecule 215 has a height of about 2.29 Å, as measured from the plane of the benzene ring to the oxygen atom, or a height of about 2.13 Å, as measured from the hydrogen atom attached to bridgehead 220.

In some embodiments, the length of the molecule may be at least twice the height of the molecule. The longer dimension may lie on a two-dimensional plane normal to that height. Other three-dimensional structures may also be built up from these two-dimensional structures.

Molecules of the invention, in preferred embodiments, have at least 20% free volume; preferably at least 30%, more preferably at least 50% free volume, more preferably greater than 70% free volume, and most preferably greater than 90% free volume.

Techniques for determining free volume may include determining the density of the rigid shape-persistent molecule itself, without solvent, and without other, like molecules or different molecules dispersed within the material to take up some of the free volume. Alternatively, or where this is impossible, free volume may be deduced from density measurements. For density measurements for determination of free volume, the density may be compared with a solvent of similar composition. Determination of free volume from density measurement may be carried out in a straightforward manner by those of ordinary skill in the art. For example, most hydrocarbons have a density between 0.7 g/ml and 0.9 g/ml, and many polymers have densities of about 0.8 g/ml; hence, lower densities may be indicative of free volume. For example, a density of 0.4 g/ml may indicate a free volume of about 50%.

As most flexible materials will adopt a structure that may minimize free volume, to maintain high free volume, the precise nature of the rigid shape-persistent structure may be important. Preferred shape-persistent structures used in the invention may minimize the interpenetration of shape-persistent structures into each other's free volume. Such interpenetration may decrease the net internal free volume.

Figure 1C:
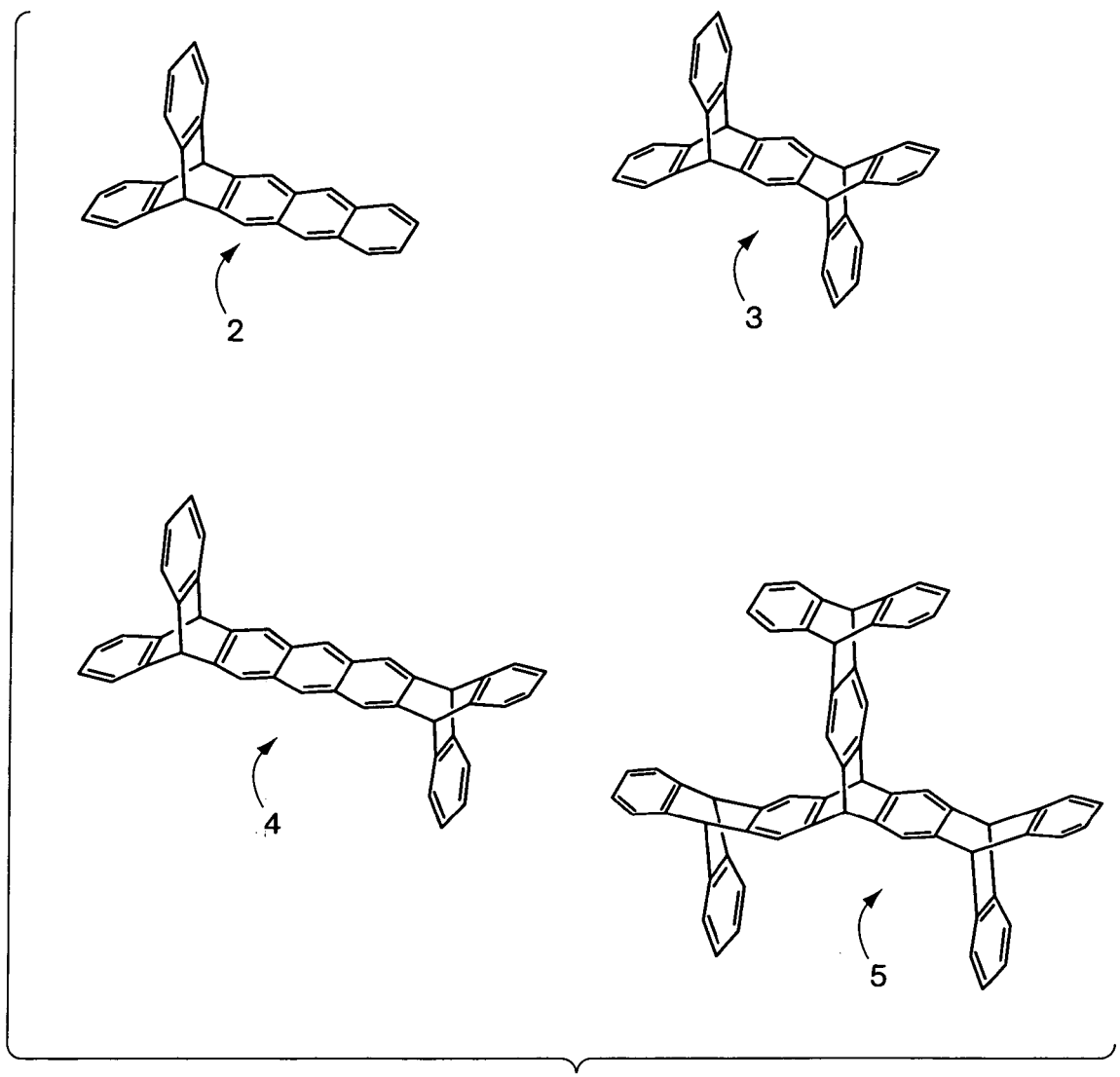
FIG. 1C illustrates structural diagram of molecules of prior art.

In one aspect of the invention, known rigid shape-persistent structures with high degrees of free volume may be used to create new methods for the alignment of guest molecules or polymers in host polymers and liquid crystals. In one embodiment, a molecule with anisotropic optical properties also comprises a shape-persistent molecule such as an iptycene. For example, structure 1 in FIG. 1A, or structures 2, 3, 4, or 5 of FIG. 1C, can be appended onto dye molecules and confer upon them special organizational properties. Any shape-persistent molecule having an internal free volume may be appended onto dye molecules. The shape-persistent material may be composed of, for example, small molecules or high molecular weight polymers. The shape-persistent material may be attached within a main polymer chain or pendant to a flexible or rigid molecule or polymer. In some embodiments, shape-persistent structures may be connected to each other by a polymer interconnect that can occupy some or most of the free volume of the shape-persistent structure, but may not necessarily be chemically attached to the shape-persistent structure. The choice of structure may depend upon the application. In some embodiments, the shape-persistent structure may be required to have high thermal stability. In other embodiments, the shape-persistent structure may require the structures or formulations to comprise fluorescent or electroactive groups. Accordingly, in this aspect the invention involves shape-persistent molecules, such as iptycenes, used in conjunction with molecules with anisotropic optical properties such as liquid crystal and dyes. The shape-persistent molecules typically are bonded to dyes and this combination is used in conjunction with a liquid crystal composition. The shape-persistent molecule enhances alignment of the dye with the liquid crystal matrix. The shape-persistent molecular arrangements may also include polymers or oligomers. As used herein, "oligomer" is a polymeric species with less than 8 repeat units.

In one set of embodiments of the present invention, compositions of the invention comprising iptycenes are provided that may have average molecular weights greater than 2000 grams/mole ("daltons"), preferably greater than 2500 daltons, and more preferably greater than 3000, 4000, or 5000 daltons. The materials may be soluble in common solvents, for example, selected from the group consisting of water, chloroform, carbon dioxide, toluene, benzene, hexane, dichloromethane, tetrahydrofuran, ethanol, acetone, and acetonitrile. The materials may be soluble in a least one of the solvents, or at least two, or three of any of these solvents. "Soluble" in this context means soluble at greater than 0.5 mg/ml, preferably greater than 1 mg/ml, more preferably greater than 5 mg/ml, and more preferably still greater than 10 mg/ml. The materials of the invention may also be preferably soluble in common liquid crystals ("LC") such as cyanobiphenyls, bicyclohexyls, or cyclohexylphenyls, and may be miscible with common polymers such as polyethylene, polyvinyl chloride, poly(methyl methacrylate), polydimethylsiloxane, polyimides, polyisoprene, polypropylene, polystyrene, and co- and block polymers that include these.

One structural feature of one set of embodiments of the invention, the iptycenes, is that the [2.2.2]bicyclic ring system forms the intersections of planes defined by aromatic rings.

Another class of molecules of the invention are those molecules that include a [2.2.2]bicyclic ring system, with each branch of the system connecting to cyclic aromatics. Each of the bridgeheads in these molecules may be connected to three cyclic aromatics, and at least one of the cyclic aromatics may be connected to another [2.2.2] bridgehead-pair of center, or may be fused to another aromatic system (shares at least one bond in common with another aromatic system).

Figure 1E:
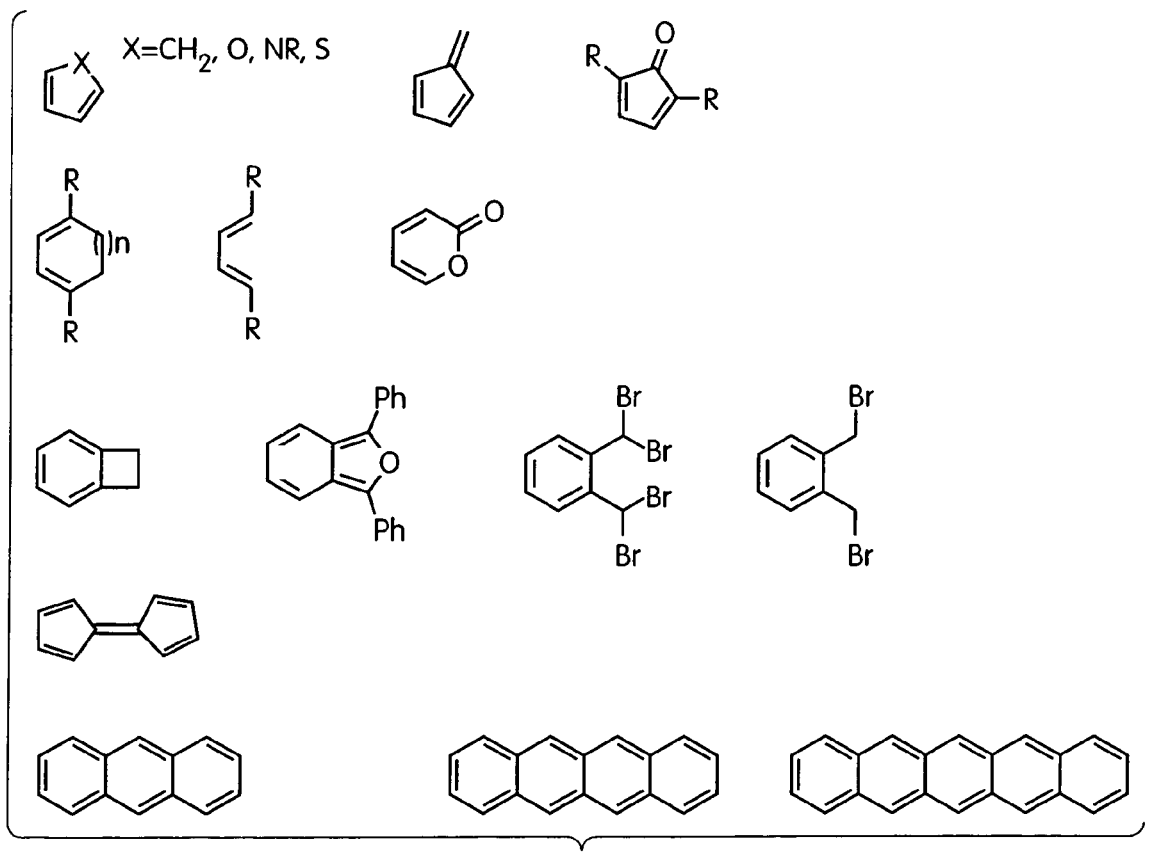
FIG. 1E illustrates example dienes useful in forming molecules in accordance with the invention.
Figure 1F:
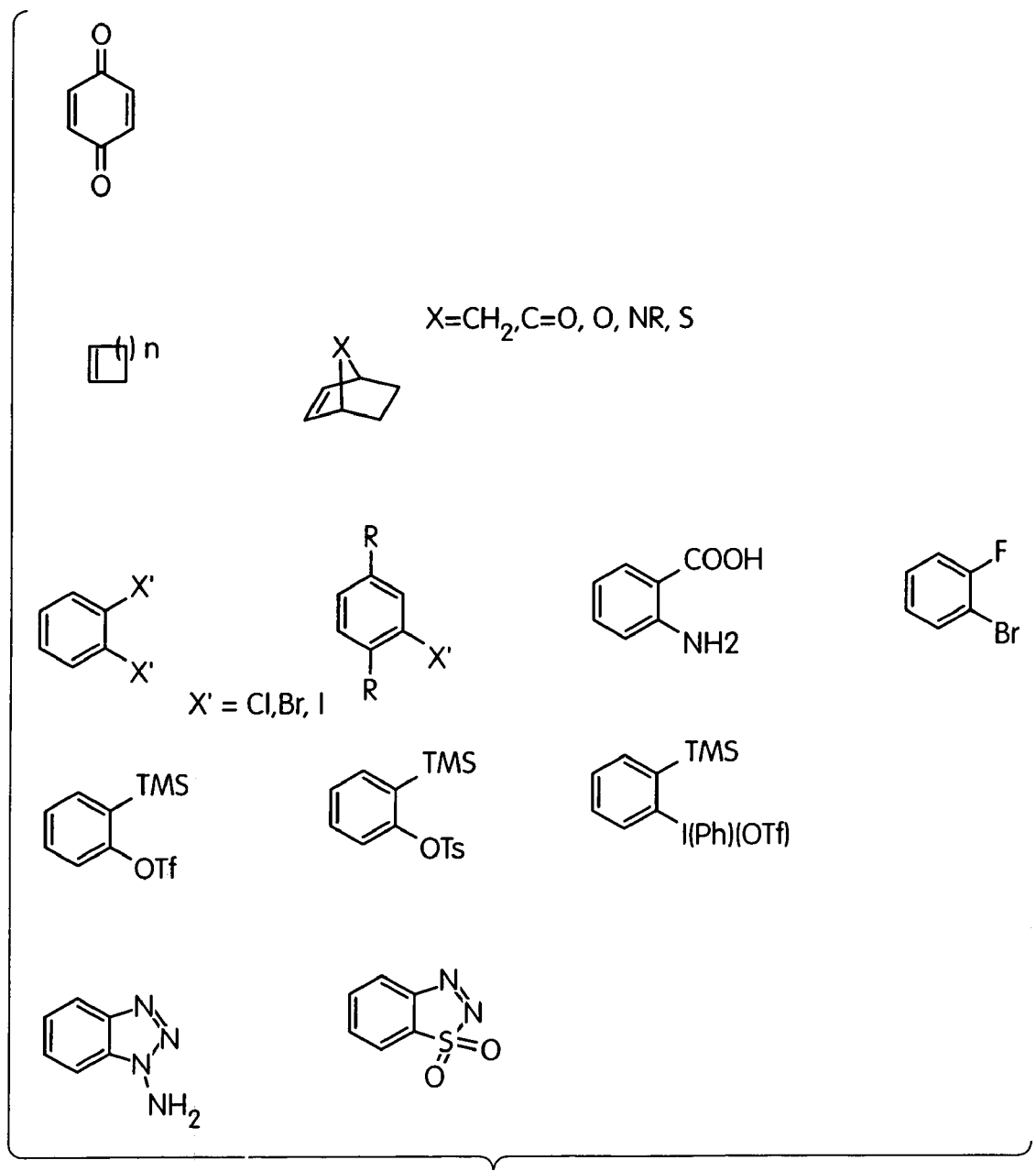
FIG. 1F illustrates example dienophiles useful in forming molecules in accordance with the invention.

In some embodiments, at least two of the cyclic aromatics emanating from the central [2.2.2]system may be fused to another aromatic system or connected to another [2.2.2]center, and in other embodiments, all three cyclic aromatics may be fused to other aromatic systems or connected to a bridgehead center. For example, dienes, such as those shown in FIG. 1E, may emanate from bridgehead centers of various molecules of the invention. Also, dienophiles, for example, as shown in FIG. 1F, may emanate from bridgehead centers. Those of ordinary skill in the art will recognize that, using selected dienes, such as those illustrated in FIG. 1E, or selected dienophiles, such as those shown in FIG. 1F, additional syntheses may result in any of a wide variety of shape-persistent, high free volume molecules.

In one set of embodiments shape-persistent, high-free-volume molecules are based upon structures disclosed in International Patent Publication WO 99/57528, published Nov. 11, 1999 and incorporated herein by reference. Specifically, with reference to FIG. 1G, structures may be provided in which G, H, I an J are aromatic groups; d=1 or 2; and $d^1$=0 or 1, such that when $d^1$=0, $d^2$=0, and when $d^1$=1, $d^2$=0 or 1. Preferably, c is less than about 10,000.

In a preferred embodiment, G and H may be the same or different, and each may be selected from the aromatic group consisting of:

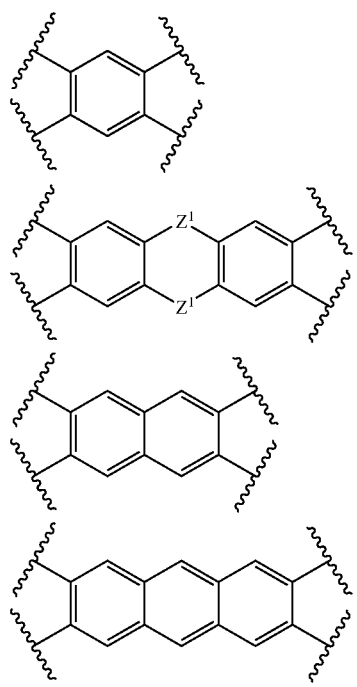

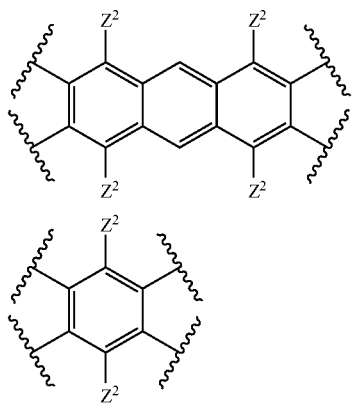

I and J may be the same or different and each can be selected from the group consisting of:

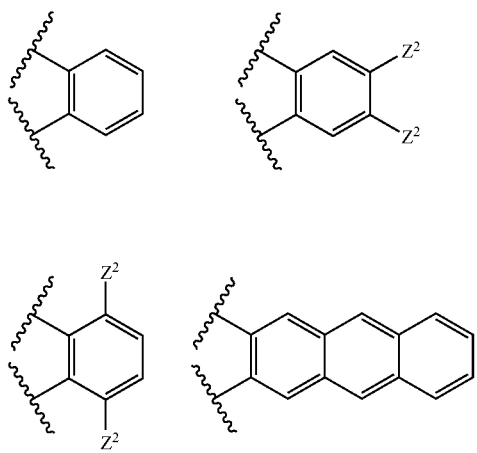

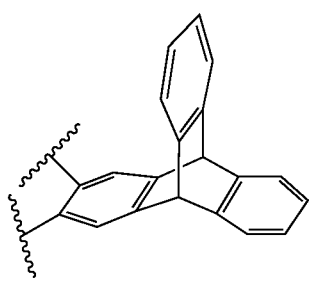

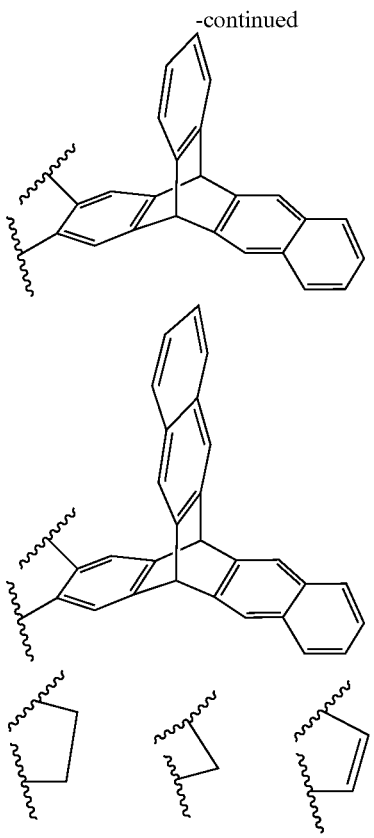

-continued

Any hydrogen in G, H, I and J may be substituted by $R^2$, where $R^2$ can be selected from the group consisting of $C_1$-$C_{20}$ alkoxy, phenoxy, $C_1$-$C_{20}$ thioalkyl, thioaryl, $C(O)OR^3$, $N(R^3)(R^4)$, $C(O)N(R^3)(R^4)$, F, Cl, Br, $NO_2$, CN, acyl, carboxylate and hydroxy. $R^3$ and $R^4$ may be the same or different, and each may be selected from the group consisting of hydrogen, $C_1$-$C_{20}$ alkyl, and aryl. $Z^1$ may be selected from the group consisting of O, S and $NR^8$ where $R^8$ can be selected from the group consisting of hydrogen, $C_1$-$C_{20}$ alkyl, and aryl. $Z^2$ may be selected from the group consisting of F, Cl, $OR^3$, $SR^3$, $NR^3R^4$ and $SiR^8R^3R^4$.

Figure 1G:
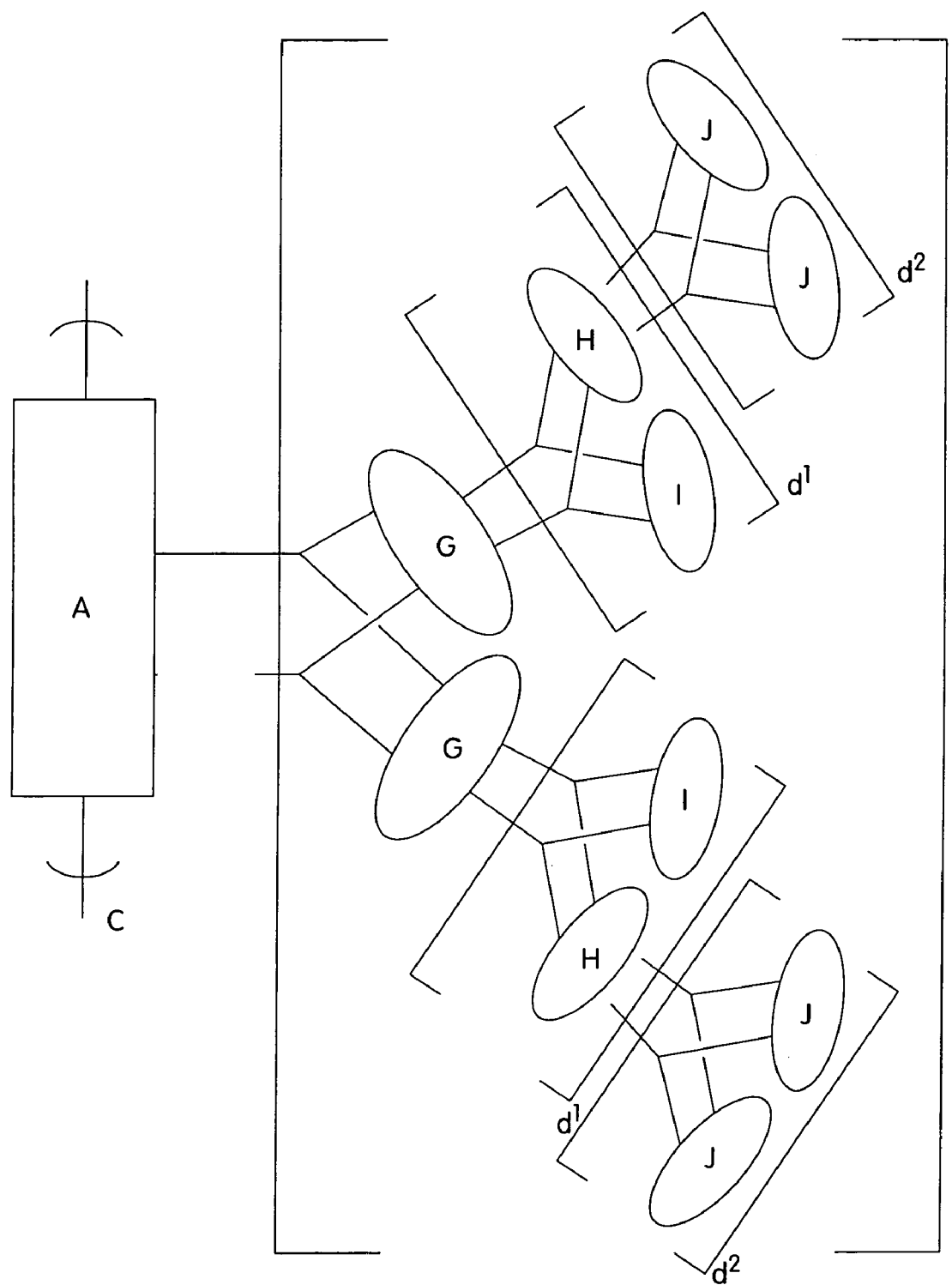
FIG. 1G is a structural diagram of a molecular structure useful in accordance with several embodiments of the invention in which bridgeheads can be carbon or nitrogen.

A may be any shape-persistent molecule such as a cyclic aromatic. A can be similar to or identical to a branch G, H, I, or J, as shown in FIG. 1G, or it may be any other shape-persistent structure described herein. A single branch of G, H, I, J of FIG. 1G may be used in combination with any other shape-persistent organic structure described herein and joined at a bridgehead center.

Bicyclic ring systems of the invention may be produced via synthesis using the Diels-Alder reaction. Other structures may be used in certain embodiments in the invention, for example, ladder polymers or ribbon structures, which each may contain rigid aromatic rings systems. These and related structures may be used in combination with other features of the invention, such as attachment to dyes, "bundling" of molecules, and the like. As used herein, a "ladder" polymer is a polymer having a backbone that can only be severed by breaking two bonds.

In one embodiment of the invention, molecules for use in the formation of rigid shape-persistent polymers with high degrees of internal free volume may involve substitution about the bicyclic ring system, which may provide the needed geometry to provide internal free volume in the structure. In some embodiments of the invention, rigid shape persistent polymers with high degrees of internal free volume may be provided in which the distance from the bridgehead atom to the van der Waals contact of the most distant atom of the smallest substituent directly attached to the bridgehead carbon is more than 4 Å, preferably 5 Å, 6 Å, or 7 Å, or even greater. The significance of this group is that it serves to define additional free volume and internal surfaces, from which important organizational properties in conjunction with polymers and liquid crystals may be optimized. The larger groups further provide structures with greater shape persistence, since the polymers may not be easily collapsed and prevent the interpenetration of one polymer into another.

Figure 1H:
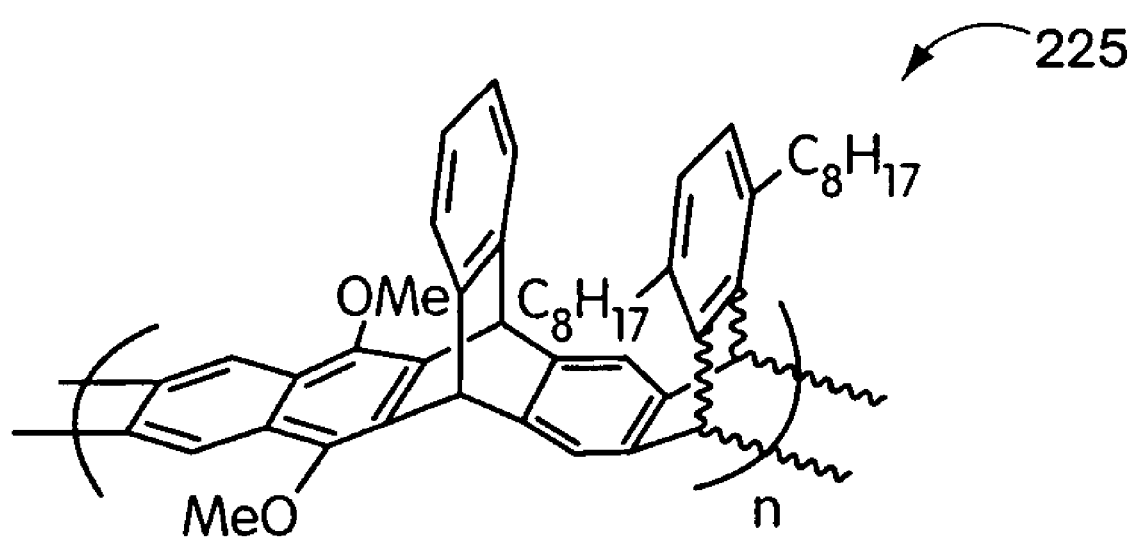
FIG. 1H is a molecule of one embodiment of the invention.
Figure 1J:
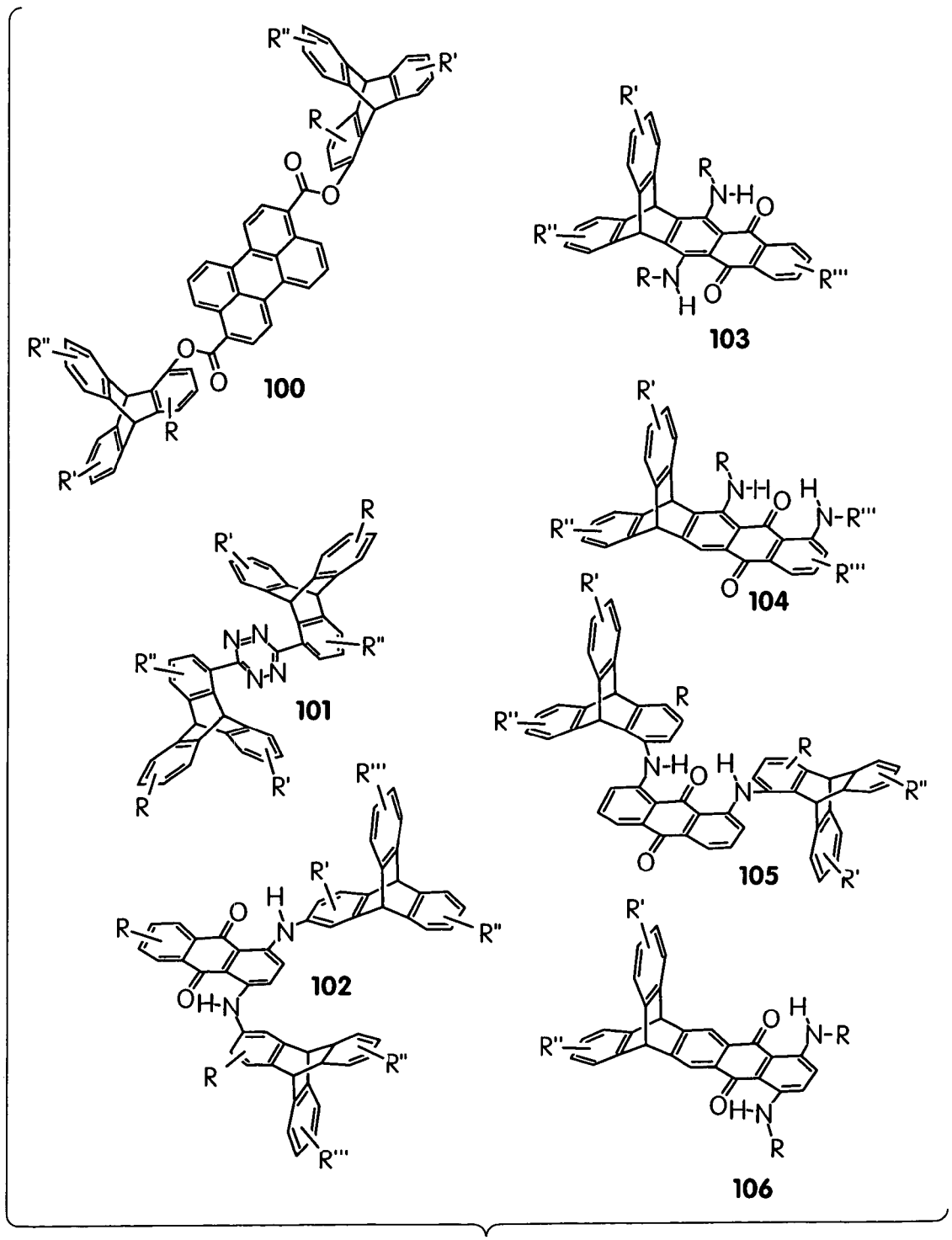
FIG. 1J show molecules of one embodiment of the invention.
Figure 1K:
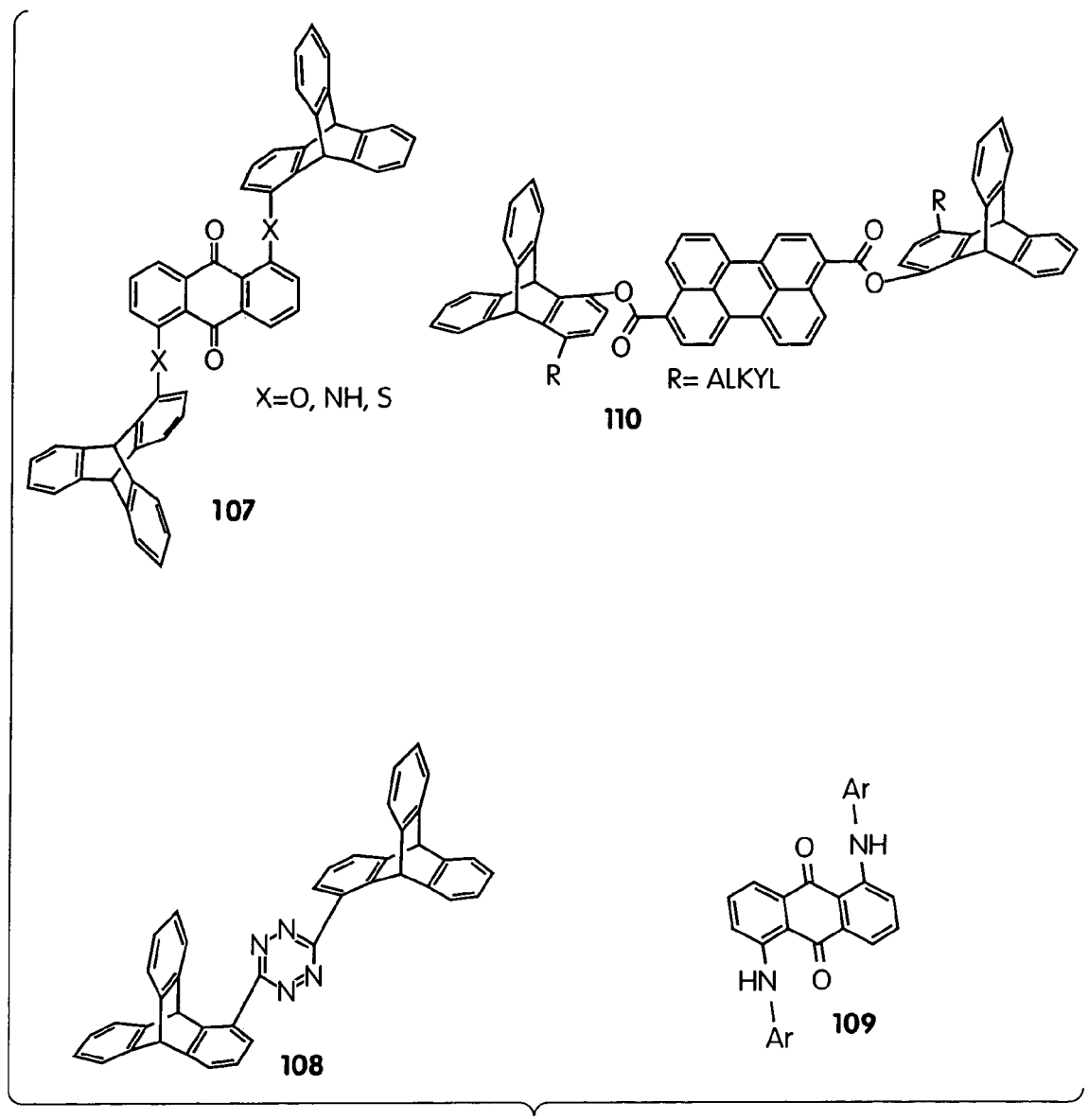
FIG. 1K show molecules of one embodiment of the invention.
Figure 1L:
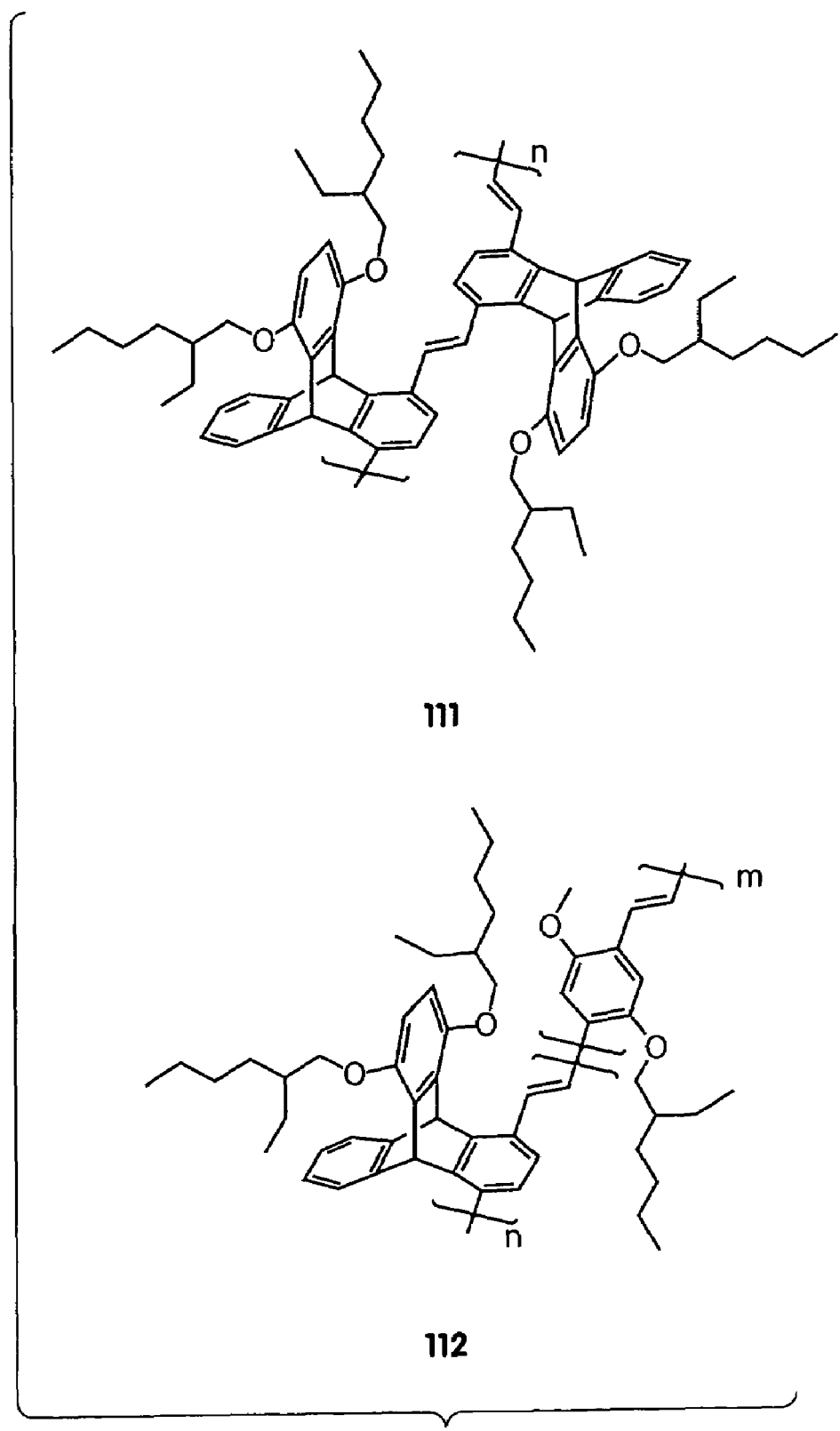
FIG. 1L show molecules of one embodiment of the invention.
Figure 1M:
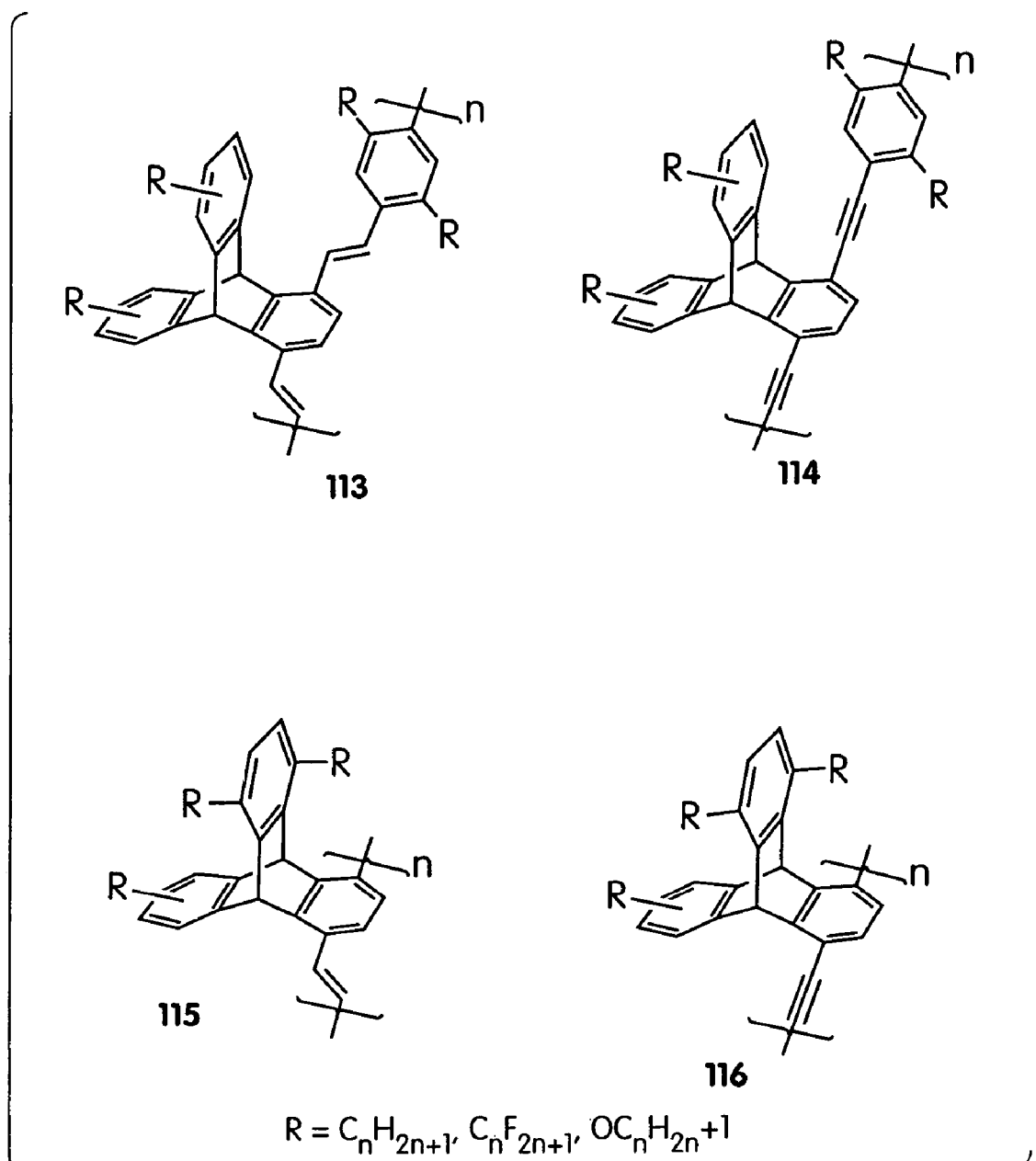
FIG. 1M show molecules of one embodiment of the invention.
Figure 1N:
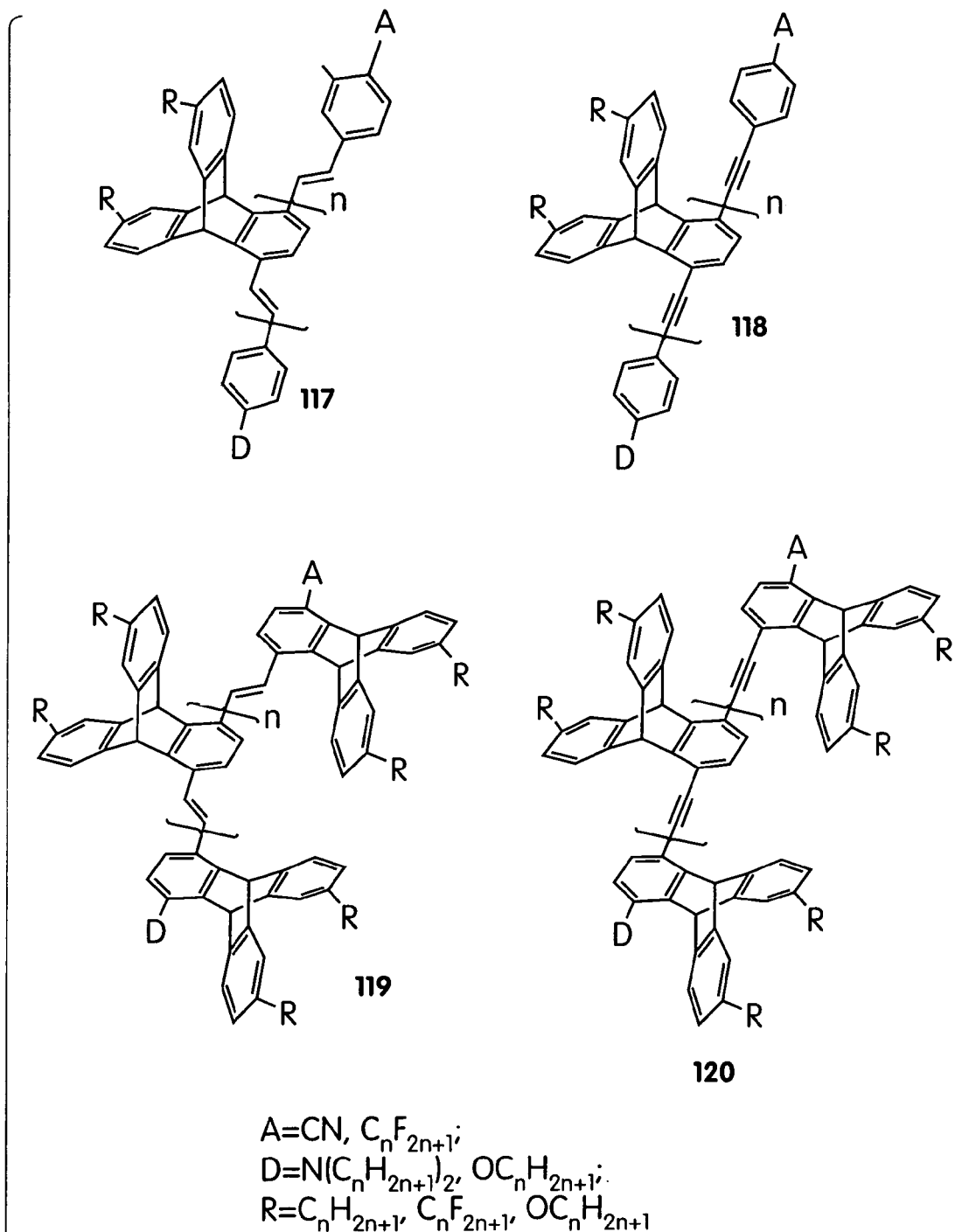
FIG. 1N show molecules of one embodiment of the invention.

Larger molecules based upon the triptycene structure are called iptycenes. Their polymers are called polyiptycenes, for example, structure 225 in FIG. 1H. Central to this aspect of the invention is the formation of rigid structures which cannot collapse on themselves (i.e., collapse to a structure having a free volume of approximately zero), and have a short axis with a distance no less than the long dimension of a single benzene ring (or its "width," approximately 6.214 Å, as illustrated as width 230 in FIG. 2). FIGS. 1J, 1K, 1L, 1M and 1N show additional polyiptycene structures contemplated in the present invention. The structures shown in these figures are not intended to be limiting with regard to the scope of the invention.

In all of the figures, R, R', and R" can be the same or different. Preferably, R is H or a hydrocarbon group (including cyclic hydrocarbon groups), optionally interrupted by hetero groups. As used herein, "hydrocarbon" is meant to include alkyl, alkenyl, alkynyl, cycloalkyl, aryl, alkaryl, aralkyl, and the like. Hetero groups can include —O—, —CONH—, —CONHCO—, —NH—, —CSNH—, —CO—, —CS—, —S—, —SO—, —$(OCH_2CH_2)_n$R (where n=1-10), —$(CF_2)_n$— (where n=1-10), olefins, and the like. As used herein, the terms "hydrocarbon," "alkyl," "cycloalkyl" and similar hydrocarbon terminology is meant to include alcohols and hydrogen. Examples of such groups are methyl, propenyl, ethynyl, cyclohexyl, phenyl, tolyl, benzyl, hydroxyethyl and the like. R is preferably selected from groups including hydrogen and the general class of lower alkyl compounds such as methyl, ethyl, or the like.

For example, R can be an alkyl group, preferably having 1 to 24 carbon atoms, more preferably 1 to 18 carbon atoms; an alkenyl group, preferably having 2 to 4 carbon atoms; an aminoalkyl group, preferably having 1 to 8 carbon atoms, and optionally substituted on the nitrogen atom with one or, preferably two alkyl groups, preferably having 1 to 4 carbon atoms; an alkyl group, preferably having 1 to 4 carbon atoms, having a five- or six-membered heterocyclic ring as a substituent; an allyloxyalkyl group, preferably having up to 12 carbon atoms; an alkoxyalkyl group, preferably having a total of 2 to 12 carbon atoms; an aryloxyalkyl group, preferably having 7 to 12 carbon atoms; an aralkyl group, or the like.

Figure 2:
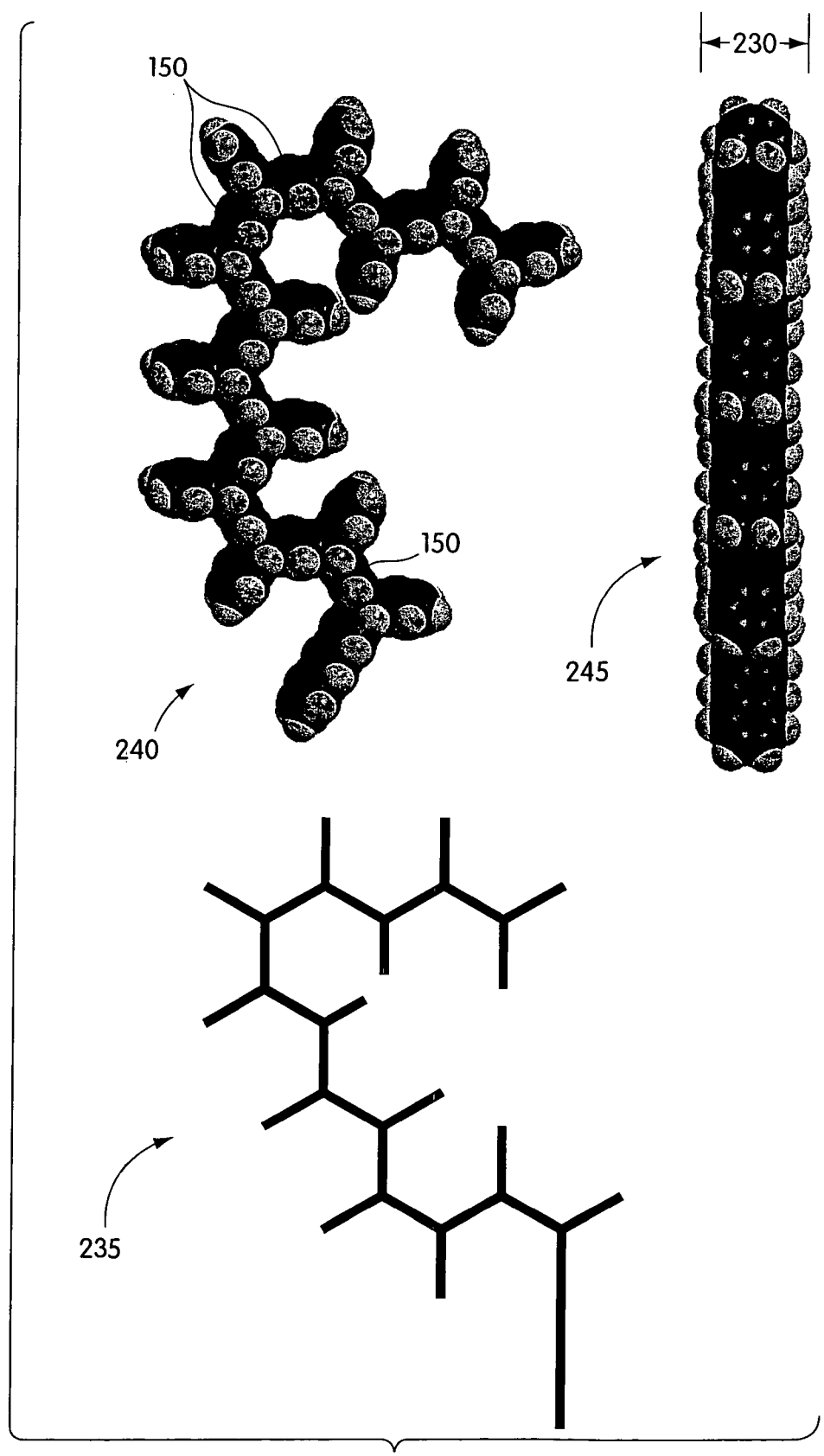
FIG. 2 illustrates the structure of one embodiment of the invention, specifically, a ladder polymer comprising an iptycene.

One polyiptycene structure is illustrated in FIG. 2 as line schematic 235, where each line segment represents the side view of an aromatic ring. A top view 240 and a side view 245 of a space-filling model of the polyiptycene structure may also be seen in FIG. 2. It is noted that the line schematic 235 and view 240 are each taken in the same orientation of the molecule. The polymer structure, which may be stereo-irregular, has a number of clefts 150 that can easily bind small molecules as well as polymer chains.

In some embodiments of the invention, shape-persistent molecules of the present invention may have high free volume and high thermal stability. Molecules with these characteristics may be useful in dielectric coatings for semiconductor devices. By using a low dielectric overcoat, the coupling between neighboring interconnects on semiconductor devices may be reduced. As the lowest dielectric constant possible of a vacuum, materials with high degrees of free volume, such as materials of the present invention, may posses low dielectric constants, and may be useful for reducing capacitive interactions between neighboring interconnects. Accordingly, one embodiment of the invention involves a low-dielectric material comprising a shape-persistent molecule such as an iptycene. Any of the structures falling within iptycene-like structures described herein can be used. In a preferred set of embodiments dielectric materials of the invention comprising shape-persistent molecules have a dielectric constant of less than 3.0, preferably less than 2.5, preferably less than 2.0, or preferably 1.5 or less. The invention includes electronic devices comprising dielectric components comprising the shape-persistent molecules as would be well-understood by those of ordinary skill in the art.

Additionally, molecules of the present invention may be fluorinated. Fluorinated molecules may display lower dielectric constants, and may further reduce capacitive interactions between neighboring interconnects on semiconductor devices. Altering the hydrophobicity of the molecules may further reduce capacitive interactions.

Shape-persistent polymers may also have solubilizing side chains. These chains may be chosen, for example, to be hydrocarbons or perfluoro groups. Desirable materials may include those that do not contain polar functionality, and may be reoriented or polarized by electric fields, giving a low dielectric constant. Furthermore, the molecular structures may be are chosen such that the molecules have no affinity for water, such as atmospheric water.

Figure 2A:
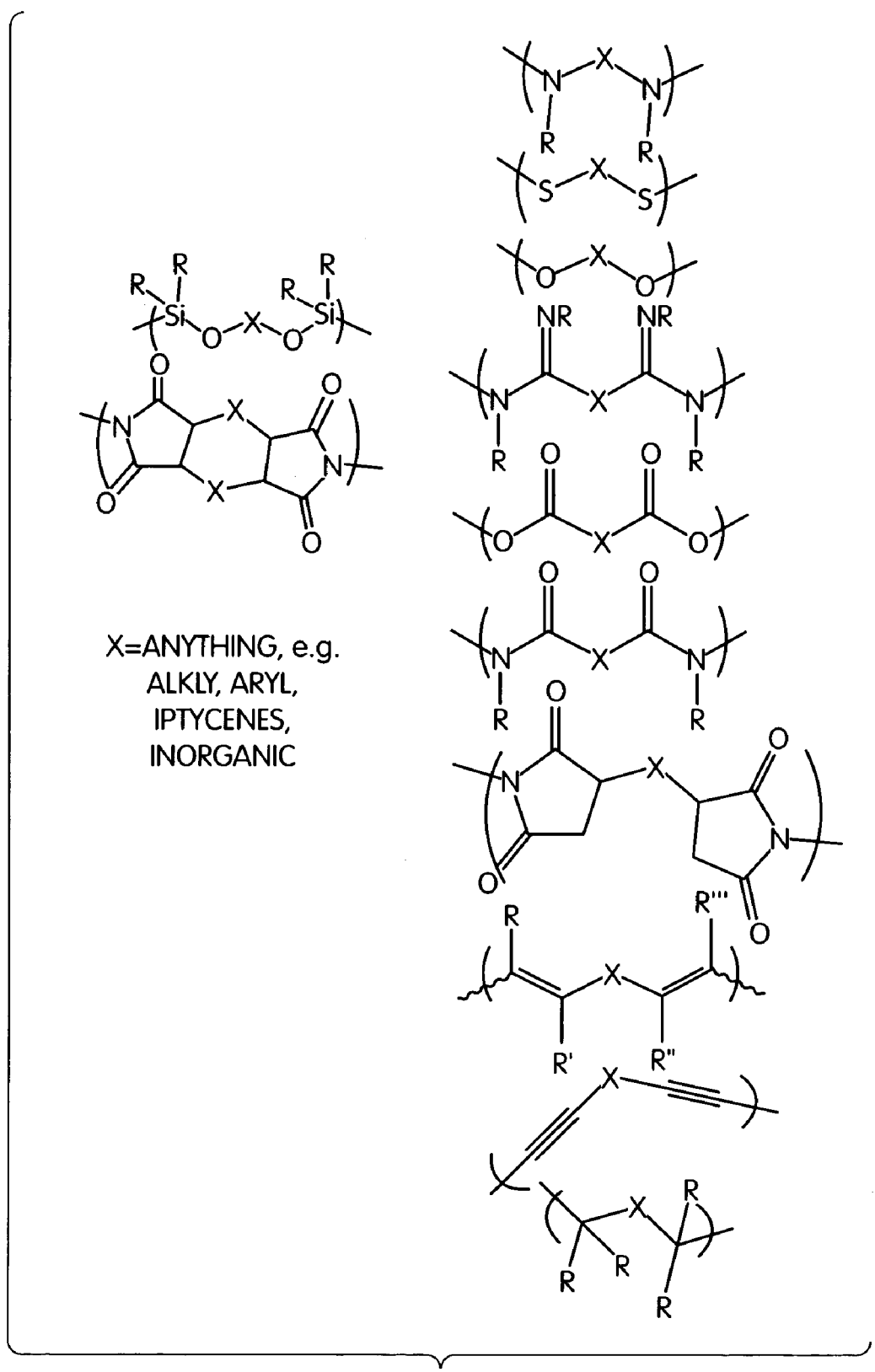
FIG. 2A illustrates linkages for use in one embodiment of the invention.
Figure 2B:
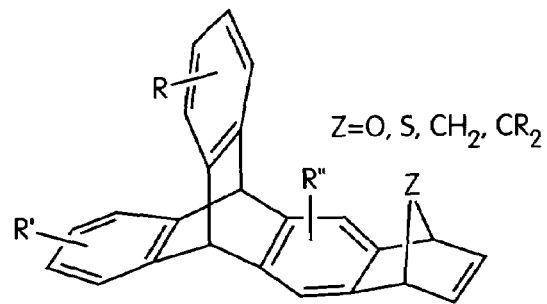
FIG. 2B illustrates a sample triptycene.
Figure 2C:
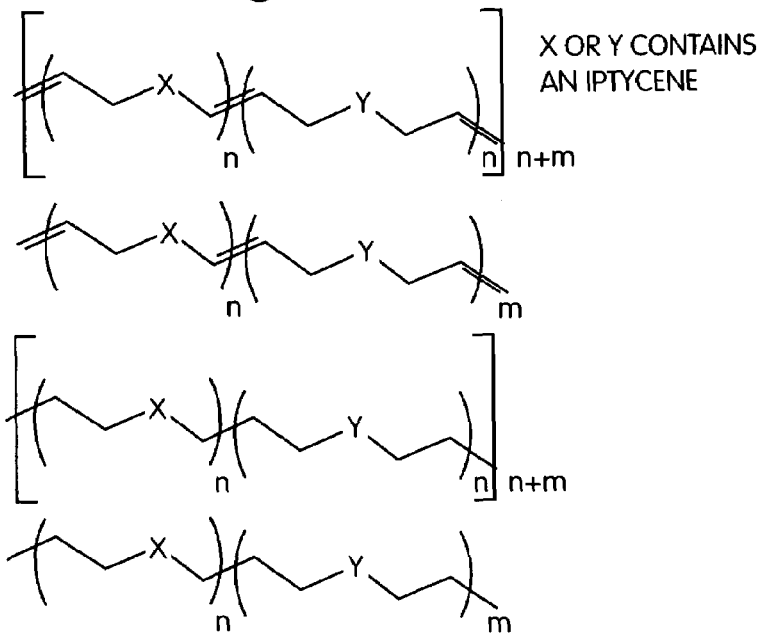
FIG. 2C illustrates iptycenes as used in a polymer according to one embodiment of the invention.
Figure 2D:
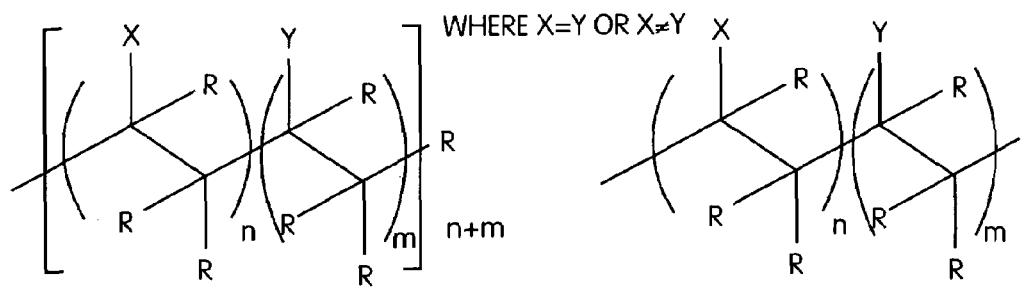
FIG. 2D illustrates iptycenes as used in a polymer according to another embodiment of the invention.
Figure 2E:
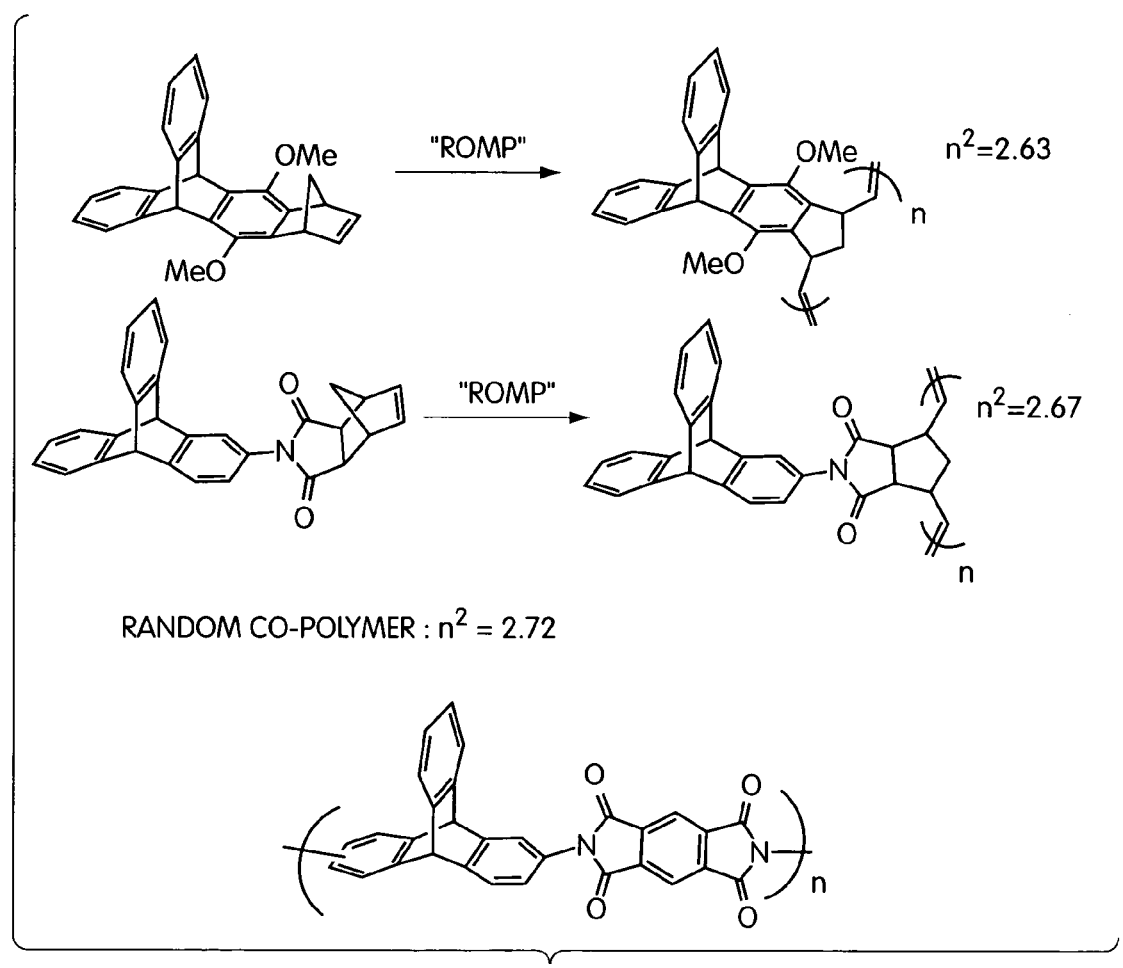
FIG. 2E illustrates synthetic reaction scheme of iptycenes polymers according to one embodiment of the invention.

Examples of iptycenes contemplated by the present invention are illustrated in FIGS. 2A, 2B, 2C, 2D and 2E. FIG. 2A shows example linkages by which an iptycene may be connected through at least any two positions. X may be any chemical structure, for example, an alkyl, an aryl, an iptycene, or an inorganic. FIG. 2B illustrates a sample iptycene that may be used as a dielectric polymer. FIG. 2C shows iptycenes used in a block or random co-polymer. X or Y may be an iptycene. FIG. 2D shows iptycenes as pendant groups on a polymer chain. The polymer may be, for example, a random, a block, or a graft polymer, and the homopolymer or each block of a block-polymer may be a tactic, isotactic, or syndiotactic. FIG. 2E shows several iptycene polymers that may be used as dielectric materials. "ROMP" stands for ring-opening metathesis polymerization. The number of repeat units in molecules of the invention (n) typically is from about 5 to about 1,000, preferably from about 10 to about 500, and more preferably from about 10 to about 200. In FIG. 2E the measured dielectric constant of molecule 800 is 2.63. The dielectric constant of molecule 801 is 2.67, and the dielectric constant of molecule of 802 is 2.72. In FIG. 2D, X and/or Y may be iptycenes, optionally functionalized, and R can be essentially any chemical structure, for example, alkyl, aryl, etc. If X equals Y, then the polymer may be a tactic, isotactic, or syndiotactic. If X is not identical to Y, then each block may be a tactic, isotactic, or syndiotactic.

As an illustrative example, in a shape-persistent polymer comprised only from benzoid rings and hydrocarbon side chains, the reduction in dielectric constant that will accompany the internal free volume can be determined as follows. For a material with 50% free volume, the dielectric constant may be reduced to about 1.55 (vacuum=1.0). For a material with 70% free volume, the dielectric constant may be about 1.33, and for 90% free-volume dielectric constant may be about 1.09. In contrast, conventional $SiO_2$ dielectrics with the proper performance typically have dielectric constants of 3.5 to 4.0. Thus, a material with a composite of a shape-persistent materials and a polymer needed to meet other barrier and adhesive properties may be useful as a dielectric coating in high performance integrated circuits.

In one embodiment, the materials of the present invention incorporate free volume directly into the molecular design, allowing for greater uniformity of pore sizes, as well as smaller pore sizes. The present invention provides sub-nanoporous materials in accordance with one set of embodiments. "Sub-nanoporous" materials are defined herein as materials with pores smaller than 10 nm, preferably smaller than 5 nm, and more preferably smaller than 4 nm in size. The structures of the materials may be rigid and non-collapsible. The small pore size may decrease or eliminate metal diffusion and short-circuiting, or lower the dielectric constant of the material.

Polyiptycenes and other shape-persistent polymers disclosed here may have nanoscopic pockets of air, and may display high compressibility in particular directions. Accordingly, another aspect of the invention involves polymeric compositions of the invention constructed and arranged to absorb a compression-causing force. Such an arrangement would be understood by those of ordinary skill in the art, and includes constructions in essentially any known shock or force-absorbing structure such as an athletic shoe sole, automobile bumper, or any other cushioning structure.

In one embodiment, the shape-persistent polymers of the invention may be used to bind polymer chains together. The polymers function as molecular "clips" for polymers, keeping them bundled together and preventing them from splaying. These methods may be used to produce materials with large material strengths. Bundling materials together may prevent single chains from bearing a full load applied to a material.

In another embodiment, shape-persistent structures of the present invention may be used to bind molecules and polymers within their internal structures. The interaction of the shape-persistent structure with other molecules is anisotropic, providing a preferred orientation between elements. This effect produces a new method for aligning materials in liquid crystals and polymers. Host materials, such as liquid crystals or polymers, may fill the free volume as defined by the rigid shape-persistent guest. These structures may used in, for example, liquid crystals or polymer films.

The "aspect ratio" is defined as the ratio of the dimensions of the material. For alignment of a solute in a uniaxial polymer or liquid crystal matrix, the relevant aspect ratio is the longest axis of the material divided by its next longest axis. Alternative aspect ratios may be defined based on the specific nature of the solute.

Figure 3:
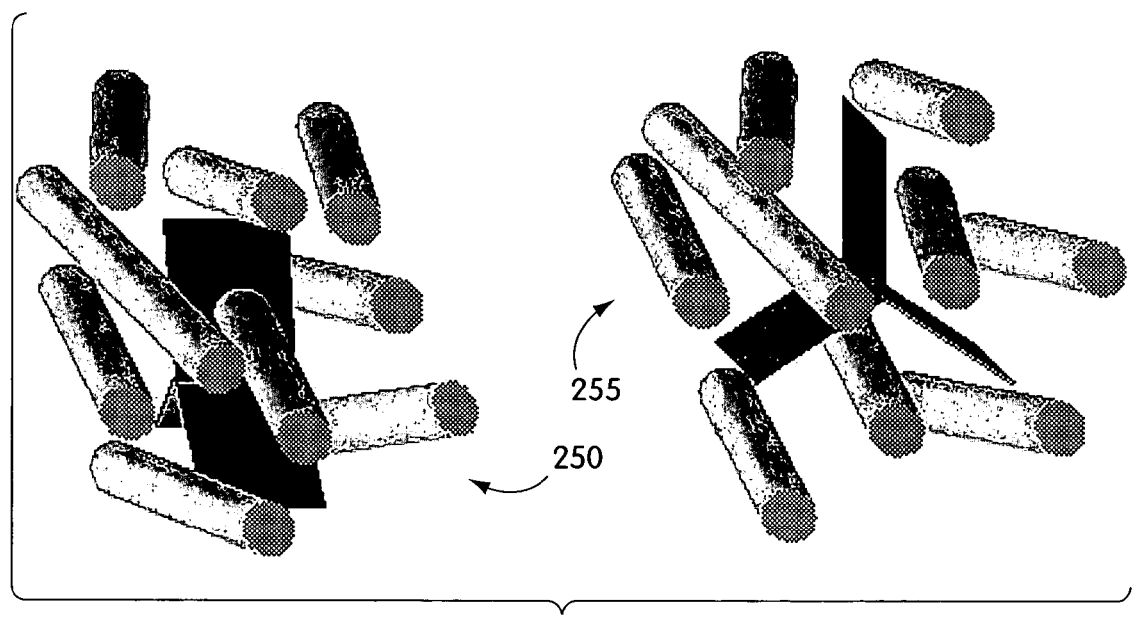
FIG. 3 illustrates alignment of a triptycene with liquid crystal molecules according to one embodiment of the invention.

An efficient packing may be accomplished by a "threading" mechanism wherein the liquid crystal packs within the iptycene void spaces, such as depicted in structure 255 in FIG. 3. This observed solvation molecule may fill the empty spaces created by the iptycenes while minimally disrupting alignment of the host. In contrast, in structure 250 in FIG. 3 the opposite aspect ratio alignment does not efficiently fill the voids, and causes a greater disruption to the nematic phase. By threading molecules such as liquid crystal molecules through the void spaces, the volume may be efficiently filled. Incorporated molecules, such as, for example, anthracene, may be aligned perpendicular to its aspect ratio. This alignment may be governed by the minimization of free volume of the system.

The three-dimensional structures of triptycenes result in special solvation properties that may create unique solute orientations. The void spaces between aromatic triptycene faces allow threading of other small molecules, for example, liquid crystals, and macromolecules, for example, polymers, through these spaces. This interaction causes chromophores that are part of the iptycene backbone to align. In some cases alignment may occur by application of a source of external energy, such as an electric, magnetic, optical, acoustic, electromagnetic, or mechanical field.

This alignment may be used, for example, in color liquid crystal displays. The organization of dichroic dyes in nematic liquid crystals may be required to make a color liquid crystal display. The contrast in these displays may be determined by the contrast ratio between the different states, resulting from the realignment of the liquid crystal director with an electric field. The liquid crystal director in a nematic liquid crystal may be defined as the average direction over which a large grouping of molecular long axes of the liquid crystal point. Control of the director direction may be accomplished in displays by surface forces and electric fields. The individual host molecules may be disordered and have a distribution of directions about the director. The absolute value of the average angle that the individual molecules deviate from the director (direction of orientation) may be used to calculate an order parameter. The size of this angle may be related to intermolecular interactions, thermal fluctuations, and the aspect ratio of the liquid crystals.

Conjugated polymers may be used to fabricate electronics devices. Applications in devices such as light emitting diodes, field-effect transistors, photovoltaic devices, and sensors may be envisioned. In one aspects of the invention, bulky properties of conjugated polymers may be tailored using controlled organization of the polymer chains.

The uniform or quasi-uniform orientation of conjugated polymers may be the result of in the increase of the conductivity and the emission of polarized light. Alignment of the molecules may be achieved using self-organizing liquid crystalline polymers, Langmuir-Blodgett films, or mechanical stretching. Alignment may also be achieved by dissolving the material ("guest") in a liquid crystal ("host"). The directed orientation of solute molecules in liquid crystals takes place as a result of the anisotropic interactions between the two components, known as the "guest-host effect."

The solubility of conjugated polymers may be increased by attaching pendant groups such as alkoxy, alkyl, alkylsilyl, or phenyl groups to the main chain. Incorporating iptycenes in poly(p-phenylene ethylene)s ("PPE") or poly(p-phenylene vinylene)s ("PPV") may minimize interpolymer chain contacts so as to increase the fluorescence efficiencies. PPVs may be prepared through the coupling between aryl diiodides and phenylene bis(vinylboronate) derivatives, similar to the coupling of arylborate and aryl halide (the "Suzuki" reaction) used in the synthesis of biaryl compounds. Due to the general requirement of highly pure difunctional monomers in step growth polymerizations, pinacol ester derivatives of bisvinyl borates were designated as monomers for the synthesis of PPVs to ensure efficient purification. Pinacol esters of organic borates are stable to column chromatography conditions, facilitating purification. Iptycene moieties may also be incorporated into other conjugated systems to generate polymers with variety of electronic properties. 1,4-diethynyltriptycenes may be prepared as a precursor for the synthesis of both PPV- and PPE-containing triptycene moieties.

If such a structure is dispersed in a liquid crystal or a stretched polymer, the structure may align in such a way that its longest axis lies perpendicular to the direction of orientation of the liquid crystal or the polymer. A composite material containing the shape-persistent polymer and a polymer such as, for example, polyethylene, can exhibit what is known as a negative Poisson ratio ("NPR"). Materials with such properties are also called "auxetics." An NPR or an NPR material refers to the situation wherein a material being stretched along one axis will expand along another, contrary to what is typically exhibited by polymers.

Accordingly, another aspect of the invention involves use of materials and/or polymers of the invention in constructions making use of NPRs. NPR materials of the invention may be used as structural and mechanical materials. NPR materials of the invention may also be used as adhesives that, when delamination is attempted, the polymer filling the interstitial pores of an object expands and does not pull out of the structure in which it is embedded. NPR materials may also be used in, for example, fasteners or nails that resist any attempt to remove them by pulling. Since the Poisson ratio of a material has an effect on the transmission and reflection of internal stress waves, NPR materials of the invention define a new class of materials that more efficiently distribute stress around holes and cracks. This may be especially useful in, for example, sandwich paneling for aircraft and automobiles. Additionally, such sandwich paneling made from negative Poisson materials may adopt a much stronger convex shape upon bending rather than a saddle shape which positive Poisson material exhibit, and absorb impact without being damaged. This effect may make it difficult for a projectile or other object to puncture an object made from a negative Poisson material. Thus, NPR materials may also be used in the design of protective gear, such as, for example, bulletproof vests or shatterproof windows. In one set of embodiments, NPR materials of the invention are formed by assembling a network of polymeric shape-persistent material, such as structure 240 of FIG. 2, which inherently includes very small pores (e.g. those of about.3, 4, 5, 6, 7, or 8 Angstroms internal diameter) A second polymer that threads the pores, when loosened, allows the overall structure to collapse upon itself to some degree. That is, structures 240 can be made to align relative to each other where common molecules that thread pores of a adjacent molecules 240 are not tensioned. Once such molecules threading the pores are tensioned, molecules 240 will be forced to orient parallel to each other creating additional free volume and increasing the overall volume of the structure. Thus, a NPR material is defined.

The function and advantage of these and other embodiments of the present invention will be more fully understood from the examples below. The following examples are intended to illustrate the benefits of the present invention, but do not exemplify the full scope of the invention.

EXAMPLE 1

Figure 4:
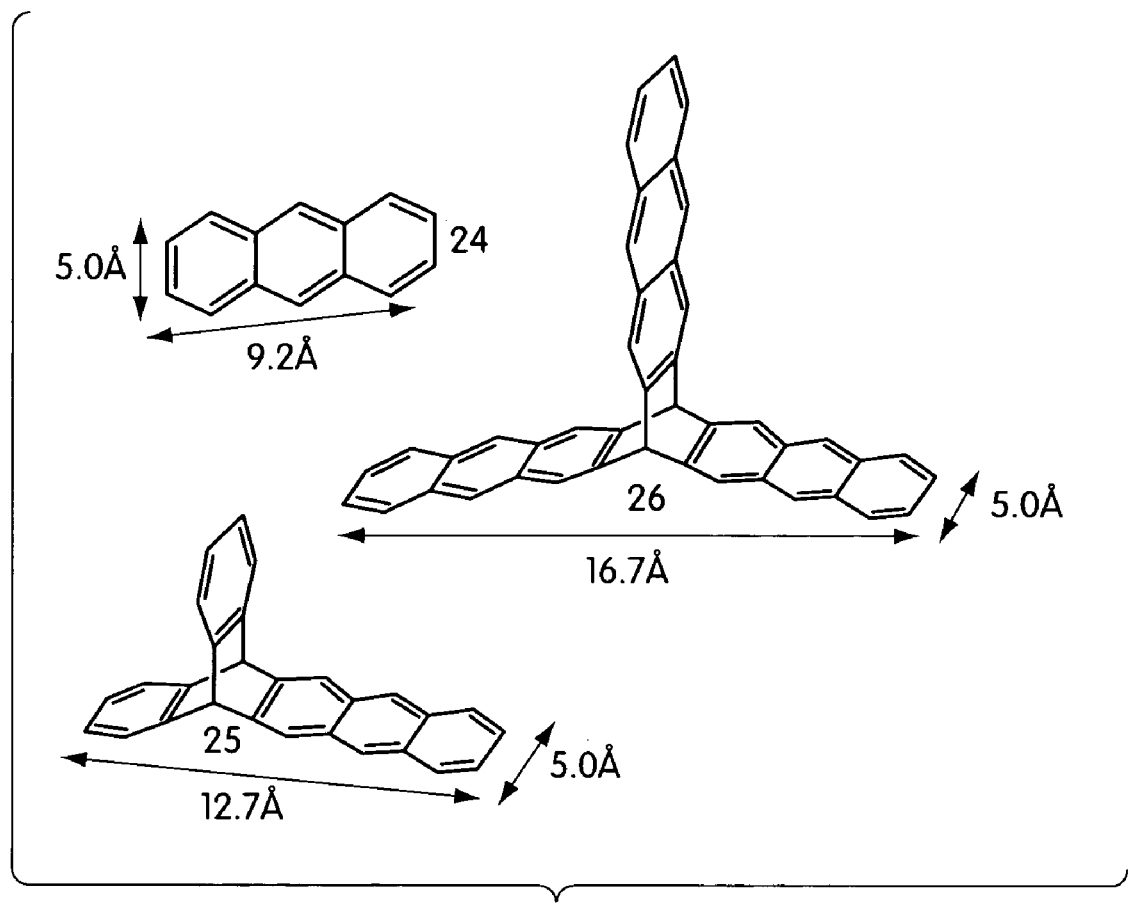
FIG. 4 illustrates molecules useful in accordance with embodiments of the invention.

Triptycenes 25 and 26 in FIG. 4 have large free volumes between their aromatic faces, aligned normal to the host alignment to efficiently fill this volume. The orientation of triptycenes 25 and 26 may be quantified using anthracenyl groups that have optical absorptions with well-established polarizations. Triptycenes 25, and 26 having anthracenyl groups were introduced into a room temperature nematic liquid crystal. Small aromatic guest molecules may align uniaxially in nematic liquid crystalline solvents or stretched polymer sheets. Alignment may proceed such that the director axis of the nematic liquid crystal or stretching direction of a polymer film is parallel to the long-axis of the guest molecule. This effect may be visualized through polarized UV-Vis and IR spectroscopies. Polarized UV-Vis spectra of triptycenes 25 and 26 were compared with anthracene 24, which aligns according to its aspect ratio and may thus be used as a probe of molecular orientation. The aspect ratio for each of the three molecules is defined by the ratio of their longest to shortest axes and are 1.84 for anthracene 24, 2.54 for triptycene 25, and 3.34 for triptycene 26. Based upon aspect ratio considerations, alignment of the long axis of each molecule with the host alignment direction increases across the series from 24 to 26.

Homeotropic alignment of 1 wt % mixtures of anthracene 24 and triptycenes 25 and 26 in 4-(trans-4-pentylcyclohexyl) benzonitrile was achieved using surface rubbed test cells to give uniaxial alignment. Polarized spectra of anthracene 24 in the nematic liquid crystal were consistent with previous literature reports, showing alignment of the molecules with their long-axes along the nematic liquid crystal director. The transition moment of the lowest energy vibronically-coupled absorption (320-380 nm) of anthracene 24 was short-axis polarized, and therefore gave larger UV-Vis absorption with light polarized perpendicular to the liquid crystal director. Observation of the polarization dependence of the similar absorption bands of the anthracenyl-moieties of triptycenes 25 and 26 allowed for detection of their orientation.

Figure 5:
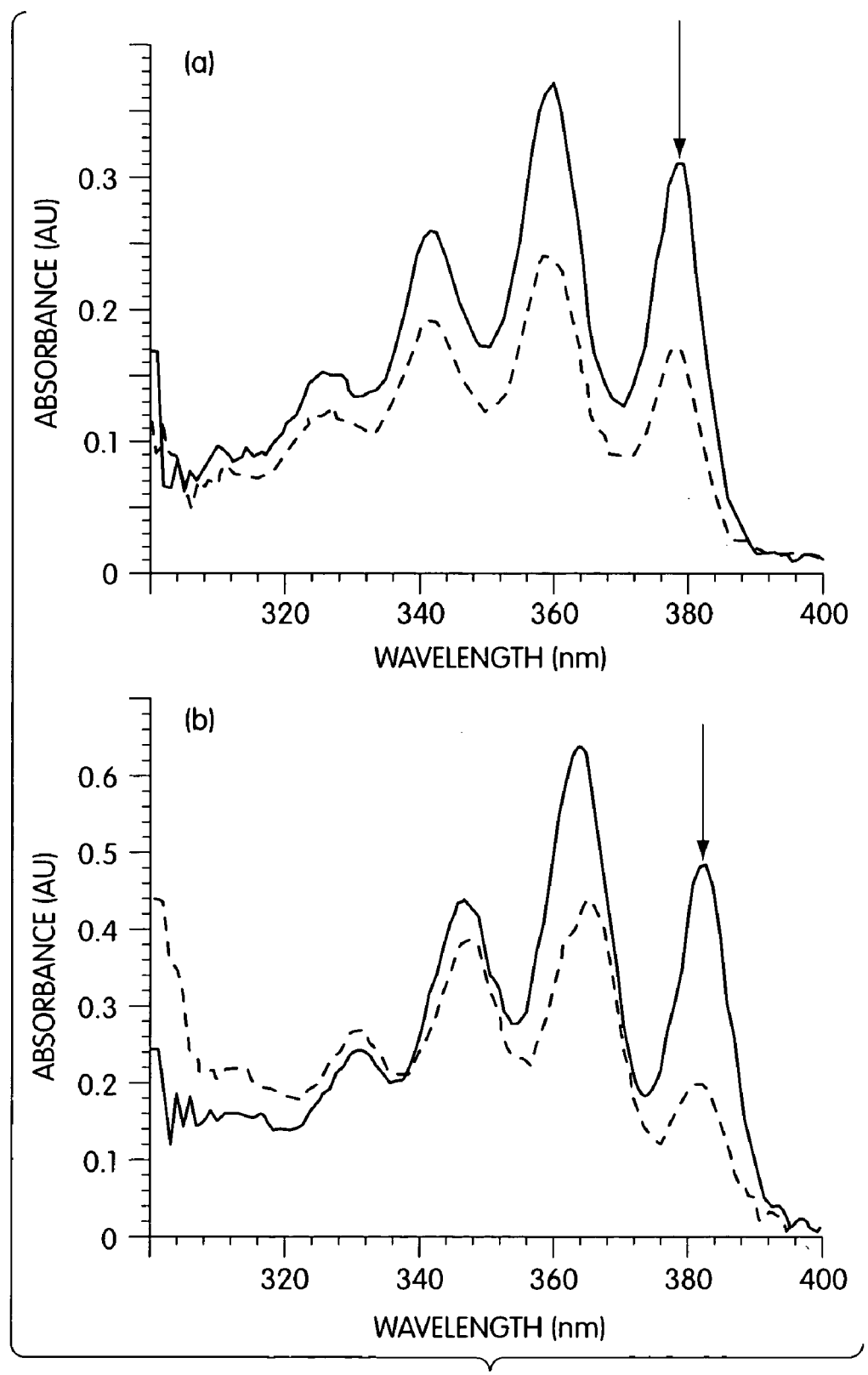
FIG. 5 is a plot of the dichroic ratio of a dye comprising an iptycene aligning with a liquid crystal composition compared with a dye that does not include an iptycene according to one embodiment of the invention.

Upon measurement, the dichroic ratio of mixtures of triptycenes 25 and 26 were found to be the inverse of anthracene 24, shown in FIG. 5; the dichroic ratio, $A_{//}/A_\perp$ for these molecules are listed in TABLE 2. $A_{//}/A_\perp$ for triptycenes 25 and 26 was >1.0, while for $A_{//}/A_\perp$ was <1.0 for anthracene 24. Larger absorptions (320-380 nm) were seen when exposed to parallel polarized light versus perpendicular. This was most easily seen in the 0-0 absorption at 380 nm that was purely short-axis polarized. The higher energy vibronically-coupled absorptions begin to overlap a higher energy long-axis polarized transition.

The observed dependence implies that the alignment of the anthracene chromophores of the triptycenes was normal to the liquid crystal director, a result in which is opposite to the alignment expected on aspect ratio alone. This alignment was likely a result of the large free volume of the iptycene molecules. Based on the aspect ratio argument, triptycene 26 would be expected to align the most efficiently since it traces out larger void spaces due to its size; triptycene 25 would be expected to align poorly. However, triptycene 25 also showed good alignment. The smaller void spaces created by triptycene 25 were sufficient to align molecules showing the powerful effect of void spaces coupled with a rigid backbone.

Figure 6:
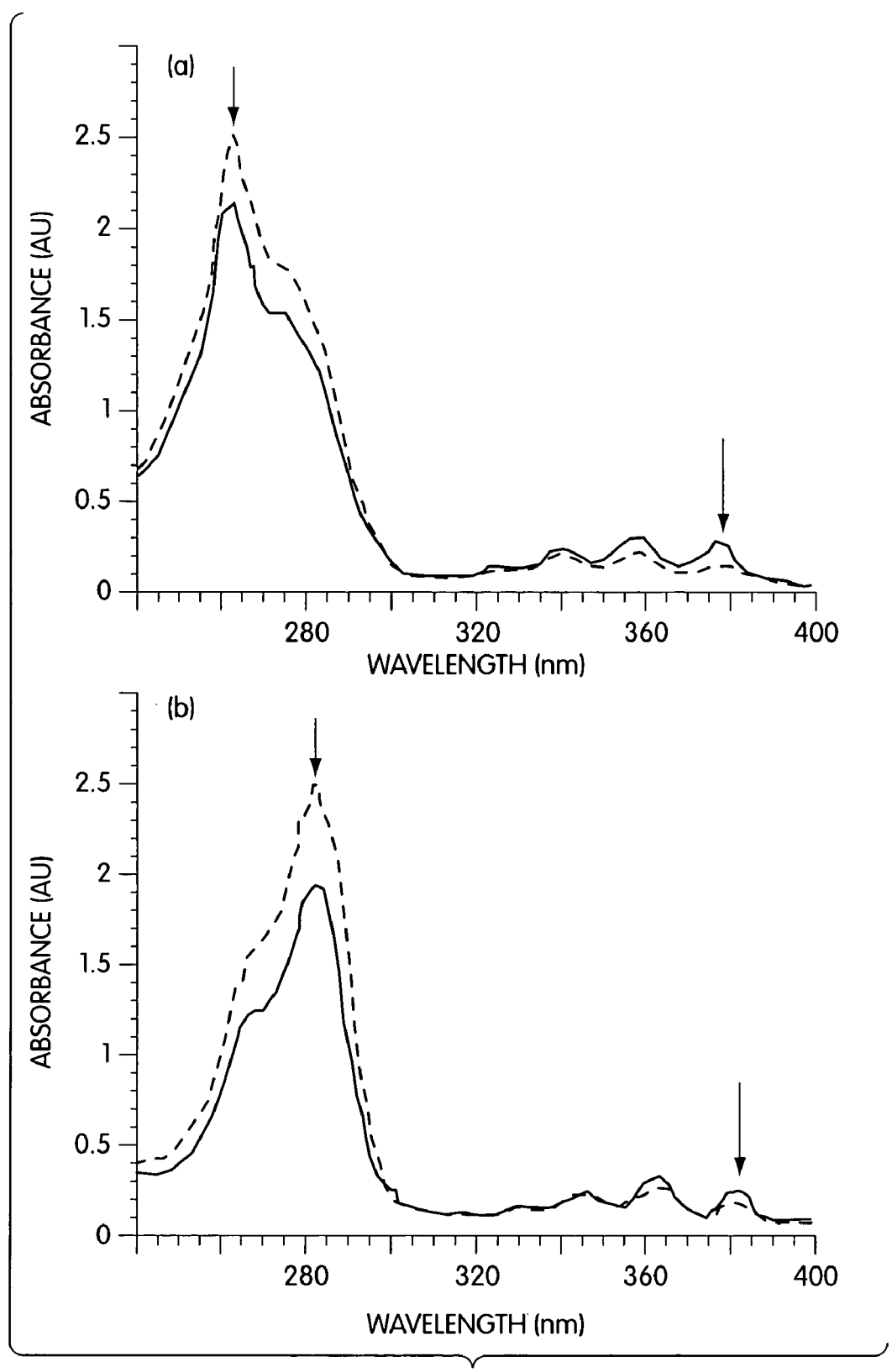
FIG. 6 is a plot of the dichroic ratio of iptycene containing dye versus iptycene-free dye in terms of alignment with liquid crystals according another embodiment of the invention.

As an elucidation of the "threading" model, thin solution-cast polyvinyl chloride films containing 1 wt % anthracene 24 and triptycenes 25 and 26 were prepared. These molecules were uniaxially stretched to impart macromolecular alignment. The enlarged UV-Vis window of polyvinyl chloride versus the liquid crystal allows observation of both the strong anthracene absorption at 250 nm as well as the weak 350 nm absorption. As with the liquid crystal host, anthracene 24 aligns with its long-axis along the stretching direction, while triptycenes 25 and 26 both showed a preference for alignment of their long axes normal to the stretching direction, as illustrated in FIG. 6. This can be seen in both absorptions at 260 nm and 380 nm as an inverse relationship with respect to incident polarization. The alignment is reflected in the dichroic ratios listed in TABLE 2. In all cases, the alignment provided by uniaxial polyvinyl chloride was lower than that achieved by liquid crystal alignment.

EXAMPLE 2

Quinone-Containing Monomers

Figure 6A:
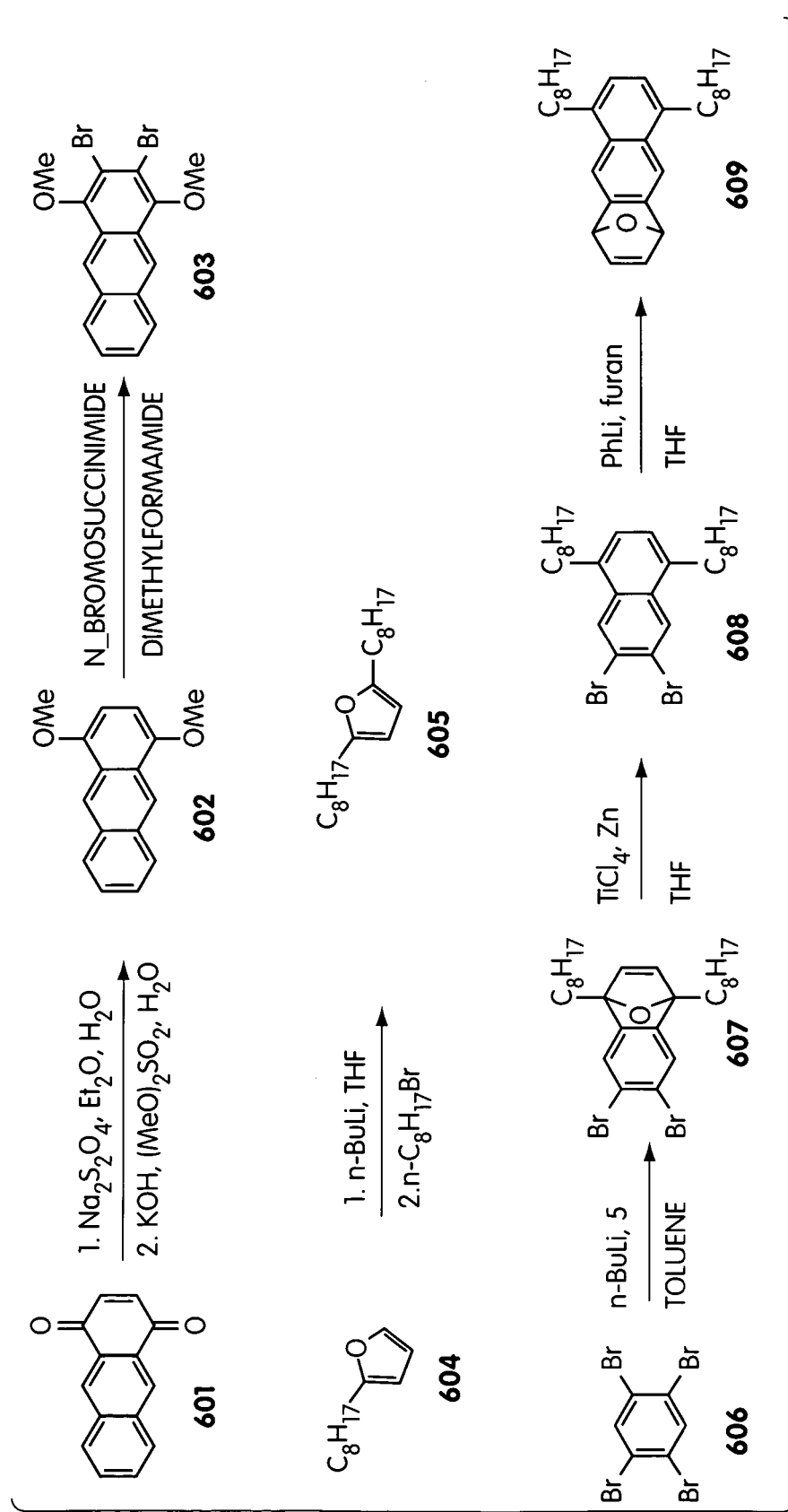
FIG. 6A illustrates a synthetic reaction scheme of one embodiment of the invention.
Figure 6B:
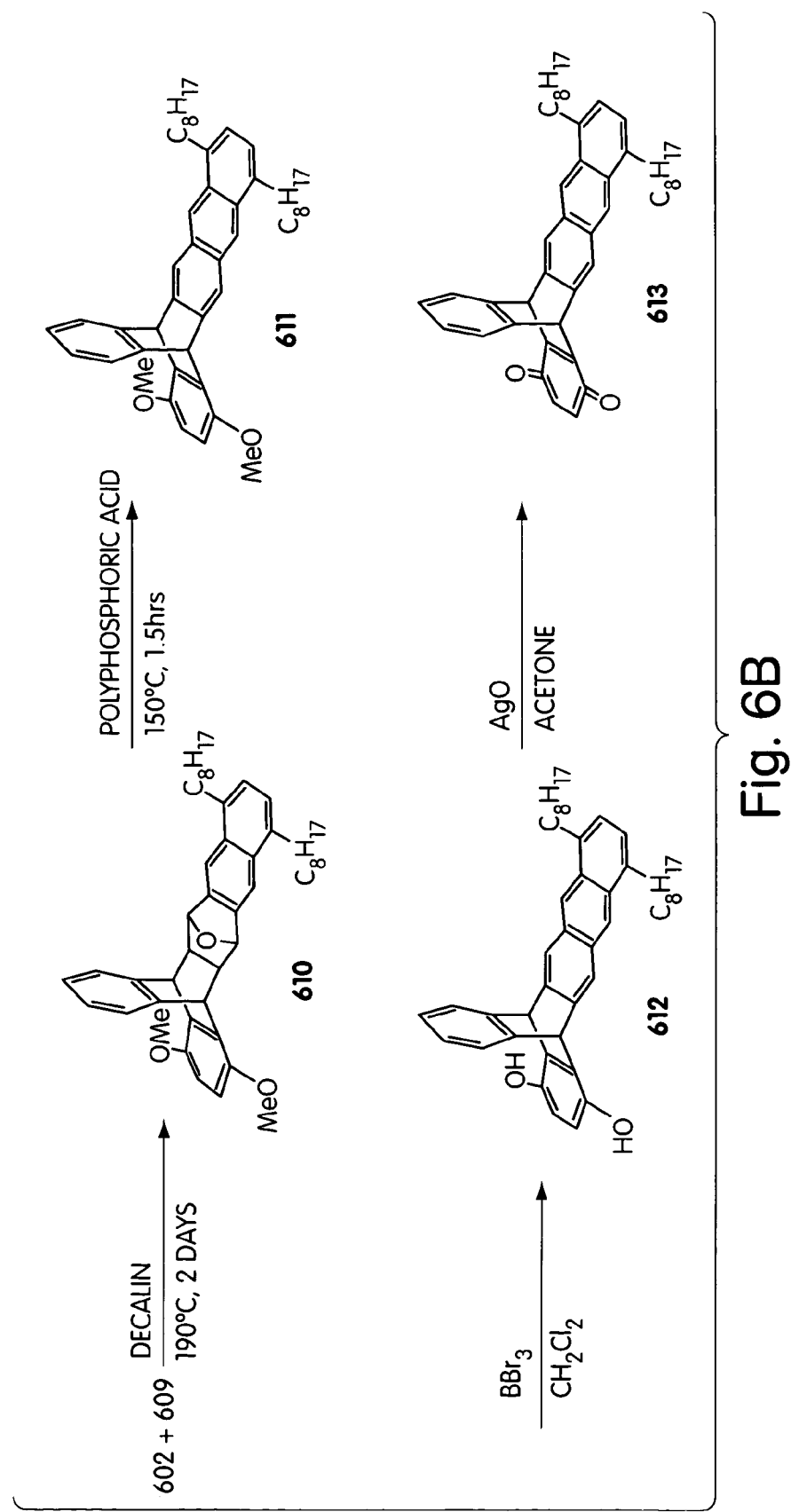
FIG. 6B illustrates a synthetic reaction scheme of another embodiment of the invention.

The preparation of ribbon-type polyiptycenes, illustrated in FIGS. 6A and 6B, requires the synthesis of a triptycene containing both a diene and dienophile within the same molecule. Polymerization occurs via Diels-Alder condensation. A triptycene synthesized in this fashion was compound 613 from the condensation of 1,4-dimethoxyanthracene 602 and compound 609. To aid in polymer solubility in common organic solvents (chloroform, THF, dichloromethane, etc.), long alkyl-groups were appended to monomer 613 via 609.

Starting with 1,2,4,5-tetrabromobenzene, compound 607 was prepared by trapping the benzyne formed by addition of n-BuLi with 2,5-dioctylfuran. Then, $TiCl_4$/Zn deoxygenation of 607 yielded naphthalene 608 which was converted to the desired compound 609 via trapping of the benzyne form by addition on PhLi with furan. The reaction of 602 and 609 in decalin at 190° C. for 2 days, yielded the Diels-Alder adduct 610 which was dehydrated to the anthracene 611 with polyphosphoric acid at 150° C. Finally, the quinone was obtained through demethylation with $BBr_3$ in dichloromethane to obtain hydroquinone 612, then subsequent oxidation to the quinone 613 with AgO in acetone.

Figure 6C:
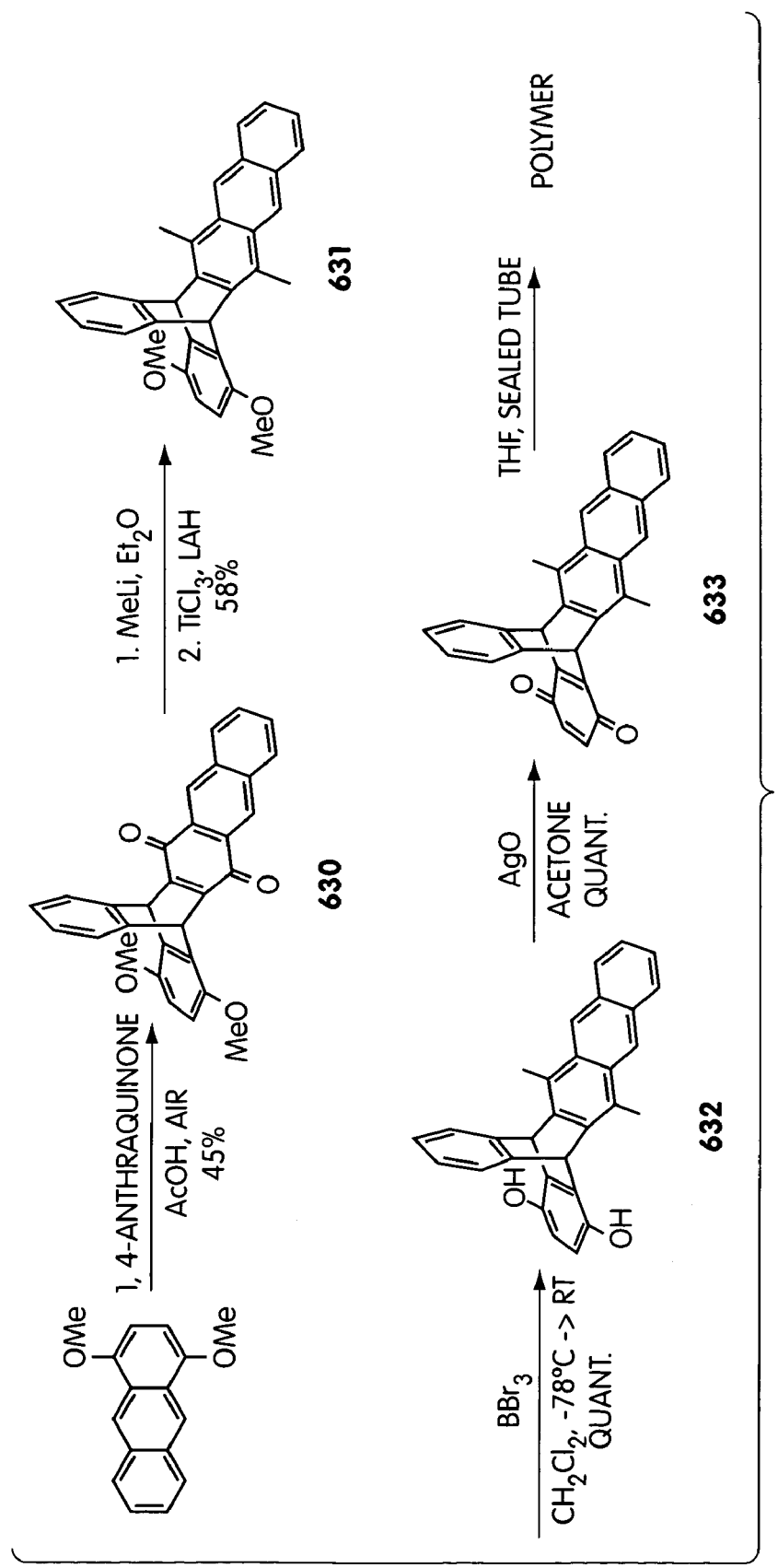
FIG. 6C illustrates a synthetic reaction scheme of another embodiment of the invention.

Another route to these monomers is illustrated in FIG. 6C, where reaction of 1,4-anthraquinone with an excess of 1,4-dimethoxyanthracene in refluxing acetic acid gave quinone 630. Addition of MeLi to both ketones, followed by $TiCl_3$/$LiAlH_4$ reduction of the resulting diol gave anthracene derivative 631. Then, the same methylation and oxidation procedure vide supra yields monomer 633, with methyl groups proximal to the bridgehead.

EXAMPLE 3

Epoxy-Containing Monomers

Figure 6D:
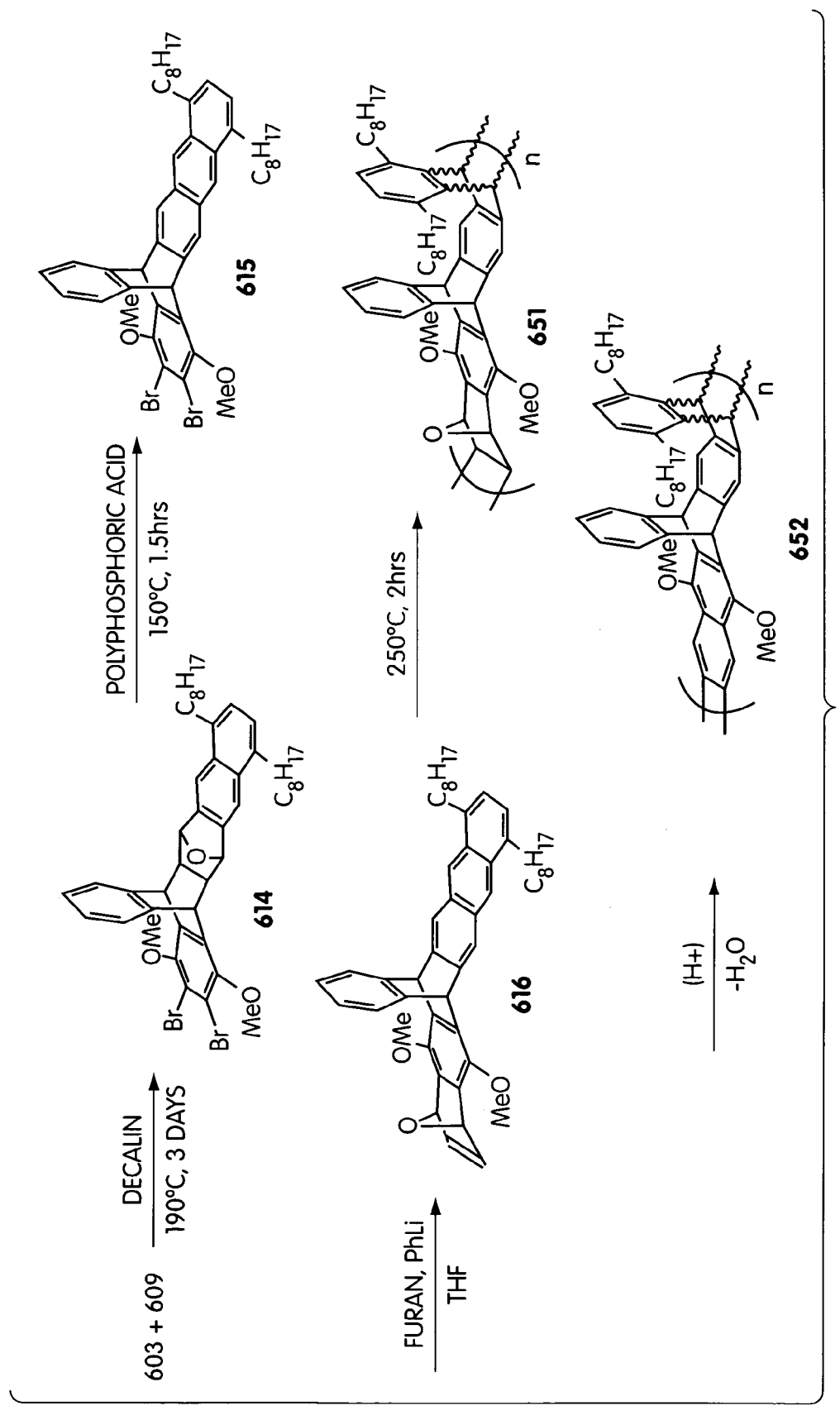
FIG. 6D illustrates a synthetic reaction scheme of another embodiment of the invention.

To prepare epoxy-containing monomer 616, the previous synthetic scheme were slightly altered, as illustrated in FIG. 6D. Reaction of 2,3-dibromo-1,4-dimethoxyanthracene 603, obtained by NBS bromination of 1,4-dimethoxyanthracene 602 in DMF, with 609 for 3 days at 190° C. in decalin yielded adduct 614. Dehydration of 614 with polyphosphoric acid or trimethylsilyl polyphosphate gave anthracene 615. Final trapping of the benzyne, formed by PhLi addition to 615, with furan, gave monomer 616. Compound 616 has two diastereomers (henceforth, fast-616 and slow-616) that are easily separated by column chromatography.

EXAMPLE 4

Hyperbranched Monomers

Figure 6E:
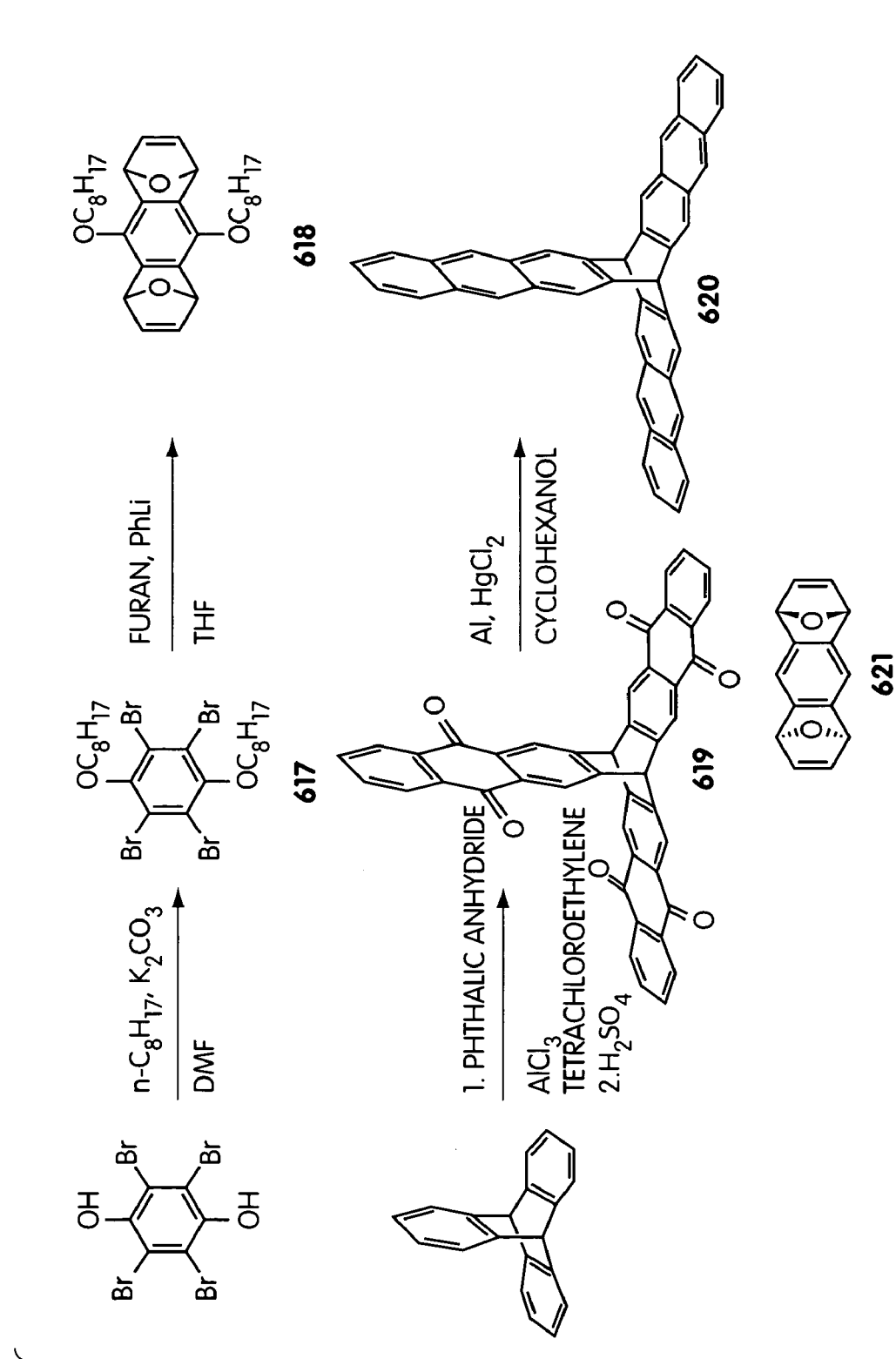
FIG. 6E illustrates a synthetic reaction scheme of another embodiment of the invention.

Multi-functional monomers may be required for forming hyperbranched polymers, as illustrated in FIG. 6E. Hyperbranching has the effect of greatly increasing the molecular weight of the polymer. Triptycenes containing multiple dienes or dienophiles are used in this example.

For multiple dieneophiles, anti-1,4:5,8-diepoxyanthacene 621 may be used, but synthesized monomer 618 containing two octyloxy-groups for increased solubility may also be used. The synthesis was started by adding alkyl groups to 2,3,5,6-tetrabromohydroquinone via a Williamson ether synthesis, giving compound 617. Then, trapping both benzynes formed from 617 with addition of PhLi in the presence of furan yielded monomer 618. Monomer 618 was produced in two diastereomers where both epoxy-groups are either in a syn- or anti-arrangement (53%:47% syn:anti), and were easily separated by column chromatography.

For multiple dienes, monomer 620 was synthesized, giving three anthracene moieties within one triptycene-like core. This was made by a Friedel-Crafts reaction of triptycene with phthalic anhydride in the presence of $AlCl_3$. Then, ring closure of the tris-ketoacid with concentrated sulfuric acid gave compound 619. Conversion of 619 to 620 was achieved with $Al/HgCl_2$ in cyclohexanol.

EXAMPLE 5

Ring Opening Metathesis Polymerization (ROMP) Methods

Figure 6F:
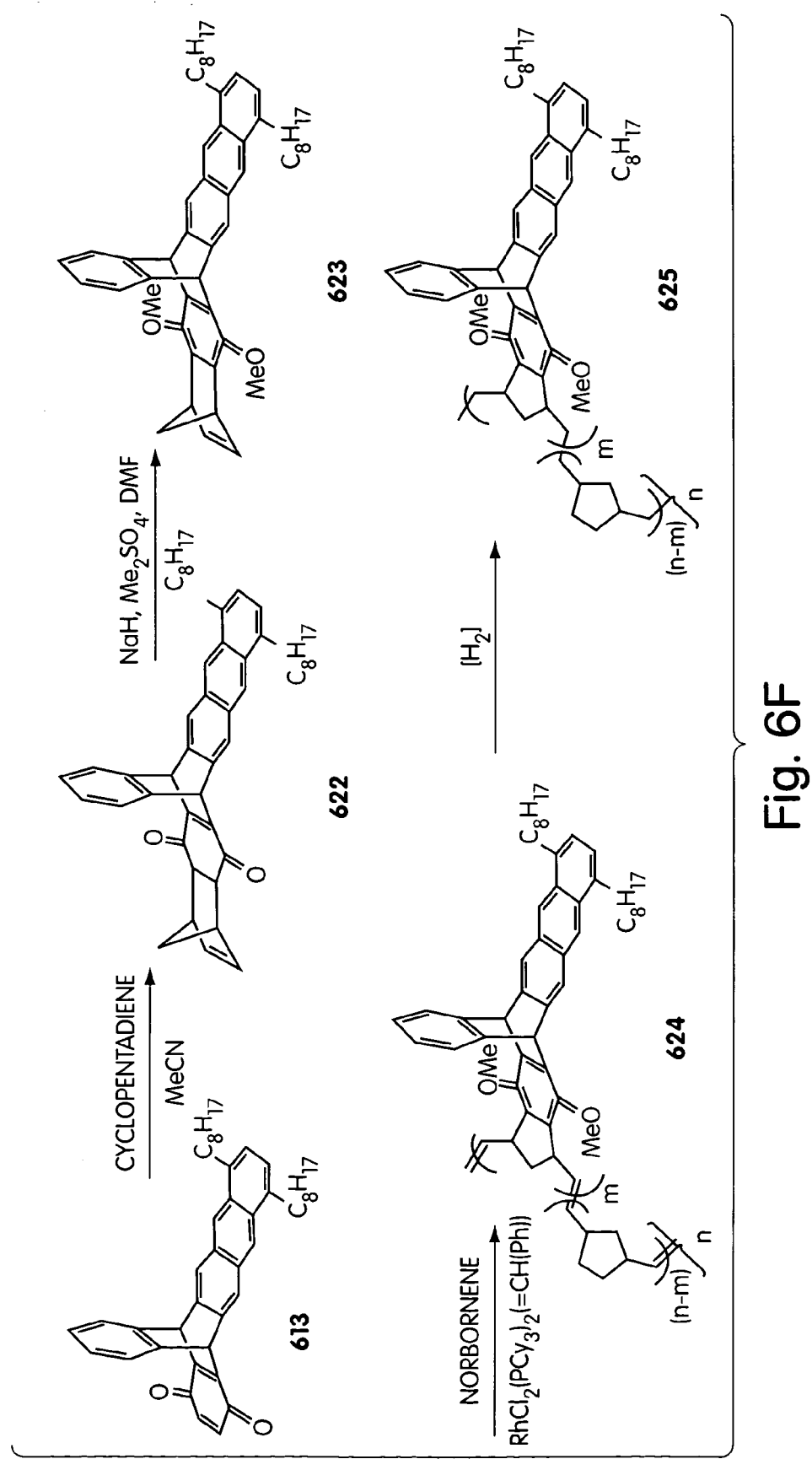
FIG. 6F illustrates a synthetic reaction scheme of another embodiment of the invention.

Monomers for direct incorporation of iptycenes into the backbone of a processable polymer may require a reactive alkene for use in ring-opening metathesis polymerization. Along these lines, both diastereomers of 616 may be used, however, the tetrahydrofuran substructure in the resulting polymer would be less stable than the corresponding cyclopentane structure. To provide a more stable structure, monomer 623 was prepared, as illustrated in FIG. 6F.

Starting from monomer 613, Diels-Alder reaction of the quinone with freshly prepared cyclopentadiene in acetonitrile at 0° C. gave adduct 622. Subsequent tautomerization of the adduct with sodium hydride in DMF followed by methylation with dimethyl sulfate gave monomer 623.

Monomer 623 may be used as a co-monomer (1%-100%) with norbornene in ROMP polymerizations to produce a copolymer 624 with iptycenes directly in the backbone. Hydrogenation of the remaining double bonds will produce a processable polymer 625 with a potentially negative Poisson ratio.

EXAMPLE 6

Polymerization Results

Heating solid samples of diastereomers of 616 (fast-616; slow-616) for 1-4 hours to 200-250° C. under $N_2$ yielded polymers of various sizes and polydispersities. By gel permeation chromatography (GPC), THF soluble fractions gave the molecular weights and polydispersities listed in TABLE 1. Addition of hyperbranched monomers 620 and 621 allowed for initial attempts at hyperbranched polyiptycenes. Mass spectroscopy may also be used to determine the extent and cleanliness of polymerization.

Hyperbranching allows for higher molecular weights with lower overall reaction yields. If all complementary groups are in equal numbers, 90% yields without hyperbranching gives an average degree of polymerization of 10; while hyperbranched monomers, with an average number of functional groups per monomer of 3, would give the same average degree of polymerization at 60% yield. However, imbalance in reactive groups tends to decrease the average molecular weight due to all chains being capped by the same monomer. This effect can be seen in the decreased molecular weight of Entry 6 of TABLE 1 versus Entry 4. However, hyperbranching does cause decreased solubility of the polymer. The maxima for most of the gaussians that describe each molecular weight distribution for Entries 1-7 lie in the 10,000-20,000-g/mol range. These weights correspond to average degrees of polymerization of 14-28 repeating units (based in 616). Ultimately, the fully aromatic polyiptycenes will be prepared by dehydration of 651 the intermediate polymers described above, via acid-catalyzed dehydration methods to yield 652.

EXAMPLE 7

Triptycenes in Liquid Crystalline Displays

Figure 7:
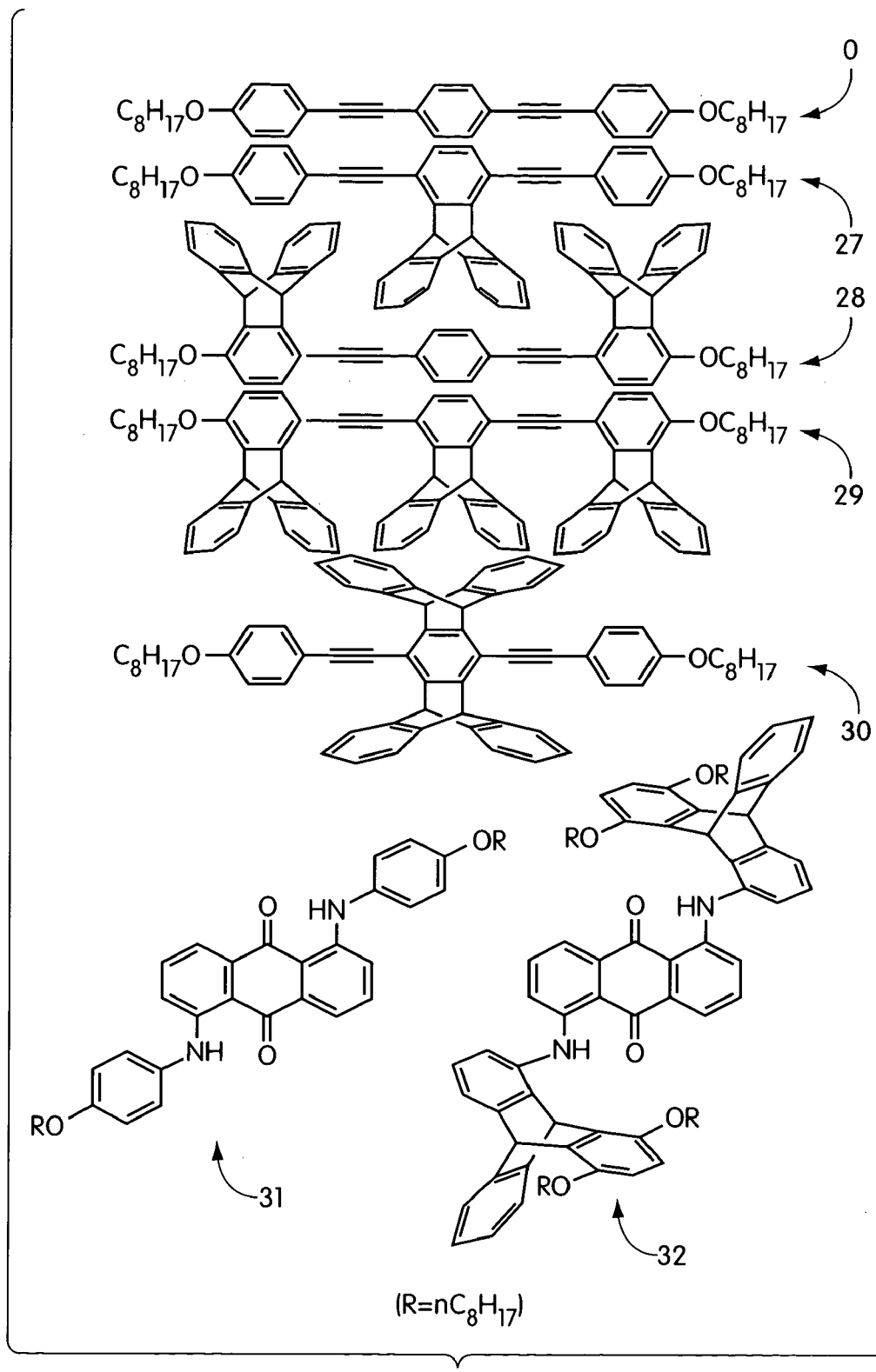
FIG. 7 illustrates structural diagrams of molecules of the invention.

In this example, the extended free-volume guided alignment of triptycene was used to increase the alignment of commonly used dichroic dyes for liquid crystalline displays (LCDs). Dyes 0, 27, 28, 29 and 30, as illustrated in FIG. 7, were synthesized to study the effect of free-volume alignment of triptycenes on the alignment of dyes. These dyes were designed such that multiple triptycenes could be incorporated and the triptycene free-volume is co-incident to the aspect ratio of the dye.

Dyes 0, 27, 28, 29 and 30 were dissolved in a common liquid crystal host (1 wt % in 4-trans-(4-pentylcyclohexyl) benzonitrile) and homogeneously aligned in a rubbed polyimide coated test cell (10 μm thick). Polarized UV-Vis spectra, parallel and perpendicular to the liquid crystal alignment, were recorded and their observed order parameters calculated according to the following equation:

$$S_{ob} = (A_{//} - A_{perp})/(A_{//} + 2A_{perp})$$

Figure 8:
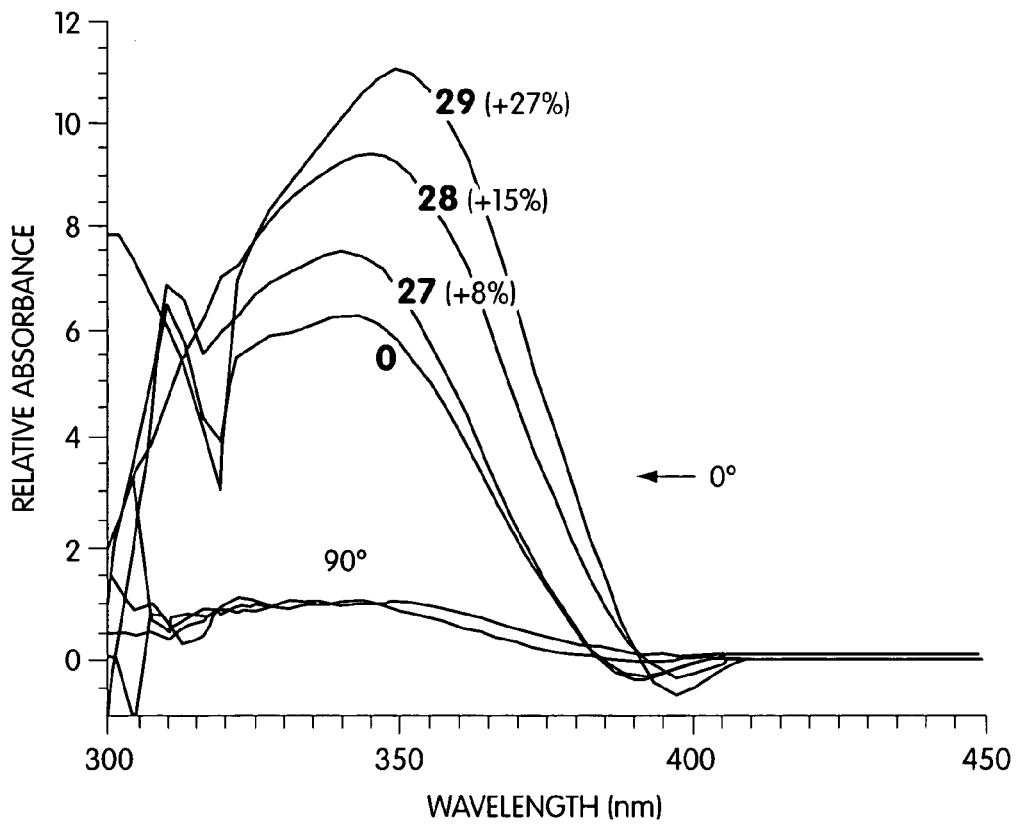
FIG. 8 illustrates UV-visible light spectra of dyes comprising various molecules in conjunction with liquid crystal compositions illustrating increased alignment with increased iptycene content (specifically, molecules illustrated in FIG. 7), in accordance with the invention.

These results are summarized in TABLE 3. The polarized UV-Vis spectra for Dyes 0, 27, 28 and 29 are shown in FIG. 8, with all 90° polarized spectra normalized to illustrate the trend in the data. A step-wise, nearly linear increase in the alignment parameters of each dye was seen in the series from Dyes 0 to 27 to 29. With increasing triptycene incorporation in the dye, alignment increases from 8%, to 15%, and ultimately to 27% with respect to Dye 0.

Dye 30 was designed under the assumption that pentiptycene would give a greater increase in alignment with respect to triptycene, due to its greater free-volume. However, dye 30 did not have increased alignment, but rather decreased with respect to dye 27. This can be attributed to the restricted environment around the central ring of the pentiptycene moiety. Only one liquid crystal molecule can occupy either face of the pentiptycene, where the U-shaped cavity prevents facile rotation, decreasing the local entropy. Triptycenes, on the other hand, allow for more rotational and positional entropy in the nematic liquid crystal. These can sense the director of the liquid crystal and act as a stabilizer-wing to average out the local motions of the host liquid crystal.

To further demonstrate the generality of the effect of the triptycenes on more complex dyes, Dyes 31 and 32 in FIG. 7 were synthesized. Aminoanthraquinone dyes are popular for use in LCDs due to their vivid colors, high extinction coefficients, and longevity. Dyes 31 and 32 were synthesized to determine if triptycenes gave the same alignment enhancement in these dyes, as in the bis(phenylethynyl)benzene cases. The 1,5-diaminoanthraquinone forms have greater flexibility and rotational freedom and their transition dipole slightly off the long axis of the anthraquinone.

Figure 9:
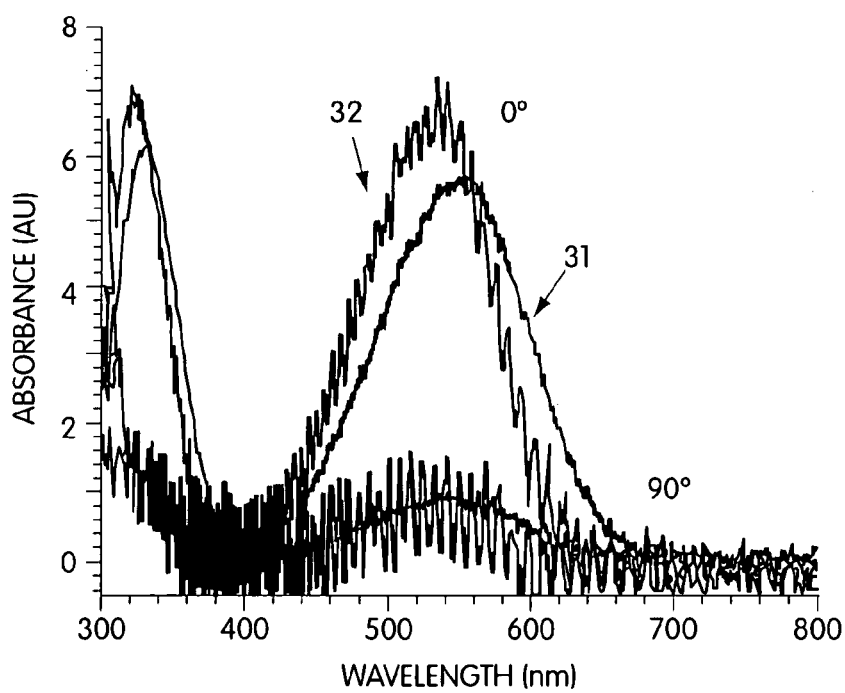
FIG. 9 illustrates UV-visible light spectra of molecules of the invention with dyes also illustrating improved alignment with liquid crystals.

As in the previous case, the triptycenes were attached to the dye backbone such that their free-volume guided alignment was complimentary to the aspect-ratio guided alignment of the dye. This design increased in the order parameter with respect to dye 31 on the order of 9%. The polarized UV-Vis spectra for dyes 31 and 32 are shown in FIG. 9.

EXAMPLE 8

As previously stated, increasing the aspect ratio of a dye may increase the order parameter of dichroic dyes. This is most often achieved by attachment of longer alkyl groups, or extending the size of the chromophore. By extending the dye design into an additional dimension, the size of the molecule is maintained. The overall length of the triptycene-containing dye molecules remains the same while the alignment is increased. This provides dyes with greater solubility without sacrificing alignment. This may be a very powerful tool for designing dichroic dyes with higher alignments for a variety of applications from guest-host reflective LCDs to holographic data storage. The synthesis of dyes 27-29, and 32-38 (dichroic and fluorescent), showing greater alignment, were synthesized and prepared as illustrated in FIGS. 9A, 9B, 9C, and 9D.

It is also possible for the dye itself, wither dichroic or fluorescent to be a liquid crystal. In particular, upon cooling from an isotropic state (I), compound 27 enters a nematic liquid crystalline phase (N) at 148° C. and crystallizes (C) at 123° C.

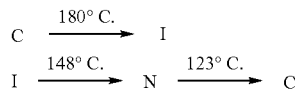

The nematic phase exhibited by 27 may afford the opportunity to make very concentrated solutions of dyes in other nematic liquid crystals used in display or non-linear optical applications since nematic liquid crystals are known to be continuously miscible in varying concentrations in other nematic liquid crystals. It may also be possible to make 27 and/or analogs to display a biaxial optical properties in the nematic phase (biaxial nematic liquid crystal).

EXAMPLE 9

Figure 9A:
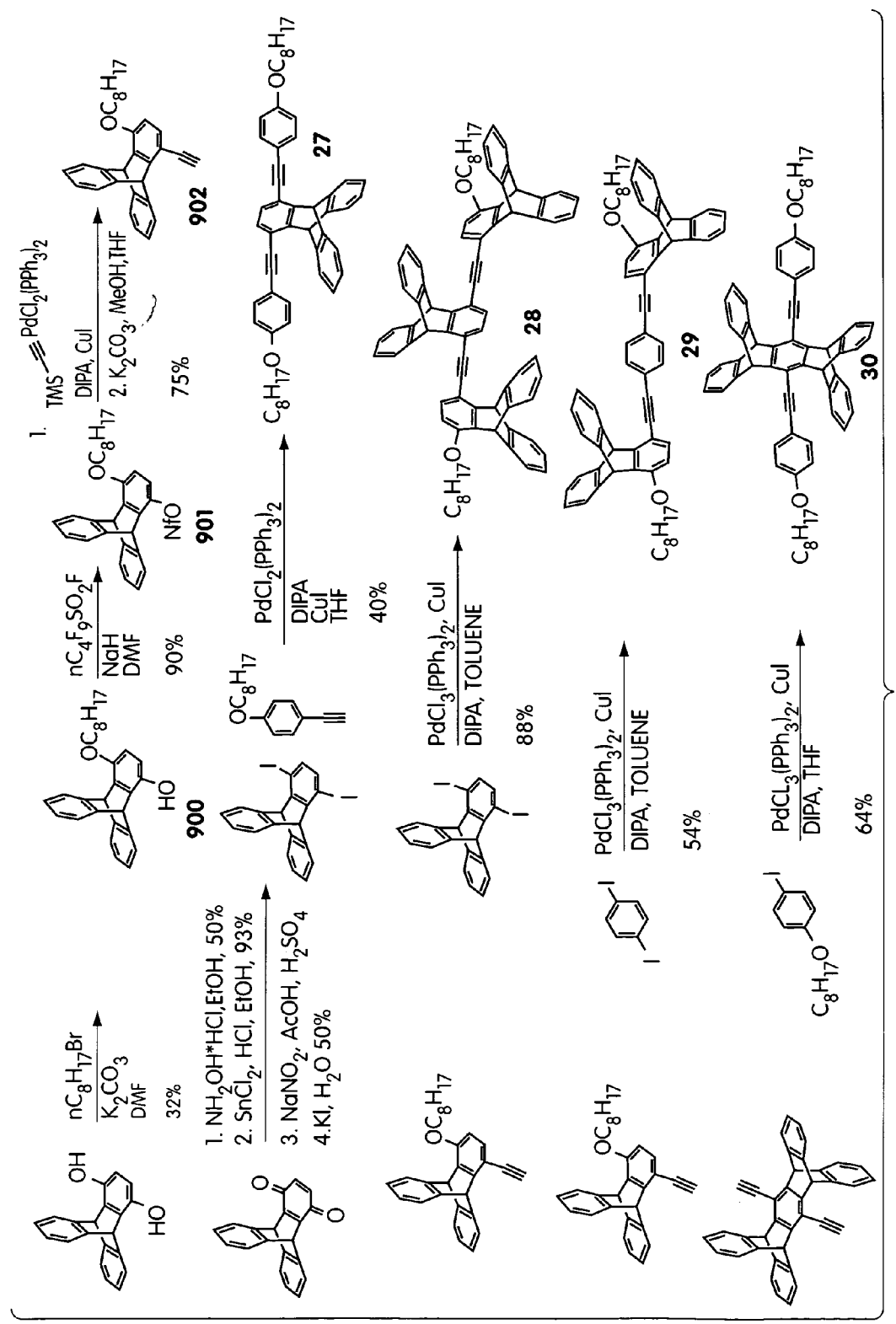
FIG. 9A illustrates a synthetic reaction scheme of one embodiment of the invention.
Figure 9B:
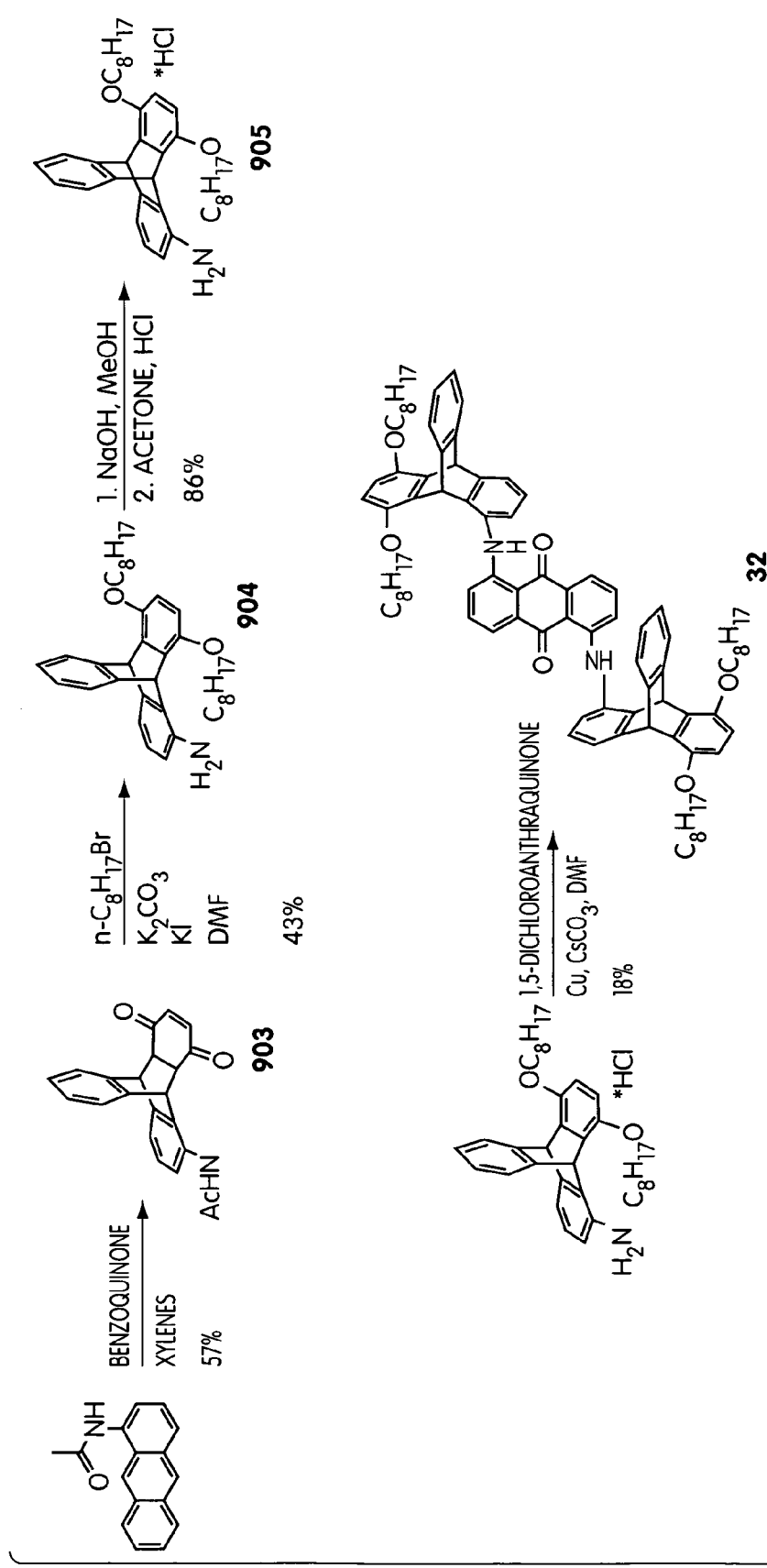
FIG. 9B illustrates a synthetic reaction scheme of another embodiment of the invention.
Figure 9C:
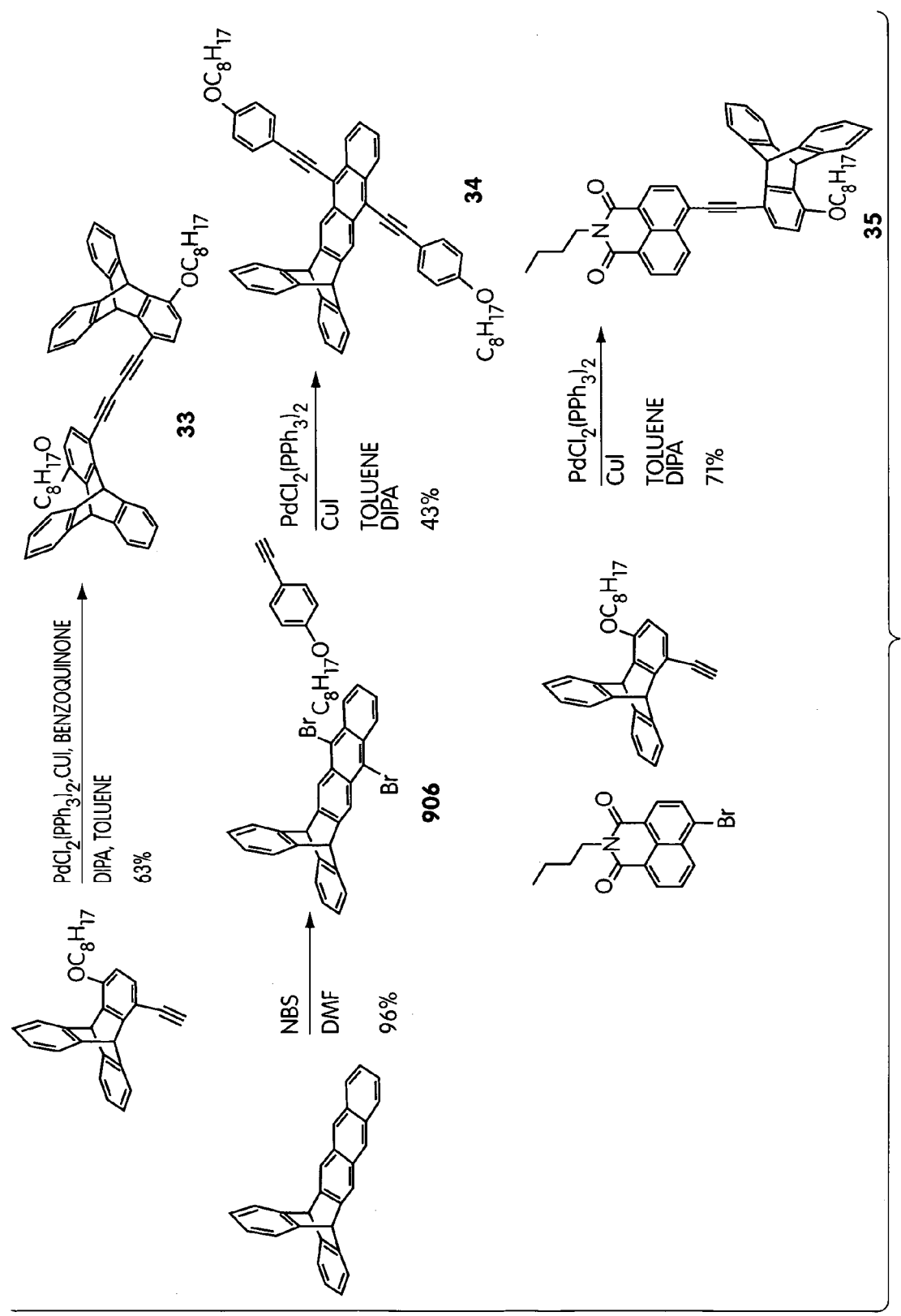
FIG. 9C illustrates a synthetic reaction scheme of another embodiment of the invention.
Figure 9D:
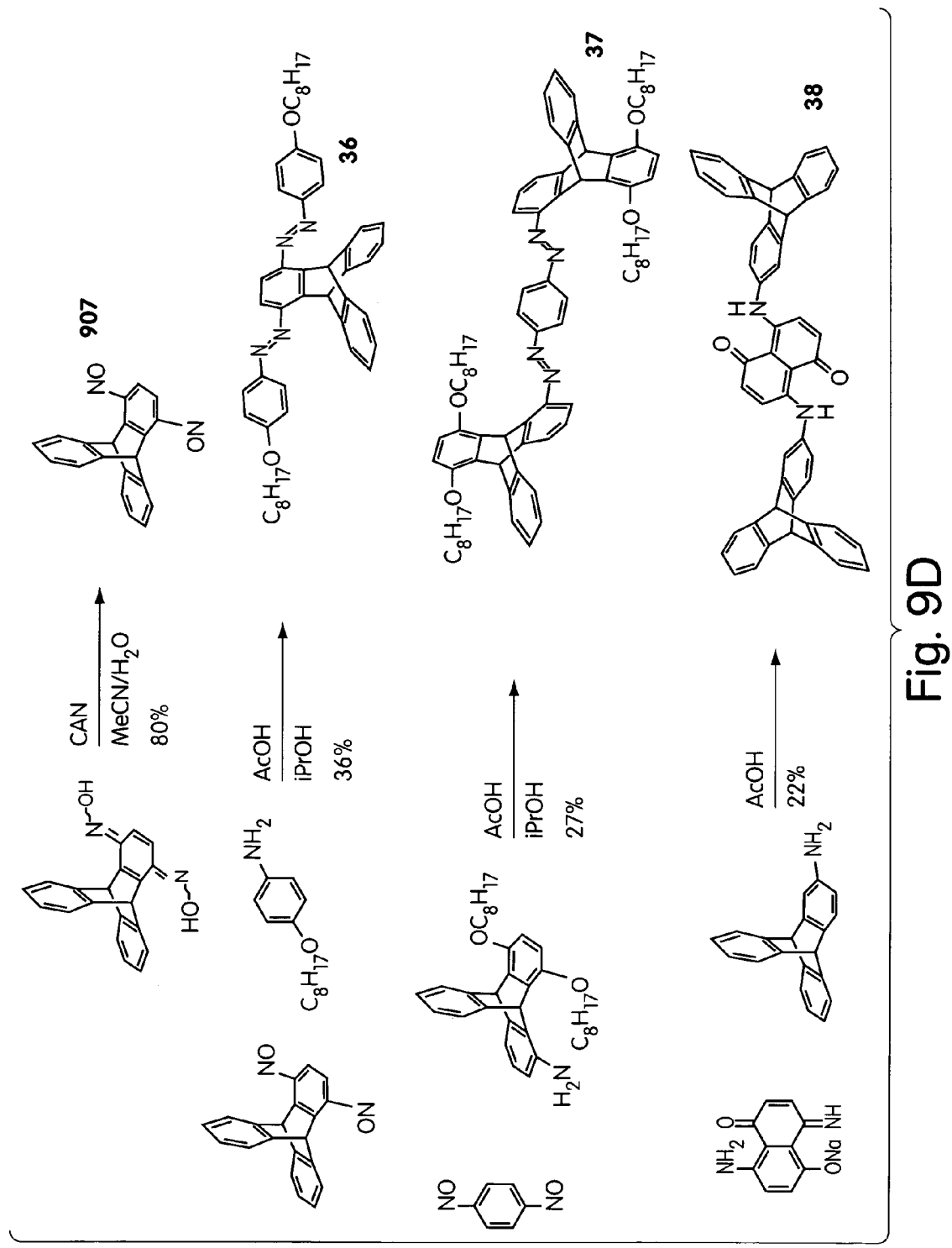
FIG. 9D illustrates a synthetic reaction scheme of another embodiment of the invention.
Figure 9E:
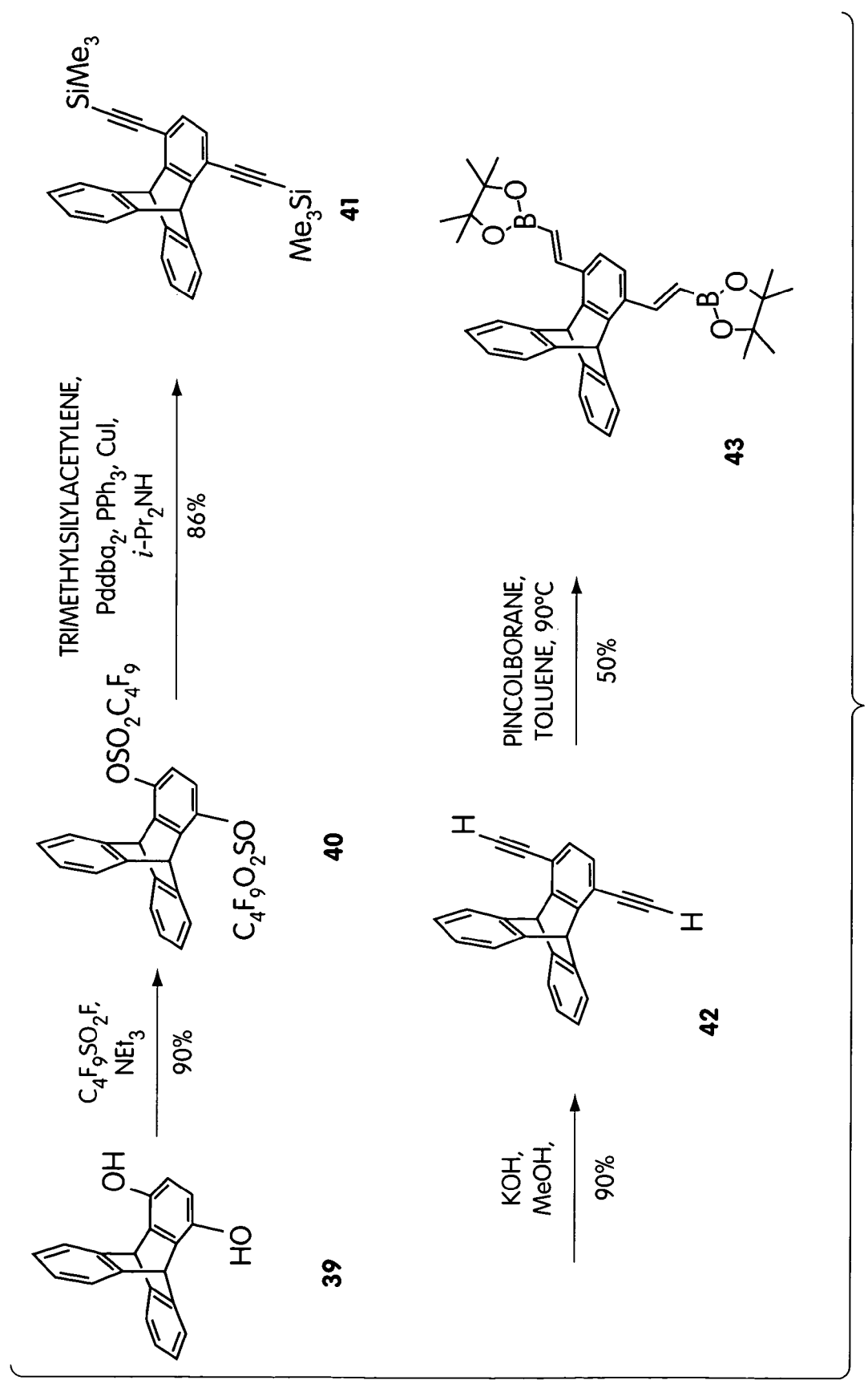
FIG. 9E illustrates a synthetic reaction scheme of another embodiment of the invention.

The synthesis of triptycene bis(vinyl-dioxoborolane) 43 is shown FIG. 9E. 9,10-Dihydro-9,10[1',2']-benzenoanthracene-1,4-diol 39 was prepared from commercially available anthracene and 1,4-benzoquinone following the procedure of Bartlett et al., *Journal of the American Chemical Society*, 64:2649 (1942). Aryl nonafluorobutanesulfonates (nonaflates) are known to react readily with organozinc reagents in the presence of palladium catalysts and have a slightly higher reactivity compared to the corresponding aryl triflates. To activate the hydroxy groups in 39 for cross coupling, the hydroquinone derivative was treated with commercially available $CF_3(CF_2)_3SO_2F$ in the presence of triethylamine at 25° C. The conversion was complete within 12 hours and the product was obtained in high yield (98%). The palladium-catalyzed cross-coupling reaction of bisnonaflate 40 with trimethylsilylethyne in the presence of CuI and triphenylphosphine in diisopropylamine furnished the bis(trimethylsilylethynyl) triptycene 41 in 86% yield. Treatment of triptycene 41 with a solution of KOH in methanol in THF afforded the diethynyltriptycenes 42 in 90% yield. This triptycene with two ethynyl groups at the 1,4 positions could then be used as a monomer for the synthesis of poly(p-phenylene ethynylene)s through coupling with aryldiiodides. Heating compound 42 with 4,4,5,5-tetramethyl-1,3,2-dioxoborolane in dry toluene afforded the bis(pinacolvinylborate) 43, which was purified by chromatography.

Figure 9F:
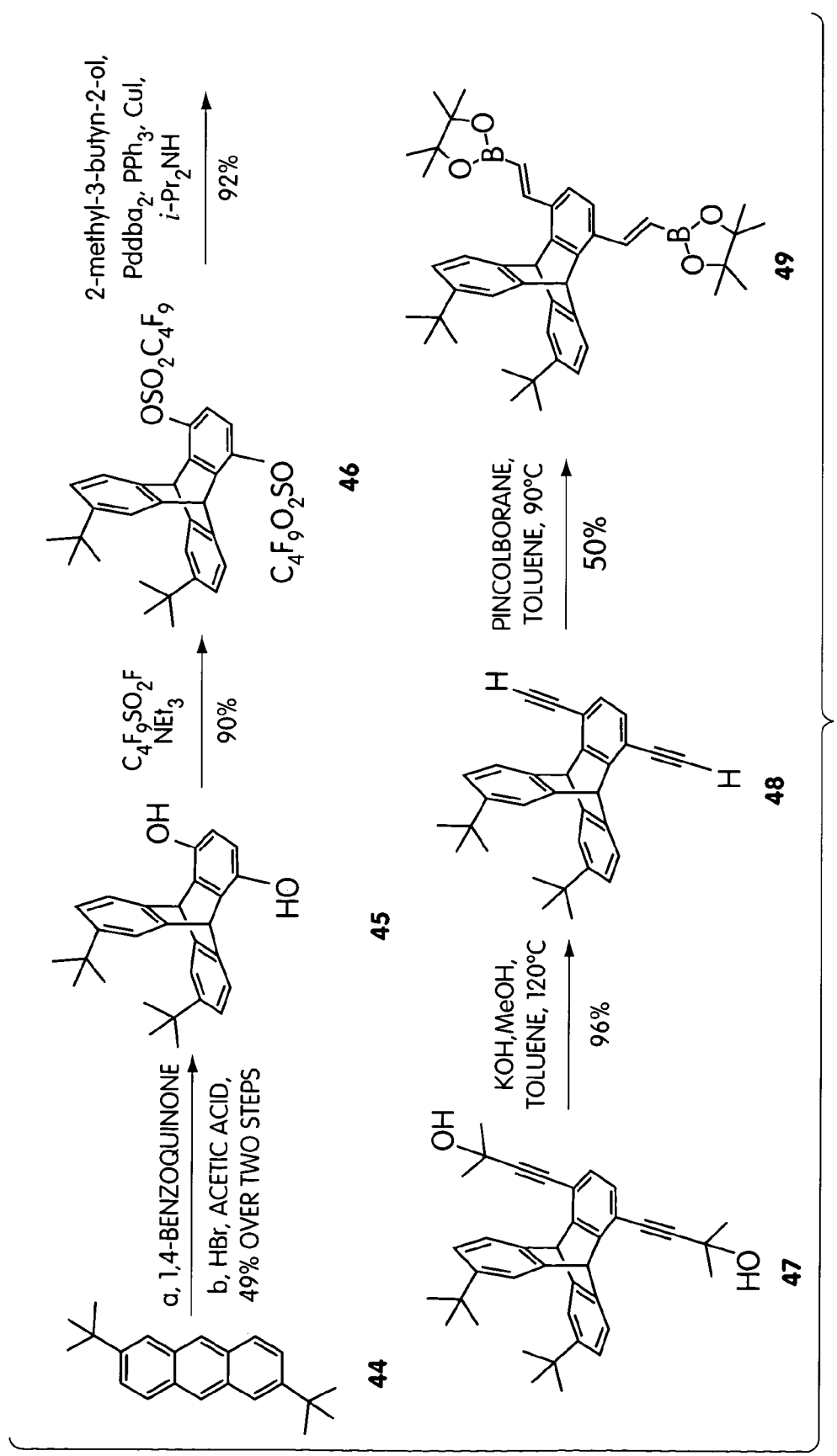
FIG. 9F illustrates a synthetic reaction scheme of another embodiment of the invention.

In a similar manner, triptycene monomers 48 and 49 carrying two tert-butyl groups were prepared, as illustrated in FIG. 9F. The tert-butyl groups in the monomers were expected to further limit the interaction between polymer chains. 2,6-di-tert-butyl-anthracene 44 was prepared from anthracene through a Friedel-Crafts reaction. Diels-Alder reaction of 44 with 1,4-benzoquinone and isomerization of the resulting adduct resulted in triptycene hydroquinone 45. Activation of 45 into the corresponding bisnonaflate 46 followed by a Sonogashira coupling with 3-hydroxy-3-methyl-but-1-yne afforded the bis(3-hydroxy-3-methyl-but-1-ynyl) fuctionalized triptycene 47. Treatment of 47 with KOH in toluene at 120° C. for 1.5 hours furnished the diacetylene 48. Hydroboration of 48 furnished bis(vinyl-dioxaboborolane) 49, which was purified by flash chromatography.

Figure 9G:
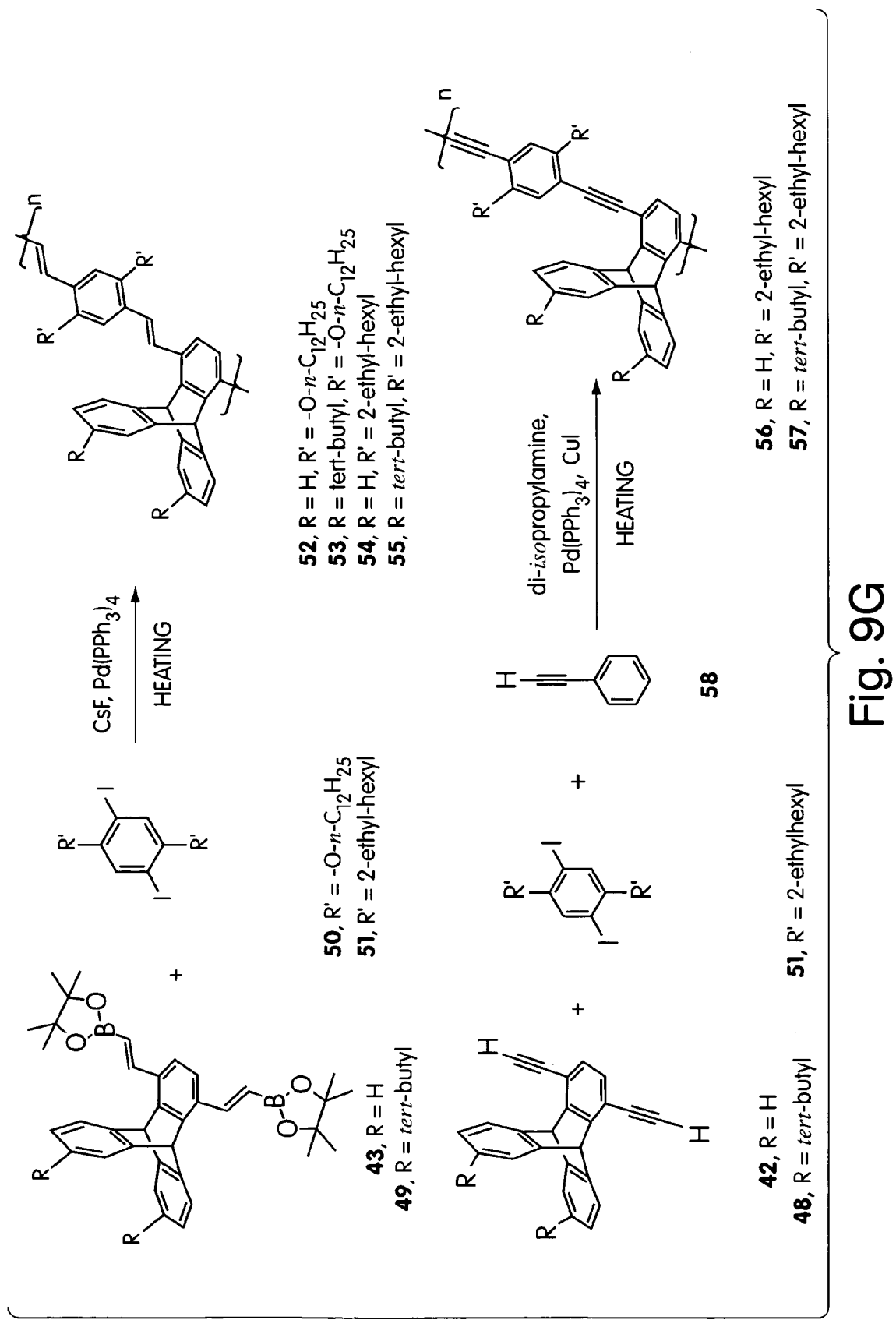
FIG. 9G illustrates a synthetic reaction scheme of another embodiment of the invention.

Two aryldiiodides 50 and 51, prepared following the procedure of Swager et al., *Journal of physical Chemistry*, 99:4886-4893 (1995). Aryldiiodides 50 and 51 were coupled with the bis(vinyldioxaborolane)s. The coupling of the diiodides with 43 and 49 in the presence of a base or fluoride afforded the triptycene incorporating PPVs 52, 53, 54 and 55, as illustrated in FIG. 9G. A variety of conditions were screened to optimize the polymerization by varying the solvent, catalyst, base, and reaction temperature. Best reproducible results were obtained by carrying out the polymerization in dry NMP in presence of CsF and $Pd(PPh_3)_4$. All the resulting PPV's were highly soluble in common organic solvents. Polymer molecular weights were found to be around 12 kDa corresponding to about 15 to 20 repeating units as determined by GPC. Absorption, emission spectra state were recorded in both solution and solid. The absorption and emission spectra alkyl substituted PPVs 54 and 55 were shifted to the blue region relative to the alkoxy substituted polymers 52 and 53. The absorption spectra recorded on thin films were quite similar to those recorded on solutions, indicating negligible interchain interactions in the ground state. Fluorescence spectra of the thin films showed slight red shift relative to those of solution and posses similar shape, indication minimized excimer formation.

Figure 9H:
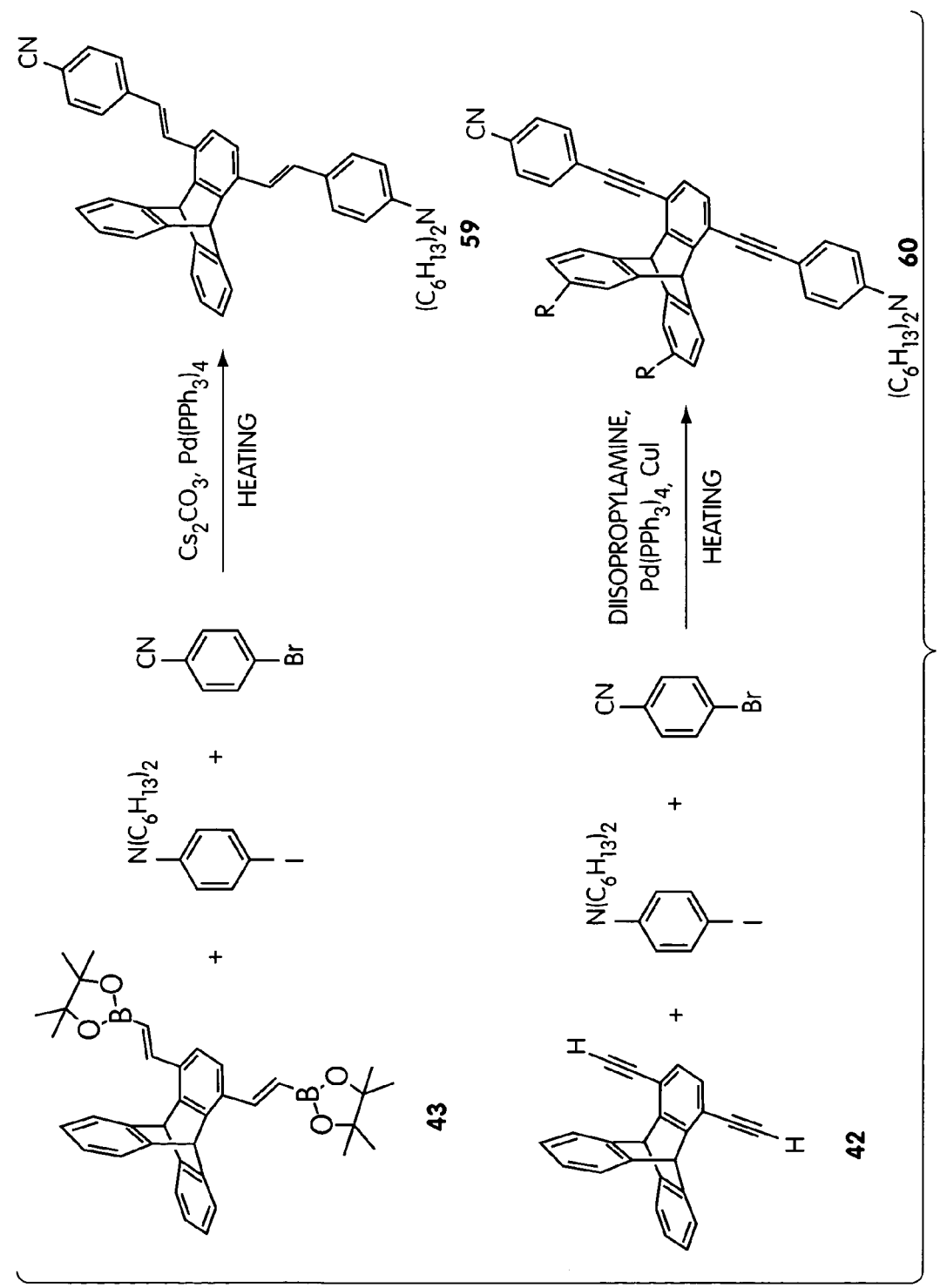
FIG. 9H illustrates a synthetic reaction scheme of another embodiment of the invention.

FIG. 9H shows the synthesis of a tripycene containing oligo(phenylene vinylene) and an oligo(phenylene ethynylene) with donor-acceptor groups on each end. Phenyelene vinylene 59 was obtained by coupling 4-(dihecylamino)-iodobenzene and 4-bromobenzonitrile with bis(vinyldioxaborolane) 43. The phenyelene ethynylene 60 was obtained by coupling 4-(dihecylamino)-iodobenzene and 4-bromobenzomitrile with the diacetylene 42. Both materials are highly soluble in liquid crystals and highly fluorescent with compound 59 fluorescing orange while compound 60 fluoresces green.

EXAMPLE 10

Figure 10:
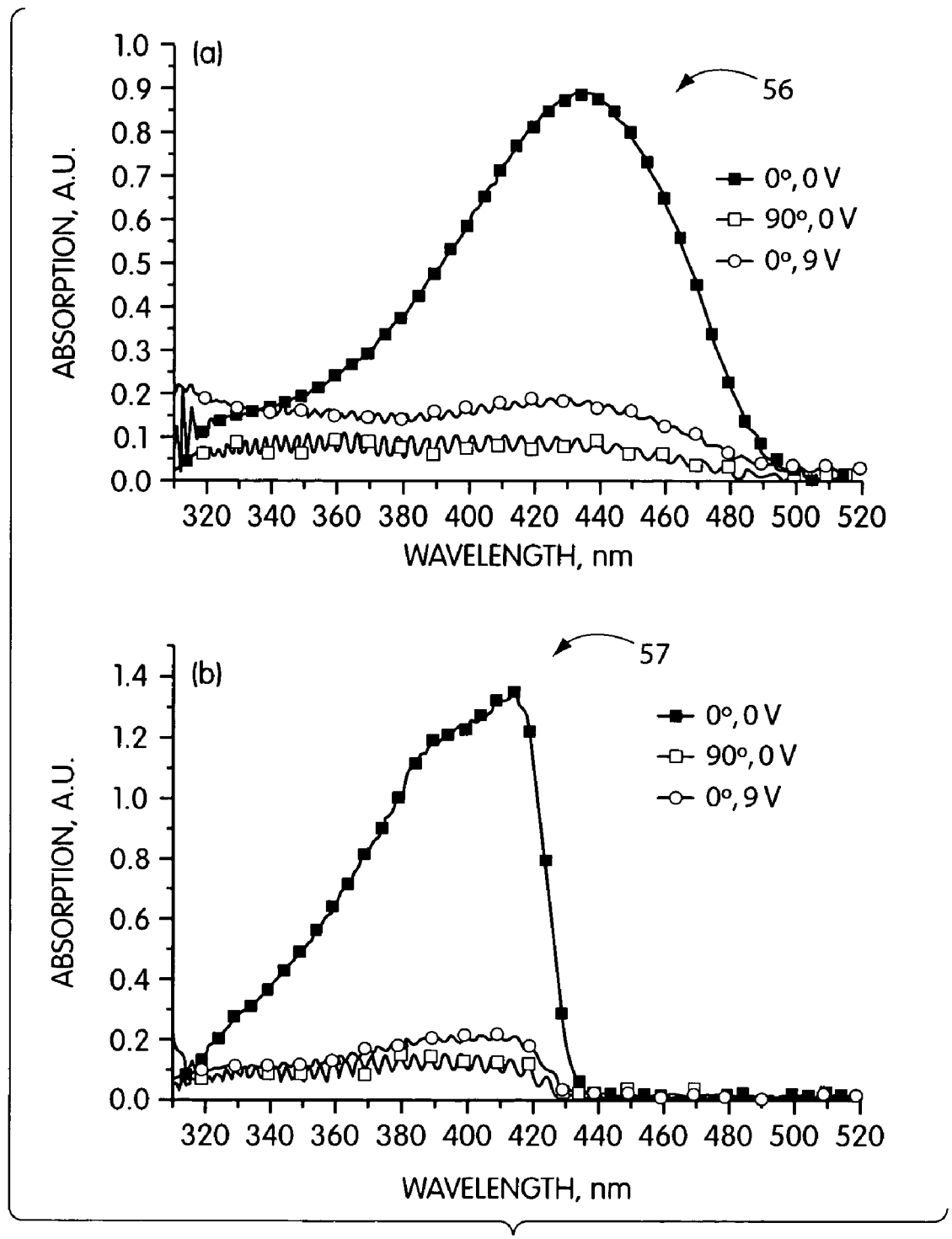
FIG. 10 is a plot of absorption spectra of molecules of the invention illustrating enhanced alignment with liquid crystals through the use of iptycenes.

PPEs 56 and 57 in FIG. 9G with triptycenes in the backbone was synthesized by the coupling reactions of molecules 42 and 48, respectively, with diiodide 51 in a mixture of toluene and diisopropylamine in the presence of $Pd(PPh_3)_4$. Polymers with higher molecular weights ($M_n$=50 kDa) could be obtained. By polymerizing the monomers in the presence of small amount of phenylacetylene 58 (2-10 mol %), lower molecular weight PPE's were also obtained comparable to those of the PPVs. Absorption, emission spectra of the PPEs all shifted to the blue site of the corresponding PPVs and the iptycene polymers with alkoxy substitutions on the main chain. Those PPEs with molecular weights (i. e., $M_n$<25 kDa) could be solubilized in the liquid crystals and could be aligned as determined of absorption spectra through a polarizer. The ordering parameter of the PPEs in the liquid crystals were found to be slightly higher that of the corresponding PPVs. As an example, the absorption spectra of polymer 57 are also shown in FIG. 10. The absorption spectrum in LC was more red-shifted than that of the thin film relative that of the solution. This indicates a more planar polymer conformation as a result of the interaction between the polymers and the liquid crystals. The absorption parallel to the polyimide director decreased as the temperature increased across the transition temperature of the liquid crystal, as a result of loss of directional order.

Figure 11:
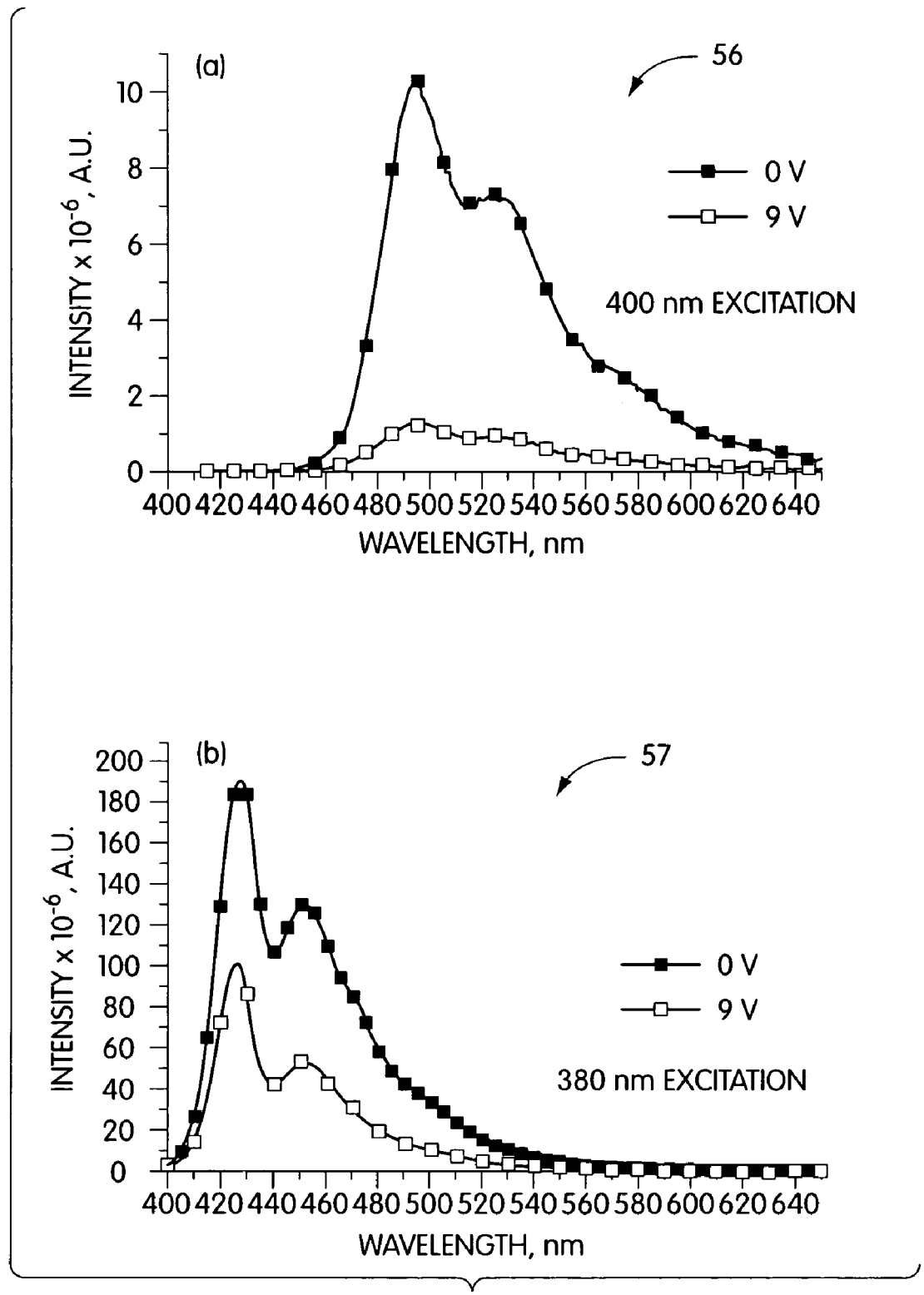
FIG. 11 is a plot of fluorescence spectra of molecules of the invention similarly illustrating enhanced alignment with liquid crystals via the use of shape-persistent, high-free volume molecules.

Fluorescence spectra of a liquid crystal solution of polymer 57 in a LC cell are shown in FIG. 11. The emission in the liquid crystal is slightly red-shifted but the shape of the spectrum is more solution-like indicating no significant excimer formation. The fluorescence could also be switched by the application of electric field.

PPVs with triptycene in the main chain were prepared through a Suzuki-type coupling procedure. These polymers were highly soluble and cover a wide range of absorption and emission spectra. PPEs with triptycene in the main chain and alkyl pending groups were prepared by Sonogashira coupling. PPVs have absorption and emission spectra in the longer-wavelength regions than those of the corresponding PPEs. Alkyl substituted conjugated polymers absorb and emit in the bluer region than the corresponding alkoxy substituted polymers. tert-Butyl groups on the triptycenes increase the solubility of the polymers, have but little effects on the spectroscopic properties. Lower-molecular-weight PPEs and PPVs incorporating triptycenes form homogeneous solutions in liquid crystals and align to high order. This indicates that these polymers are useful materials for the fabrication of anisotropic optical films. The alignment direction of the polymers in liquid crystals can be switched by the application of electric field.

EXAMPLE 11

Synthesis of 9,10-o-benzeno-9,10-dihydro-4-hydroxy-1-octyloxyanthracene 9,10-o-benzeno-9,10-dihydro-4-hydroxy-1-octyloxyanthracene 900 is illustrated in FIG. 9A. 17.3 g (125 mmol) $K_2CO_3$ was added to a solution of triptycene hydroquinone (35.8 g, 125 mmol) in 500 ml DMF under Ar. 25 ml (125 mmol) 1-bromooctane was then added dropwise over 1.5 h. The solution was heated to 50° C. for 24 h. The solution was then cooled to room temperature and quenched by pouring into dilute aqueous $NH_4Cl$. The product was extracted with $Et_2O$. The combined organic layers were washed with dilute aqueous $NH_4Cl$ and saturated aqueous NaCl. The organic layer was then dried over $MgSO_4$ and filtered, and the solvent removed in vacuo to yield a mixture of mono- and dialkylated triptycenes. The solid was added to 1 M NaOH in a 50/50 mixture of EtOH and water. The resulting dark solution was filtered and rinsed on the filter with additional 1 M NaOH to yield a white powder (dialkylated product, 27.7 g, 43%). The filtrate was acidified with 5% HCl to precipitate the monoalkylated product as a tan powder. The powder was filtered and dried to yield 25.4 g (51%) of compound 900.

EXAMPLE 12

Synthesis of 9,10-o-benzeno-9,10-dihydro-4-nofylyl-1-octyloxyanthracene 9,10-o-benzeno-9,10-dihydro-4-nofylyl-1-octyloxyanthracene 901 is illustrated in FIG. 9A. In a flame-dried Schlenk was added 125 mg (mmol) NaH under a $N_2$ atmosphere in a dry box and sealed with a septa. The flask was removed, placed on a vacuum line, 10 ml DMF added, and cooled to −10° C. on a MeOH/ice mixture. Then, 1.20 g (3 mmol) of compound 900 was added under positive Ar pressure and stirred at −10° C. for 1 hour. Cooling was then removed and the solution was allowed to warm to room temperature over 30 minutes. The solution was cooled back to −10° C. and 0.625 ml (1.05 g, 3.45 mmol) n-perfluorobutane-sulfonyl fluoride was added dropwise. The solution was stirred at −10° C. for 1 hour, then allowed to stir at room temperature for 2.5 hours. The solution was quenched by pouring into saturated aqueous $NH_4Cl$. The product was extracted with $Et_2O$ and the organic layers combined. The organic layer was washed with saturated aqueous $NH_4Cl$, water, and saturated aqueous NaCl. After drying over $MgSO_4$ and filtering, the solvent was removed in vacuo to yield a tan-orange oily solid. The solid was titrated with 95% MeOH to yield a tan solid which was filtered and dried to yield 1.75 g (86%) of compound 901.

EXAMPLE 13

Synthesis of 9,10-o-benzeno-4-ethynyl-9,10-dihydro-1-octyloxyanthracene 9,10-o-benzeno-4-ethynyl-9,10-dihydro-1-octyloxyanthracene 902 is illustrated in FIG. 9A. 680 mg of compound 901 (1 mmol), 70 mg $PdCl_2(PPh_3)_2$ (0.1 mmol), and 40 mg CuI (0.2 mmol) were placed into a Schlenk tube. The tube was backfilled with Ar. 5 ml diisopropylamine followed by 0.3 ml trimethylsilylacetylene was then added to the tube. The tube was sealed with a Teflon stopper and heated to 90° C. for 20 hours. After cooling, the solution was filtered through a plug of silica gel twice, the first time with $CHCl_3$. The first filtrate was condensed in vacuo, dissolved in hexanes and flushed through a plug of silica a second time with 4:1 hexanes:$CHCl_3$. Removal of the solvent in vacuo yielded an orange oil which was used without further purification.

The orange oil was dissolved in 8 ml THF. 8 ml MeOH is added and the solution purged with Ar for 30 minutes. Next, 555 mg $K_2CO_3$ was added and the solution stirred at room temperature for 3 hours. The solution was quenched by pouring it into water and extracting with $Et_2O$. The combined organic extracts were washed with saturated aqueous $NH_4Cl$, water, and saturated aqueous NaCl. After drying over $MgSO_4$, the solution was filtered and condensed in vacuo to yield an orange oil. Purification of compound 902 was by gradient column chromatography from 6:1 to 3:1 hexanes:$CHCl_3$ to yield 342 mg (81%) of a pale yellow oil which solidifies upon drying under vacuum.

EXAMPLE 14

Synthesis of 1,4-bis(4'-octyloxyphenylethynyl)-9,10-o-benzeno-9,10-dihydroanthracene 1,4-bis(4'-octyloxyphenylethynyl)-9,10-o-benzeno-9,10-dihydroanthracene 27 is illustrated in FIG. 9A. In a Schlenk tube was placed 1.012 g 1,4-diiodotriptycene and 1.072 g 1-ethynyl-4-octyloxybenzene. The tube was purged with Ar. Then, 20 ml toluene and 10 ml diisopropylamine were added and the solution purged for 30 minutes, after which 60 mg $PdCl_2(PPh_3)_2$ and 30 mg CuI were added. The solution became dark in color. The solution was sealed and stirred at room temperature for 48 hours. The reaction was then filtered through a plug of silica gel to remove the catalyst and the

EXAMPLE 15

Synthesis of 1,4-bis(9',10'-o-benzeno-4'-ethynyl-9', 10'dihydro-1'-octyloxyanthracenyl)benzene 1,4-bis(9',10'-o-benzeno-4'-ethynyl-9',10'dihydro-1'-octyloxyanthracenyl)benzene 28 is illustrated in FIG. 9A. In a Schlenk tube were placed 1,4-diiodobenzene (41 mg, 0.125 mmol), Compound 902 (101 mg, 0.25 mmol), $PdCl_2(PPh_3)_2$ (5 mg), and CuI (2 mg). The tube was placed under Ar. To the tube was added 1 ml DIPA and 2 ml toluene. The tube was sealed and the mixture stirred at room temperature for 15 hours. The solution was filtered through a plug of silica gel to remove the catalysts, and the plug was washed with chloroform. Removal of solvent in vacuo yielded a yellow solid. The solid was dissolved in a minimal volume of dichloromethane. Compound 28 (60 mg, 54%) was then precipitated by addition of MeOH. Analytically pure compound 28 as a white powder was obtained by recrystallization from dichloromethane.

EXAMPLE 16

Synthesis of 1,4-bis(9',10'-o-benzeno-4'-ethynyl-9', 10'dihydro-1'-octyloxyanthracenyl)-9,10-o-benzeno-9,10-dihydroanthracene 1,4-bis(9',10'-o-benzeno-4'-ethynyl-9',10'dihydro-1'-octyloxyanthracenyl)-9,10-o-benzeno-9,10-dihydroanthracene 29 is illustrated in FIG. 9A. In a Schlenk tube were placed 1,4-diiodotriptycene (50 mg, 0.1 mmol), compound 633 (84 mg, 0.2 mmol), $PdCl_2(PPh_3)_2$ (4 mg), and CuI (2 mg). The tube was placed under Ar. To the tube was added 1 ml DIPA and 1.5 ml toluene. The tube was sealed and the mixture stirred at room temperature for 17 hours. The solution was filtered through a plug of silica gel to remove the catalysts, and the plug was washed with chloroform. Removal of solvent in vacuo yielded a yellow solid. The solid was dissolved in a minimal volume dichloromethane. Compound 29 (93 mg, 88%) was then precipitated by addition of MeOH. Analytically pure compound 29 as a white powder was obtained by recrystallization from benzene.

EXAMPLE 17

5,7,12,14-bis(o-benzeno)-5,7,12,14-tetrahydro-6,13-bis (4'-octyloxyphenylethynyl)pentacene 5,7,12,14-bis(o-benzeno)-5,7,12,14-tetrahydro-6,13-bis (4'-octyloxyphenylethynyl)pentacene 30 is illustrated in FIG. 9A. To a solution of 4-octyloxyiodobenzene (365 mg, 1.1 mmol), $PdCl_2(PPh_3)_2$ (20 mg), and CuI (10 mg) in 5 ml THF under Ar, 6,13-bis(ethynyl)pentiptycene (239 mg, 0.5 mmol) was added. DIPA (1 ml) was then added and the solution heated to 50° C. for 5 hours. After cooling, the reaction product was filtered through a plug of silica gel to remove the catalyst, and the plug was washed with chloroform. After removing the solvent in vacuo, the resulting solid was recrystallized from THF/MeOH to yield compound 30 (285 mg, 64%) as a white powder.

silica was washed with dichloromethane. Removal of the solvent in vacuo yielded a dark solid. Purification was by gradient column chromatography on silica gel with 3:1 to 2:1 to 3:2 hexanes:chloroform. Removal of the solvent in vacuo yielded a pale yellow solid which was recrystallized from hexanes to yield 760 mg (54%) of compound 27 as white needles.

EXAMPLE 18

Synthesis of Compound 903

Compound 903 is illustrated in FIG. 9B. p-benzoquinone (5.875 g, 25 mmol) and 1-acetamidoanthracene (3.25 g, 30 mmol) were suspended in 125 ml xylenes and heated to reflux for 20 hours. After cooling, the precipitated solid was collected by filtration. This solid was recrystallized from xylenes and dried under vacuum to yield compound 903 (4.87 g, 57%) as a tan solid.

EXAMPLE 19

Synthesis of Compound 904

Compound 904 is illustrated in FIG. 9B. In a Schlenk tube were placed compound 903 (3.43 g, 10 mmol), 1-bromooctane (7.0 ml, 40 mmol), and KI (1.33 g, 8 mmol). 40 ml DMF was then added and the tube purged with Ar. $K_2CO_3$ (5.5 g, 40 mmol) was then added to the tube. The tube was sealed and heated to 80° C. for 2 days. After cooling, the solution was quenched by pouring it into dilute aqueous $NH_4Cl$, and the solution extracted with $Et_2O$. The combined organic extracts were washed with dilute aqueous $NH_4Cl$, $H_2O$, and saturated aqueous NaCl. The layer was dried over $MgSO_4$ and filtered, and the solvent removed in vacuo to yield a brown solid. The solid was the recrystallized from MeOH to yield compound 904 (2.40 g, 43%).

EXAMPLE 20

Synthesis of Compound 905

Compound 905 is illustrated in FIG. 9B. Compound 904 (2.13 g) and NaOH (7.5 g) were suspended in MeOH (40 ml) and heated to reflux. The reaction monitored by TLC (EtOAc: hexanes 1:1) until compound 905 was consumed. The reaction was cooled, poured into water, and extracted with $Et_2O$. The combined organic extracts were washed with water and saturated aqueous NaCl. The layer was dried over $MgSO_4$ and filtered, and the solvent removed in vacuo to yield a pale tan solid. The solid was then dissolved in acetone and acidified to pH 1 with 5% aqueous HCl to precipitate compound 905 (1.89 g, 90%) as an off-white solid, which filtered and dried in vacuo.

EXAMPLE 21

Synthesis of Compound 32

Compound 32 is illustrated in FIG. 9B. Compound 905 (568 mg, 1 mmol), $Cs_2CO_3$ (285 mg, 3.5 mmol), Cu (2 mg), and 1,5-dichloroanthraquinone (70 mg, 0.25 mmol) were combined in 1 ml DMF and heated to reflux for 24 hours. After cooling, the solution was quenched by pouring it into dilute aqueous $NH_4Cl$, and the solution extracted with $Et_2O$. The combined organic extracts were washed with dilute aqueous $NH_4Cl$, $H_2O$, and saturated aqueous NaCl. The layer was dried over $MgSO_4$ and filtered, and the solvent removed in vacuo, yielding a red solid. Purification was by column chromatography on silica gel with dichloromethane, removing the first bright red spot. Removal of the solvent in vacuo yielded a deep red solid. The solid was dissolved in a minimum volume THF and compound 32 (56 mg, 18%) was precipitated by addition of MeOH.

EXAMPLE 22

Synthesis of Compound 33

Compound 33 is illustrated in FIG. 9C. In a Schlenk tube under Ar were combined compound 902 (210 mg, 0.5 mmol), p-benzoquinone (48 mg, 0.45 mmol), CuI (20 mg, 0.01 mmol), $PdCl_2(PPh_3)_2$ (2 mg, 0.002 mmol), toluene (2.5 ml), and DIPA (0.1 ml), adding DIPA last. The solution was stirred at room temperature for 8 hours, and the reaction quenched by the addition of MeOH. The solution was then filtered through a plug of silica gel, and the plug washed with chloroform. After removal of the solvent in vacuo, purification was by column chromatography on silica gel with 2:1 hexanes:dichloromethane. Removal of the solvent then yielded compound 33 (131 mg, 63%) as a white solid. Analytically pure compound was obtained by recrystallization from benzene.

EXAMPLE 23

Synthesis of Compound 906

Compound 906 is illustrated in FIG. 9C. Into a flame-dried Schlenk tube was placed 5,14-(o-benzeno)pentacene (71 mg, 0.2 mmol), dissolved in 1 ml DMF. To this was added NBS (71 mg, 0.4 mmol) and the solution stirred at room temperature for 2 hours. The tube was wrapped with foil to exclude light. The reaction was then quenched by pouring into water to precipitate compound 906 (98 mg, 96%), which was isolated by filtration and dried in vacuo.

EXAMPLE 24

Synthesis of Compound 34

Compound 34 is illustrated in FIG. 9C. In a Schlenk tube under Ar was placed compound 906 (51 mg, 0.1 mmol) and 1-ethynyl-4-octyloxybenzene (58 mg, 0.2 mmol). Then, 1 ml toluene and 0.5 ml diisopropylamine were added, followed by 7 mg $PdCl_2(PPh_3)_2$ and 2 mg CuI. The solution was sealed and stirred at room temperature for 20 hours. The solution was then poured into water and extracted with dichloromethane. The combined organic extracts were washed with water, dilute aqueous $NH_4Cl$, and saturated aqueous NaCl. After drying over $MgSO_4$ and filtration, removal of the solvent in vacuo yielded a dark solid. Purification of the solid was by flushing through a plug of silica gel with chloroform. Removal of the solvent in vacuo yielded a solid, which was then dissolved in a minimal volume of chloroform. Compound 34 (35 mg, 43%) was then precipitated by the addition of MeOH, yielding an orange powder.

EXAMPLE 25

Synthesis of Compound 35

Compound 35 is illustrated in FIG. 9C. In a Schlenk tube under Ar were placed compound 902 (81 mg, 0.2 mmol) and 4-bromo-N-butyl-1,8-naphthylimide (66 mg, 0.2 mmol). 1.5 ml toluene and 0.5 ml diisopropylamine were then added, followed by 14 mg $PdCl_2(PPh_3)_2$ and 4 mg CuI. The solution was sealed and stirred at room temperature for 20 hours. The solution was poured into water and extracted with $Et_2O$. The combined organic extracts were washed with water, dilute aqueous $NH_4Cl$, and saturated aqueous NaCl. After drying over $MgSO_4$ and filtration, removal of the solvent in vacuo yielded a yellow-orange solid, which was purified by flushing it through a plug of silica gel with dichloromethane. Removal of the solvent in vacuo yielded a solid that was titrated with hexanes to give compound 35 (93 mg, 71%) as a yellow powder.

EXAMPLE 26

Synthesis of 1,4-dinitrosotriptycene 1,4-dinitrosotriptycene 907 is illustrated in FIG. 9D. To a solution of 1,4-triptycene dioxime (770 mg, 2.5 mmol) in 100 ml MeCN was dropwise added a solution of ceric ammonium nitrate (2.74 g, 5 mmol) in 10 ml water. The solution was stirred at room temperature. Within one minute a precipitate began to form. After 30 minutes, water was added. Compound 907 (610 mg, 80%) was then isolated by filtration as a bright yellow solid, and dried in vacuo.

EXAMPLE 27

Synthesis of Compound 36

Compound 36 is illustrated in FIG. 9D. To a solution of 4-octyloxyaniline (500 mg) in iPrOH (5 ml) and AcOH (1 ml) was added 1,4-dinitrosotriptycene (310 mg). The solution was heated to reflux for 20 hours. The solution was poured into water and extracted with chloroform. The combined organic extracts were washed with water and saturated aqueous NaCl. After drying over $MgSO_4$ and filtration, removal of the solvent in vacuo yielded an orange solid, which was purified by flushing through a plug of silica gel with dichloromethane. After the removal of solvent in vacuo, analytically pure compound 36 was obtained by recrystallization two times from EtOAc (254 mg, 35%).

EXAMPLE 28

Synthesis of Compound 37

Compound 37 is illustrated in FIG. 9D. To a solution of compound 905 (free-based by shaking EtOAc solution with an aqueous $NaHCO_3$ solution) (580 mg, 1.1 mmol) in iPrOH (5 ml) and AcOH (1.25 ml) was added 1,4-dinitrosobenzene (70 mg, 0.5 mmol). The solution was heated to reflux for 20 hours. The solution was then poured into water and extracted with chloroform. The combined organic extracts were washed with water and saturated aqueous NaCl. After drying over $MgSO_4$ and filtration, removal of the solvent in vacuo yielded an orange solid which adsorbed onto silica gel. Column chromatography on silica gel with 3:2 hexanes:dichloromethane yielded compound 37 as the first major spot eluted. After the removal of solvent in vacuo, analytically pure compound 37 was obtained by recrystallization from EtOAc (156 mg, 27%).

EXAMPLE 29

Synthesis of Compound 38

Compound 38 is illustrated in FIG. 9D. A solution of naphthazarin intermediate (52.5 mg, 0.5 mmol) and 2-aminotriptycene (0.6 mmol) in AcOH (2 ml) was heated to reflux for 6 hours. The solution was then cooled and quenched in 5% aqueous HCl. Next, the product was extracted with chloroform. The combined organic extracts were washed with water and saturated aqueous NaCl. After drying over $MgSO_4$ and filtration, removal of the solvent in vacuo yielded a blue-green solid. Column chromatography on silica gel with 5:1 dichloromethane:EtOAc yielded compound 38 (37 mg, 22%) as the first major spot eluted.

EXAMPLE 30

Synthesis of 1,4-nonafluorobutanesulfonoxy-9,10-dihydro-9,10-[1',2']benzenoanthracene 1,4-nonafluorobutanesulfonoxy-9,10-dihydro-9,10-[1',2'] benzenoanthracene 40 is illustrated in FIG. 9E. 9,10-Dihydro-9,10[1',2']-benzenoanthracene-1,4-diol 39 (21.0 g, 0.0733 mol) was dissolved in dichloromethane (500 ml) and triethylamine (50 ml). To this solution was added perfluobutanesulfonyl fluoride (52.0 g, 0.172 mol). The reaction was stirred at room temperature for 20 h, and silica gel (50 g) was added in small portions. The reaction was stirred at room temperature for 20 min and filtered through a short plug of silica gel column, which was rinsed with dichloromethane. The solvent was removed in vacuo, and the residue was dissolved in dichloromethane. Methanol was then added, and white crystals were collected by filtration to give compound 40.

EXAMPLE 31

Synthesis of 1,4-bis(trimethysilylethynyl)-9,10-dihydro-9,10-[1',2']benzenoanthracene 1,4-bis(trimethysilylethynyl)-9,10-dihydro-9,10-[1',2'] benzenoanthracene 41 is illustrated in FIG. 9E. 1,4-nonafluorobutanesulfonoxy-9,10-dihydro-9,10-[1',2']benzenoanthracene 40 (9.0 g, 10.58 mmol) was suspended in diisopropyamine (60 ml). The flask was degassed and backfilled with argon. To the flask was added palladium bisdibenzylideneacetone (122 mg), triphenylphosphine (245 mg, 0.93 mol) and copper iodide (41 mg, 0.22 mol), and the reaction was further degassed and twice backfilled with argon. Under a flow of argon, trimethylsilylethyne (6.9 ml) was added and the flask was sealed and heated to 90° C. for 44 h. Solvent was removed in vacuo and the crude product was purified by flash chromatography eluting with 6% dichloromethane in hexanes to give product 41 (4.07 g, 86%).

EXAMPLE 32

Synthesis of 1,4-diethynyl-9,10-dihydro-9,10-[1',2'] benzeno-anthracene 1,4-diethynyl-9,10-dihydro-9,10-[1',2']benzeno-anthracene 42 is illustrated in FIG. 9E. 1,4-bis(trimethysilylethynyl)-9,10-dihydro-9,10-[1',2']benzenoanthracene 41 (4.88 g, 10.92 mmol) was dissolved in THF (50 ml). A solution of KOH (2.8 g, 42.5 mmol) in methanol (10 ml) was added. The reaction was stirred at room temperature for 30 min and the solvent was removed in vacuo. The residue was purified by flash chromatography to give product 42 (3.26 g, 99%).

EXAMPLE 33

Synthesis of 1,4-bis(4,4,5,5-tetramethyl-1,3,2-dioxoborolan-2-yl-ethenyl)-9,10-dihydro-9,10-[1',2']benzeno-anthracene 1,4-bis(4,4,5,5-tetramethyl-1,3,2-dioxoborolan-2-yl-ethenyl)-9,10-dihydro-9,10-[1',2']benzeno-anthracene 43 is illustrated in FIG. 9E. 1,4-diethynyl-9,10-dihydro-9,10-[1',2'] benzeno-anthracene 42 (410 mg, 1.36 mmol) and 4,4,5,5-tetramethyl-1,3,2-dioxoborolane (0.60 ml, 0.53 g, 4.14 mmol) was dissolved in dry toluene (1 ml). The reaction was heated to 90° C. for 20 h and the solvent was removed in vacuo. Flash chromatography eluting with dichloromethane gave product 43 (400.2 mg, 53%).

EXAMPLE 34

Synthesis of 6,14-di-tert-butyl-9,10-dihydro-9,10[1',2']benzenoanthracene-1,4-diol 6,14-di-tert-butyl-9,10-dihydro-9,10[1',2']benzenoanthracene-1,4-diol 45 is illustrated in FIG. 9F. 2,6-di-tert-butyl-anthracene (19.0 g, 0.0654 mol) and 1,4-benzoquinone (7.78 g, 0.072 mol) in xylenes (150 ml) was heated to reflux for 2 h. Solvent was removed in vacuo and the crude product was purified by flash chromatography (2:3, hexane:dichloromethane) to give benzenoanthracene-1,4-dione, which was dissolved in acetic acid (150 ml) and heated to reflux and a drop of aqueous HBr (48%). After 10 min, the reaction was cooled and water was added. Precipitates were collected and dried to give compound 45 as an off-white solid (12.73 g, 0.0319 mol, 49%).

EXAMPLE 35

Synthesis of 6,14-di-tert-butyl-1,4-nonafluorobutanesulfonoxy-[1',2']benzenoanthracene 6,14-di-tert-butyl-1,4-nonafluorobutanesulfonoxy-[1',2'] benzenoanthracene 46 is illustrated in FIG. 9F. 6,14-di-tert-butyl-9,10-dihydro-9,10[1',2']benzenoanthracene-1,4-diol 45 (4.52 g, 0.0113 mol) was dissolved in dichloromethane (50 ml) and triethylamine (10 ml). To this solution was added perfluo-1-butanesulfonyl fluoride (7.0 g, 0.0232 mol). The reaction was stirred at room temperature for 20 hours, and silica gel (3 g) was added. The reaction was stirred at room temperature for 20 minutes and filtered through a short silica gel column, eluted with dichloromethane. The solvent was removed in vacuo and the residue was purified by flash chromatography to afford compound 46 (9.85 g, 90%).

EXAMPLE 36

Synthesis of 6,14-di-tert-butyl-1,4-bis(3-hydroxy-3-methyl-but-1-ynyl)-[1',2']benzenoanthracene 6,14-di-tert-butyl-1,4-bis(3-hydroxy-3-methyl-but-1-ynyl)-[1',2']benzenoanthracene 47 is illustrated in FIG. 9F. 6,14-di-tert-butyl-1,4-nonafluorobutanesulfonoxy-[1',2'] benzenoanthracene 46 (6.0 g, 6.24 mmol) was suspended in diisopropylamine (30 ml). The flask was degassed and backfilled with argon. To the flask was added palladium bisdibenzylideneacetone (71.7 mg, 0.125 mmol), triphenylphosphine (143 mg, 0.545 mmol), copper iodide (34 mg, 0.179 mmol), and 2-methyl-3-butyn-2-ol (1.33 g, 0.0158 mol). The reaction flask was further degassed and backfilled with argon twice, sealed and heated to 90° C. for 60 h. The solvent was removed in vacuo and the crude product was purified by flash chromatography eluting with 8% ethyl acetate in dichloromethane to afford the bis(3-hydroxy-3-methyl-but-1-ynyl) fuctionalized triptycene (3.03 g, 92%).

EXAMPLE 37

Synthesis of 6,14-di-tert-butyl-1,4-diethynyl-[1',2'] benzenoanthracene 6,14-di-tert-butyl-1,4-diethynyl-[1',2']benzenoanthracene 48 is illustrated in FIG. 9F. 6,14-di-tert-butyl-1,4-bis(3-hydroxy-3-methyl-but-1-ynyl)-[1',2']benzenoanthracene 47 (3.0 g, 5.66 mmol) was dissolved in toluene (200 ml) and degassed. A solution of KOH (2.0 g) in methanol (20 ml) was added. The reaction was heated to 120° C. for 1.5 hours, cooled to room temperature and filtered through a plug of silica gel, rinsed with dichloromethane. The solvent was removed, and the residue was purified by flash chromatography to afford the diethynyltriptycene as a white solid (2.26 g, 96%).

EXAMPLE 38

Synthesis of 6,14-di-tert-butyl-1,4-bis(4,4,5,5-tetramethyl-1,3,2-dioxoborolan-2-yl-ethenyl)-[1',2'] benzeno-anthracene 6,14-di-tert-butyl-1,4-bis(4,4,5,5-tetramethyl-1,3,2-dioxoborolan-2-yl-ethenyl)-[1',2']benzeno-anthracene 49 is illustrated in FIG. 9F. 6,14-di-tert-butyl-1,4-diethynyl-[1',2']benzenoanthracene 48 (1.00 g, 1.79 mmol), and 4,4,5,5-tetramethyl-1,3,2-dioxoborolane (0.80 ml, 0.71 g, 5.52 mmol) was dissolved in dry toluene (10 ml). The reaction was heated to 90° C. for 24 hours and the solvent was removed in vacuo. Flash chromatography eluting with 1:4, hexane:dichloromethane afforded the bisborolane (727 mg, 50%).

EXAMPLE 39

Two nematic liquid crystals, 1-(trans-4-hexylcyclohexyl)-4-isothiocyanatobenzene ("6CHBT," Tm=12.4° C., TNI=42.4° C.), and 4-(trans-4-pentyl-cyclohexyl)benzonitrile ("5PCH," Tm=30° C., TNI=55° C.), were tested for solubilizing the polymers of one embodiment of the invention. Polymer PPVs with tert-butyl substitutions 53 and 55 in FIG. 9G could form homogeneous solution in both liquid crystals while PPVs 52 and 54 were less soluble. To test the alignment of the polymer in liquid crystals, the solutions were loaded to liquid crystal cells where the internals coated with parallel-orientated polyimide. At the central area of the internals were imbedded thin layers of conducting indium tin oxide.

Absorption spectra were recorded in both parallel and orthogonal directions relative to the expected alignment of the liquid crystals through a polarizer. The absorption along the director of the polyimide on the surface was found to be much stronger, indicating that the long axes (coinciding with the direction of the most probable electronic transition) of the polymers were orientated with the liquid crystals parallel to the polyimide direction. It was observed that the polymer 55 in 6CHBT in a liquid crystal cell preferred to align along with the liquid crystal, and the ordering parameter of transition moment of 6CHBT was found to be 0.69.

When a voltage (9 V) was applied across the cell through the conductive indium tin oxide coating, it was found that the absorption along the polyimide direction was significantly diminished. This indicated a change of the orientation of the polymer long axis as a result of change of the liquid crystal director under electric field, from parallel to the surface to perpendicular to the surface. As a result, less absorption of light takes place because the electric vector of the light coming across the cell is mostly parallel to the surface, interacting preferably with polymers with transition moments aligned parallel to the surface. The absorption along the polyimide direction decreased when the cell was heated up across the nematic-isotropic transition temperature of the liquid crystal.

The liquid crystal cells loaded with PPV solutions in both liquid crystals were highly fluorescent under ultraviolet ("UV") light, and the fluorescence was found to be highly polarized. Upon the application of a voltage of 9 V across the cell, the fluorescence was significantly diminished due to less absorption of light resulted from the reorientation of the polymer long axis along the electric field. The switch was reversible, i. e., the fluorescence recovered when the voltage was removed. Fluorescence spectra of the liquid crystal cell loaded with a solution of compound 55 in 6CHBT showed that the emission maximum of the liquid crystal solution shifted slightly to the red, relative to the emission from solution, due to induced alignment of the polymer long axis parallel to the surface of the cell.

While several embodiments of the invention have been described and illustrated herein, those of ordinary skill in the art will readily envision a variety of other means and structures for performing the functions and/or obtaining the results or advantages described herein, and each of such variations or modifications is deemed to be within the scope of the present invention. More generally, those skilled in the art would readily appreciate that all parameters, dimensions, materials, and configurations (list modified as appropriate) described herein are meant to be exemplary and that actual parameters, dimensions, materials, and configurations will depend upon specific applications for which the teachings of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, material and/or method described herein. In addition, any combination of two or more such features, systems, materials and/or methods, if such features, systems, materials and/or methods are not mutually inconsistent, is included within the scope of the present invention. In the claims, all transitional phrases or phrases of inclusion, such as "comprising," "including," "carrying," "having," "containing," and the like are to be understood to be open-ended, i.e. to mean "including but not limited to." Only the transitional phrases or phrases of inclusion "consisting of" and "consisting essentially of" are to be interpreted as closed or semi-closed phrases, respectively, as set forth in MPEP section 2111.03.

TABLE 1

Results of polymerizations of 616

| Entry | Compound | Other monomer | Conditions[a] | Mn | pdi |
|---|---|---|---|---|---|
| 1 | Fast – 616 | none | 200° C.[b] | 3,200 | 2.4 |
| 2 | Slow – 616 | none | 200° C.[b] | 4,700 | 2.3 |
| 3 | " | none | 250° C., 30 min. | 5,000 | 2.4 |
| 4 | Fast + Slow – 616 | none | 250° C., 60 min. | 5,500 | 2.4 |
| 5 | " | none | 250° C., 4 hrs. | 5,000[c] | 2.4 |
| 6 | Fast – 616 | 620 (3 wt. %) | 250° C., 2 hrs. | 4,500[c] | 2.5 |
| 7 | Fast – 616 | 620, 621 (3 wt. % each) | 250° C., 2 hrs. | 4,900[c] | 3.2 |
| 8 | " | none | 0.1M in decalin 250° C., 72 hrs. | 2,500 | 1.4 |
| 9 | Slow – 616 | none | 0.1M in decalin 250° C., 72 hrs. | 2,100 | 1.4 |
| 10 | Fast + Slow – 616 | none | 225° C., 1 hr. | 5,600 | 2.2 |
| 11 | " | none | 190° C., 40 min. | 3,000 | 2.4 |
| 12 | " | none | 1.0M in m-cresol 200° C., 4 hrs. | 3,700 | 2.1 |
| 13 | " | none | 2.0M in m-cresol | 4,000 | 2.1 |
| 14 | " | none | 2.0M in eicosane 235° C., 2 hrs. | 4,200 | 2.1 |
| 15 | " | none | 1.0M in eicosane 250° C., 4 hrs. | 4,400 | 2.5 |
| 16 | " | none | 0.5M in eicosane 250° C., 19 hrs. | 3,600 | 2.2 |

TABLE 1-continued

Results of polymerizations of 616

| Entry | Compound | Other monomer | Conditions[a] | Mn | pdi |
|---|---|---|---|---|---|
| 17 | " | none | 1.0M in hexadecane 170° C., 20 hrs. | 4,400 | 1.8 |
| 18 | " | none | 1.0M in hexadecane 140° C., 20 hrs. | 3,600 | 1.9 |

[a] Solid phase reactions unless otherwise noted
[b] Heated to 200° C. and then immediately cooled
[c] THF soluble fraction only

TABLE 2

Dichroic ratios for 24–26 in aligned hosts[a]

| Compound, Host | Long-Axis $A_{//}/A_\perp$ | Short-Axis $A_{//}/A_\perp$ |
|---|---|---|
| 24, LC | — | 0.66[b] |
| 24, PVC | 1.04 | 0.93[b] |
| 25, LC | — | 1.80 |
| 25, PVC | 0.83 | 1.56 |
| 26, LC | — | 2.34 |
| 26, PVC | 0.77 | 1.56 |

[a] UV maxima for each dichroic ratio measurement were (Long-Axis, Short-Axis/nm): 24 (257, 381), 25 (263, 379), 26 (282, 383).
[b] For direct comparison of absorption intensities with 25 and 26, the inverse of these ratios should be taken.
For LC, $A_\perp/A_{//} = 1.52$; PVC $A_\perp/A_{//} = 1.07$; note these are both smaller than values for 25 and 26 in all cases.

TABLE 3

Order parameters ($S_{ob}$) for 0, 27–32

| Compound | $S_{ob}$ | % Change |
|---|---|---|
| 0 | 0.60 | — |
| 27 | 0.65 | +9% |
| 28 | 0.69 | +15% |
| 29 | 0.76 | +27% |
| 30 | 0.57 | −5% |
| 31 | 0.60 | — |
| 32 | 0.65 | +9% |

The invention claimed is:

1. A composition, comprising:
a ladder polymer or ladder oligomer, said ladder polymer or oligomer comprising an iptycene, wherein the ladder polymer or oligomer is a polymer or oligomer having a backbone that can only be severed by breaking at least two bonds.

2. A composition as in claim 1, having a molecular weight in excess of 2000 daltons, comprising a shape persistent molecule containing bridgehead atoms, with molecular structures radiating from the bridgehead atoms in three directions and extending outwardly therefrom such that each defines a van der Waals contact of furthest point from the bridgehead atoms of no less than 3.5 Å, the composition having a dielectric constant of less than 3.0.

3. A composition as in claim 2, comprising a linear polymer comprising an iptycene.

4. A composition as in claim 2, arranged as a dielectric material in an electronic component.

5. A composition as in claim 2, wherein the molecular structures that radiate from the bridgehead atoms extend outwardly therefrom such that each defines a van der Waals contact of furthest point from the bridgehead atoms of no less than 4.0 Å.

6. A composition as in claim 2, wherein the molecular structures that radiate from the bridgehead atoms extend outwardly therefrom such that each defines a van der Waals contact of furthest point from the bridgehead atoms of no less than 4.5 Å.

7. A composition as in claim 2, wherein the molecular structures that radiate from the bridgehead atoms extend outwardly therefrom such that each defines a van der Waals contact of furthest point from the bridgehead atoms of no less than 5.0 Å.

8. A composition as in claim 2, wherein the molecular structures that radiate from the bridgehead atoms extend outwardly therefrom such that each defines a van der Waals contact of furthest point from the bridgehead atoms of no less than 5.5 Å.

9. A composition as in claim 2, wherein the molecular structures that radiate from the bridgehead atoms extend outwardly therefrom such that each defines a van der Waals contact of furthest point from the bridgehead atoms of no less than 6.0 Å.

10. A composition as in claim 2, wherein the molecular structures that radiate from the bridgehead atoms extend outwardly therefrom such that each defines a van der Waals contact of furthest point from the bridgehead atoms of no less than 6.2 Å.

11. A composition as in claim 1, having a lowest energy state in which the polymer has a backbone the contains a plane.

12. A composition as in claim 11, including a plurality of aromatic rings that each align normal to the plane in the lowest energy state, and the polymer has a minimum dimension, measured as van der Waals contact dimensions, of 6.0 Å.

13. A composition as in claim 1, the polymer including a backbone comprising backbone atoms bonded to other backbone atoms, wherein bonds involving the backbone atoms are not freely rotatable.

14. A composition as in claim 1, comprising a structure:

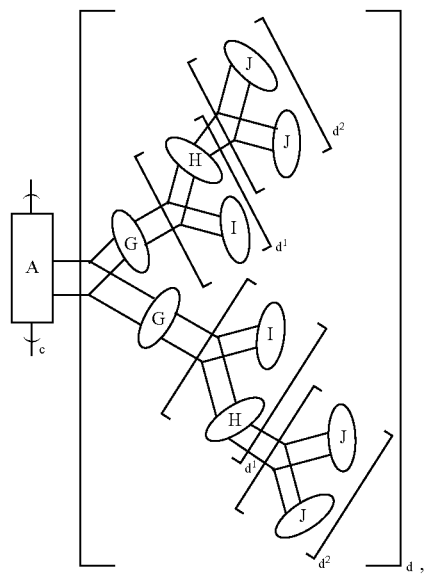

wherein A, G, H, I, and J are aromatic groups: c is less than 10,000; d=1, 2, and $d^1$=0, 1, such that when $d^1$=0, $d^2$=0 and when $d^1$=1, $d^2$=0 or 1.

15. A composition as in claim 2, wherein the bridgehead atoms comprise carbon or nitrogen.

16. A composition as in claim 1 where in the backbone is composed of triptycene units.

17. A composition as in claim 2 comprising a branched structure.

18. A composition as in claim 2 comprising a hyperbranched structure.

19. A composition as in claim 18, comprising polymer chain units comprising chemical functionality allowing formation of grafts.

20. A composition as in claim 18, comprising a grafted polymer including non-iptycene units grafted onto polymer chain units.

21. A composition as in claim 18, comprising a grafted polymer including iptycene units grafted onto polymer chain units.

22. A composition as in claim 18, comprising a polymer of monomer units each including two reactive sites, one of which has reacted with another monomer unit to form the polymer backbone, and another of which is available for grafting after formation of the polymer.

23. A composition as in claim 1 comprising a dendritic structure.

24. A composition as in claim 1 wherein the polymer has cyclic sub-units.

25. A composition as in claim 1 which, in a solid state, has at least 30% free volume and a dielectric constant of about 1.9 or less.

26. A composition as in claim 1 which, in a solid state, has at least 50% free volume and a dielectric constant of about 1.7 or less.

27. A composition as in claim 1 which, in a solid state, has at least 70% free volume and a dielectric constant of about 1.5 or less.

28. A composition as in claim 1 which, in a solid state, has at least 90% free volume and a dielectric constant of about 1.2 or less.

29. A composition as in claim 2 wherein the polymer has a backbone defined by non-iptycene units, and comprises iptycene units connected to the backbone.

30. A composition as in claim 1, comprising a first porous polymeric component and further comprising a second polymeric component forming an interpenetrating network permeating the pores of the first porous polymeric component.

31. A composition comprising a first, porous, shape persistent polymer and a second, flexible polymer forming an interpenetrating network, the second polymer permeating the pores of the first polymer, wherein the first polymer and the second polymer have different structures and are not covalently bound to each other.

32. A composition as in claim 31 wherein the second component is an elastomer.

33. A composition as in claim 31 wherein the second component is a conjugated polymer.

34. A composition as in claim 31 wherein the material shows a negative Poisson's ratio when elongated.

35. A device comprising:
a chromophore; and
a shape-persistent molecule having at least 20% free volume;
the device constructed and arranged to be capable of moving the chromophore from a first orientation to a second orientation upon application to the chromophore of a source of external energy,
wherein the source of external energy is an electric, magnetic, optical, acoustic, electromagnetic, or mechanical field.

36. A device as in claim 35, wherein the device is constructed and arranged to change the polarization of the chromophore's optical, magnetic, or dielectric absorptions upon application of the external energy source.

37. A device as in claim 35, constructed and arranged to display a change in color upon application of the external energy source.

38. A device as in claim 35, constructed and arranged to display a change in luminescence upon application of the external energy source.

39. A device as in claim 35, constructed and arranged to display a change in transmission of an optical signal upon application of the external energy source.

40. A device as in claim 35, wherein the chromophore bonded to the shape-persistent molecule can be switched from a first low-energy, stable orientation to a second, low-energy, stable orientation upon application of the external energy source.

41. A device as in claim 35, constructed and arranged to impart polymerization to the iptycene upon application of the external energy source.

42. A device as in claim 35, constructed and arranged to display a signal recognizable to a human upon application of the external energy source.

43. A device as in claim 42, wherein the signal is a hologram.

44. A device as in claim 35, wherein application of the external energy source causes switching in a liquid crystal display.

45. A device as in claim 35, wherein the shape-persistent molecule comprises an iptycene.

46. A device as in claim 35, wherein the chromophore is bonded to the shape-persistent molecule.

* * * * *

UNITED STATES PATENT AND TRADEMARK OFFICE
CERTIFICATE OF CORRECTION

PATENT NO. : 7,494,698 B2
APPLICATION NO. : 10/764768
DATED : February 24, 2009
INVENTOR(S) : Timothy M. Swager et al.

Page 1 of 1

It is certified that error appears in the above-identified patent and that said Letters Patent is hereby corrected as shown below:

In the Specification:

At column 1, lines 15-18, "This invention was made with government support under Contract Number DABT63-97-C-0008, awarded by the Army and Grant Number N00014-97-0174 awarded by the Navy. The government has certain rights in the invention." should be -- This invention was made with government support under Grant No. N00014-97-1-0174, awarded by the US Navy and under Grant No. DABT63-97-C-0008, awarded by the US Department of the Interior. The government has certain rights in this invention. --.

Signed and Sealed this
Seventeenth Day of May, 2011

David J. Kappos
*Director of the United States Patent and Trademark Office*